(12) United States Patent
Suaya

(10) Patent No.: US 9,230,054 B2
(45) Date of Patent: Jan. 5, 2016

(54) HIGH-FREQUENCY VLSI INTERCONNECT AND INTENTIONAL INDUCTOR IMPEDANCE EXTRACTION IN THE PRESENCE OF A MULTI-LAYER CONDUCTIVE SUBSTRATE

(71) Applicant: Mentor Graphics Corporation, Wilsonville, OR (US)

(72) Inventor: Roberto Suaya, Meylan (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/563,285

(22) Filed: Dec. 8, 2014

(65) Prior Publication Data

US 2015/0161324 A1    Jun. 11, 2015

Related U.S. Application Data

(62) Division of application No. 14/247,078, filed on Apr. 7, 2014, now Pat. No. 8,910,108, which is a division of application No. 13/525,107, filed on Jun. 15, 2012, now Pat. No. 8,732,648, which is a division of application No. 12/400,672, filed on Mar. 9, 2009, now Pat. No. 8,214,788.

(60) Provisional application No. 61/034,978, filed on Mar. 8, 2008, provisional application No. 61/053,660, filed on May 15, 2008.

(51) Int. Cl.
*G06F 17/50* (2006.01)
*G06F 11/22* (2006.01)

(52) U.S. Cl.
CPC ........ *G06F 17/5081* (2013.01); *G06F 17/5036* (2013.01); *G06F 17/5068* (2013.01)

(58) Field of Classification Search
CPC .................................................. G06F 17/5036
USPC .................................................. 716/115, 136
See application file for complete search history.

(56) References Cited

U.S. PATENT DOCUMENTS

| 4,026,040 A | 5/1977 | Valentine et al. |
| 5,436,564 A | 7/1995 | Kreger et al. |
| 5,578,925 A | 11/1996 | Molyneaux et al. |
| 5,602,479 A | 2/1997 | Srinivasan et al. |

(Continued)

OTHER PUBLICATIONS

Afzali-Kusha et al., "Substrate Noise Coupling in SoC Design: Modeling, Avoidance, and Validation," *Proc. of the IEEE*, vol. 94, No. 12, pp. 2109-2138 (Dec. 2006).

(Continued)

*Primary Examiner* — Suresh Memula
(74) *Attorney, Agent, or Firm* — Klarquist Sparkman, LLP

(57) ABSTRACT

Embodiments of methods, apparatus, and systems for extracting impedance for a circuit design are disclosed herein. Some of the disclosed embodiments are computationally efficient and can accurately compute the frequency-dependent impedance of VLSI interconnects and/or intentional inductors in the presence of multi-layer conductive substrates. In certain embodiments, the resulting accuracy and CPU time reduction are a result of a Green's function approach with the correct quasi-static limit, a modified discrete complex image approximation to the Green's function, and a continuous dipole expansion to evaluate the magnetic vector potential at the distances relevant to VLSI interconnects and intentional inductors.

12 Claims, 39 Drawing Sheets

(56) References Cited

U.S. PATENT DOCUMENTS

| | | |
|---|---|---|
| 5,767,009 A | 6/1998 | Yoshida et al. |
| 5,781,009 A | 7/1998 | Lee et al. |
| 5,826,215 A | 10/1998 | Garrett et al. |
| 5,973,495 A | 10/1999 | Mansfield |
| 5,998,999 A | 12/1999 | Richard et al. |
| 6,026,286 A | 2/2000 | Long |
| 6,053,950 A | 4/2000 | Shinagawa |
| 6,292,766 B1 | 9/2001 | Mattos et al. |
| 6,295,634 B1 | 9/2001 | Matsumoto |
| 6,304,230 B1 | 10/2001 | Panther et al. |
| 6,311,313 B1 | 10/2001 | Camporese et al. |
| 6,327,696 B1 | 12/2001 | Mahajan |
| 6,353,801 B1 | 3/2002 | Sercu et al. |
| 6,378,080 B1 | 4/2002 | Anjo et al. |
| 6,381,730 B1 | 4/2002 | Chang et al. |
| 6,434,724 B1 | 8/2002 | Chang et al. |
| 6,453,444 B1 | 9/2002 | Shepard |
| 6,459,352 B1 | 10/2002 | Liu et al. |
| 6,487,703 B1 | 11/2002 | McBride et al. |
| 6,578,174 B2 | 6/2003 | Zizzo |
| 6,584,596 B2 | 6/2003 | Buffet et al. |
| 6,588,002 B1 | 7/2003 | Lampaert et al. |
| 6,604,225 B1 | 8/2003 | Otsu et al. |
| 6,643,831 B2 | 11/2003 | Chang et al. |
| 6,651,230 B2 | 11/2003 | Cohn et al. |
| 6,675,365 B2 | 1/2004 | Elzinga |
| 6,742,165 B2 | 5/2004 | Lev et al. |
| 6,803,829 B2 | 10/2004 | Duncan et al. |
| 6,820,245 B2 | 11/2004 | Beattie et al. |
| 6,853,194 B2 | 2/2005 | Nelson et al. |
| 6,934,669 B1 | 8/2005 | Suaya et al. |
| 6,938,231 B2 | 8/2005 | Yoshida et al. |
| 6,966,040 B2 | 11/2005 | Ismailov |
| 6,980,921 B2 | 12/2005 | Anderson et al. |
| 6,981,230 B1 | 12/2005 | Lin et al. |
| 7,013,442 B2 | 3/2006 | Suaya et al. |
| 7,078,987 B1 | 7/2006 | Petrovic |
| 7,096,148 B2 | 8/2006 | Anderson et al. |
| 7,096,174 B2 | 8/2006 | Beattie et al. |
| 7,099,808 B2 | 8/2006 | Suaya et al. |
| 7,260,796 B2 | 8/2007 | Suaya et al. |
| 7,340,703 B2 | 3/2008 | Hegazy et al. |
| 7,350,175 B2 | 3/2008 | Iwaki et al. |
| 7,426,706 B2 | 9/2008 | Suaya et al. |
| 7,454,300 B2 | 11/2008 | Suaya et al. |
| 7,496,871 B2 | 2/2009 | Suaya et al. |
| 7,689,949 B1 | 3/2010 | Ling et al. |
| 7,689,962 B2 | 3/2010 | Suaya et al. |
| 7,719,083 B2 | 5/2010 | Chang |
| 7,823,096 B2 | 10/2010 | Katagiri et al. |
| 7,848,724 B2 | 12/2010 | Bult et al. |
| 7,949,979 B1 | 5/2011 | Alexander |
| 8,161,438 B2 | 4/2012 | Suaya et al. |
| 8,214,781 B1 | 7/2012 | Liu et al. |
| 8,214,785 B2 | 7/2012 | Kouzaki et al. |
| 8,448,115 B1 * | 5/2013 | Kourkoulos et al. .......... 716/115 |
| 8,549,449 B2 | 10/2013 | Suaya et al. |
| 2002/0104063 A1 | 8/2002 | Chang et al. |
| 2002/0116696 A1 | 8/2002 | Suaya et al. |
| 2003/0131334 A1 | 7/2003 | Suaya et al. |
| 2003/0184285 A1 | 10/2003 | Anderson et al. |
| 2004/0158801 A1 | 8/2004 | Leisten et al. |
| 2005/0076317 A1 | 4/2005 | Ling et al. |
| 2005/0120316 A1 | 6/2005 | Suaya et al. |
| 2005/0268260 A1 | 12/2005 | Suaya et al. |
| 2006/0143586 A1 | 6/2006 | Suaya et al. |
| 2006/0282492 A1 | 12/2006 | Suaya et al. |
| 2007/0018767 A1 | 1/2007 | Gabara |
| 2007/0225925 A1 | 9/2007 | Suaya et al. |
| 2007/0226659 A1 | 9/2007 | Suaya et al. |
| 2008/0221795 A1 | 9/2008 | Amundsen et al. |
| 2008/0276207 A1 | 11/2008 | Suaya et al. |
| 2009/0013300 A1 | 1/2009 | Suaya et al. |
| 2009/0089736 A1 | 4/2009 | Huang et al. |
| 2009/0172613 A1 | 7/2009 | Suaya et al. |
| 2009/0228847 A1 | 9/2009 | Suaya et al. |

OTHER PUBLICATIONS

Aksun, "A Robust Approach for the Derivation of Closed-Form Green's Functions," *IEEE Trans. on MicrowaveTheory and Tech.*, vol. 44, No. 5, pp. 651-658 (May 1996).

Aksun et al., "Clarification of Issues on the Closed-Form Green's Functions in Stratified Media," *IEEE Trans. on Antennas and Propagation*, vol. 53, No. 11, pp. 3644-3653 (Nov. 2005).

Anderson, "An electromagnetic tracking system using printed-circuit coils," *IEEE Antennas and Propagation Society Int'l Symp.*, vol. 1, pp. 304-307 (Jul. 2001).

"ASITIC: Analysis and Simulation of Spiral Inductors and Transformers for Ics," downloaded from http://rfic.eecs.berkeley.edu/~niknejad/asitic.html, 1 p. (document not dated, downloaded on Aug. 15, 2006).

"ASITIC Documentation: Grackle Release," downloaded from http://rfic.eecs.berkeley.edu/~niknejad/doc-05-26-02/asitic.hmtl, 1 p. (document not dated, downloaded on Aug. 15, 2006).

"ASITIC Commands," downloaded from http://rfic.eecs.berkeley.edu/~niknejad/doc-05-26-02/commands.html., 1p. (document not dated, downloaded on Aug. 15, 2006).

"ASITIC Documentation: Environmental Variables," downloaded from http://rfic.eecs.berkeley.edu/~niknejad/doc-05-26-02/env.html, 8 pp. (document not dated, downloaded on Aug. 15, 2006).

"ASITIC: Installing and Running," downloaded from http://rfic.eecs.berkeley.edu/~niknejad/doc-05-26-02/install.html, 2 pp. (document not dated, downloaded on Aug. 15, 2006).

"Technology File," downloaded from http://rfic.eecs.berkeley.edu/~niknejad/doc-05-26-02/techfile.html, 5 pp. (document not dated, downloaded on Aug. 15, 2006).

"ASITIC Quickstart," downloaded from http://rfic.eecs.berkeley.edu/~niknejad/doc-05-26-02/quickstart.html, 3 pp. (document not dated, downloaded on Aug. 15, 2006).

"Sample ASITIC Sessions," downloaded from http://rfic.eecs.berkeley.edu/~niknejad/doc-05-26-02/sample.html, 19 pp. (document not dated, downloaded on Aug. 15, 2006).

"ASITIC FAQ," downloaded from http://rfic.eecs.berkeley.edu/~niknejad/doc-05-26-02/faq.html, 7 pp. (document not dated, downloaded on Aug. 15, 2006).

Averill III et al., "Chip integration methodology for the IBM S/390 G5 and G6 custom microprocessors," *IBM J. Res. Develop.*, vol. 43, pp. 681-706 (Sep./Nov. 1999).

Banerjee et al., "Accurate Analysis on On-Chip Inductance Effects and Implications for Optimal Repeater Insertion and Technology Scaling," *IEEE Symposium on VLSI Circuits*, pp. 1-4 (Jun. 14-16, 2001).

Bannister, "Summary of Image Theory Expressions for the Quasi-Static Fields of Antennas at or above the Earth's Surface," *IEEE Proc.*, vol. 67, No. 7, pp. 1001-1008 (Jul. 1979).

Beattie et al., "Efficient Inductance Extraction via Windowing," *Proc. Design, Automation, and Test in Europe*, pp. 430-436 (2001).

Beattie et al., "Equipotential Shells for Efficient Inductance Extraction," *IEEE Trans. CAD of IC and Systems*, vol. 20, pp. 70-79 (2001).

Beattie et al., "Hierarchical Interconnect Circuit Models," 7 pp. (also published as Beattie et al., "Hierarchical Interconnect Circuit Models," *Proc. ICCAD*, pp. 215-221 (Nov. 2000)).

Beattie et al., "Inductance 101: Modeling and Extraction," *Design Automation Conf.*, pp. 323-328 (2001).

Belk et al., "The Simulation and Design of Integrated Inductors," *ACM*, 6 pp. (Jun. 1999).

Burghartz et al., "On the Design of RF Spiral Inductors on Silicon," *IEEE Trans. on Electron Devices*, vol. 50, No. 3, pp. 718-729 (Mar. 2003).

Chang et al., "Clocktree RLC Extraction with Efficient Inductance Modeling," 5 pp. (also published as Chang et al. "Clocktree RLC Extraction with Efficient Inductance Modeling," *Proc. Design, Automation, and Test in Europe*, pp. 522-526 (2000)).

Charbon et al., *Substrate Noise: Analysis and Optimization for IC Design*, pp. 11-17 (Apr. 2001).

(56) References Cited

OTHER PUBLICATIONS

Chen et al., "INDUCTWISE: Inductance-Wise Interconnect Simulator and Extractor," *IEEE Trans. CAD of IC and Systems*, vol. 22, No. 7, pp. 884-894 (2003).
Chew, *Waves and Fields in Inhomogeneous Media*, pp. 70-76 (1995).
Chow et al., "Complex Images for Electrostatic Field Computation in Multilayered Media," *IEEE Trans. on Microwave Theory and Techniques*, vol. 39, No. 7, pp. 1120-1125 (Jul. 1991).
Coperich et al., "Systematic Development of Transmission-Line Models for Interconnects With Frequency-Dependent Losses," *IEEE Trans. on Microwave Theory and Techniques*, vol. 49, No. 10, pp. 1677-1685 (Oct. 2001).
Davis et al., "Compact Distributed RLC Interconnect Models—Part I: Single Line Transient, Time Delay, and Overshoot Expressions," *IEEE Trans. on Electron Devices*, vol. 47, No. 11, pp. 2068-2077 (Nov. 2000).
Deutsch et al., "When are Transmission-Line Effects Important for On-Chip Interconnections?," *IEEE Trans. on Microwave Theory and Techniques*, vol. 45, No. 10, pp. 1836-1846 (Oct. 1997).
Devgan et al., "How to Efficiently Capture On-Chip Inductance Effects: Introducing a New Circuit Element K," *IEEE*, pp. 150-155 (Nov. 2000).
Dural et al, "Closed-Form Green's Functions for General Sources and Stratified Media," *IEEE Trans. on Microwave Theory and Techniques*, vol. 43, No. 7, pp. 1545-1552 (Jul. 1995).
Escovar et al., "An Improved Long Distance Treatment for Mutual Inductance," *IEEE Trans. on Computer-Aided Design of Integrated Circuits and Systems*, vol. 24, No. 5, pp. 783-793 (May 2005).
Escovar et al., "Mutual Inductance between Intentional Inductors: Closed Form Expressions," *IEEE*, pp. 2445-2448 (2006).
Escovar et al., "Mutual Inductance Extraction and the Dipole Approximation," *ACM*, pp. 162-169 (2004).
Escovar et al., "Transmission line design of Clock Trees," *IEEE*, pp. 334-340 (Nov. 2002).
Fang et al., "Discrete image theory for horizontal electric dipoles in a multilayered medium," *IEEE Proc. H: Microwaves, Antennas and Propagation*, vol. 135, No. 5, pp. 297-303 (Oct. 1988).
Gala et al., "Inductance 101: Analysis and Design Issues," *Design Automation Conf.*, pp. 329-334 (Jun. 2001).
Gieseke et al., "A 600 MHz Superscalar RISC Microprocessor with Out-Of-Order Exection," *IEEE International Solid-State Circuits Conf.*, pp. 176, 177, and 451 (Feb. 1997).
Golub et al., "Separable nonlinear least squares: the variable projection method and its applications," *Inverse Problems*, vol. 19, pp. R1-R26 (Apr. 2003).
Golub et al., "The Differentiation of Pseudo-Inverses and Nonlinear Least Squares Problems Whose Variables Separate," *SIAM J. Numer. Anal.*, vol. 10, No. 2, pp. 413-432 (Apr. 1973).
Grover, *Inductance Calculations: Working Formulas and Tables*, pp. iii-xiv, 1, 31-61.
Gupta et al., "Hierarchical Modeling of Electrostatic and Magnetostatic Couplings," 4 pp. (also published as Gupta et al., "Hierarchical Modeling of Electrostatic and Magnetostatic Couplings," *SRC Techcon Conference* (Aug. 2003)).
Gupta, "Modeling Inductive Couplings in Traditional and Nanoscale Interconnects," Ph.D. Thesis, Carnegie Mellon University, 83 pp. (Jul. 2004).
Hu et al., "Analysis of Full-Wave Conductor System Impedance over Substrate Using Novel Integration Technique," *ACM*, pp. 147-152 (Jun. 2005).
Hu, "Full-Wave Analysis of Large Conductor Systems Over Substrate," Ph.D. Dissertation, University of California, Berkeley, 145 pp. (2006).
International Search Report dated Jul. 7, 2009, from International Patent Application No. PCT/US2009/036571.
Ismail et al., "Effects of Inductance on the Propagation Delay and Repeater Insertion in VLSI Circuits," *IEEE Trans. on VLSI Systems*, vol. 8, No. 2, pp. 195-206 (Apr. 2000).
Jackson et al., *Classical Electrodynamics*, pp. xi-xvii, 144-149 (1962).
Jiang et al., "Epeec: Comprehensive Spice-Compatible Reluctance Extraction for High-Speed Interconnects Above Lossy Multilayer Substrates," *IEEE Trans. on Computer-Aided Design of Integrated Circuits and Systems*, vol. 24, No. 10, pp. 1562-1571 (Oct. 2005).
Jiang et al., "On-Chip Spiral Inductors Suspended over Deep Copper-Lined Cavities," *IEEE Trans. on Microwave Theory and Tech.*, vol. 48, No. 12, pp. 2415-2423 (Dec. 2000).
Kamon, "Efficient Techniques for Inductance Extraction of Complex 3-D Geometrics," Master Thesis—Massachusetts Institute of Technology, 80 pp. (Feb. 1994).
Kamon et al., "FASTHENRY: A Multipole-Accelerated 3-D Inductance Extraction Program," *IEEE Trans. Microwave Theory Tech.*, vol. 42, No. 9, pp. 1750-1758 (Sep. 1994).
Krauter et al., "Layout Based Frequency Dependent Inductance and Resistance Extraction for On-Chip Interconnect Timing Analysis," *Proc. 35th ACM/IEEE DAC*, pp. 303-308 (Jan. 1998).
Lee et al., "Interconnect Inductance Effects on Delay and Crosstalks for Long On-Chip Nets with Fast Input Slew Rates," *IEEE*, pp. II-248 through II-251 (1998).
Lin et al., "On the Efficiency of Simplified 2D On-Chip Inductance Models," *Design Automation Conference*, pp. 757-762 (2002).
Ling et al., "Discrete Complex Image Method for Green's Functions of General Multilayer Media," *IEEE Microwave and Guided Wave Letters*, vol. 10, No. 10, pp. 400-402 (Oct. 2000).
Lopera et al., "A Multiwinding Modeling Method for High Frequency Transformers and Inductors," *IEEE Trans. on Power Electronics*, vol. 18, No. 3, pp. 896-906 (May 2003).
Lu et al., "A Fast Analytical Technique for Estimating the Bounds of On-Chip Clock Wire Inductance," *IEEE CICC*, 4 pp. (2001).
Lu et al., "Min/Max On-Chip Inductance Models and Delay Metrics," *Design Automation Conf.*, pp. 341-346 (2001).
Massoud et al., "Layout Techniques for Minimizing On-Chip Interconnect Self Inductance," *Design Automation Conf.*, pp. 566-571 (1998).
Moselhy et al., "pFFT in FastMaxwell: A Fast Impedance Extraction Solver for 3D Conductor Structures over Substrate," *Design, Automation and Test in Europe*, pp. 1-6 (2007).
Nabors et al., "Multipole-Accelerated Capacitance Extraction Algorithms for 3-d Structures with Multiple Dielectrics," *IEEE Trans. on Circuits and Systems*, vol. 39, No. 11, pp. 946-954 (1992).
Niknejad et al. "Analysis and Optimization of Monolithic Inductors and Transformers for RF ICs," *IEEE*, pp. 375-378 (May 1997).
Niknejad et al., "Analysis, Design, and Optimization of Spiral Inductors and Transformers for Si RF IC's," *IEEE J. of Solid-State Circuits*, vol. 33, No. 10, pp. 1470-1481 (Oct. 1998).
Niknejad et al., "Analysis of Eddy-Current Losses over Conductive Substrates with Applications to Monolithic Inductors and Transformers," *IEEE Trans. on Microwave Theory and Techniques*, vol. 49, No. 1, pp. 166-176 (Jan. 2001).
Niknejad et al., *Design, Simulation and Applications of Inductors and Transformers for Si RF ICs*, pp. 64-69 (2000).
Notice of Allowance dated Jul. 26, 2007, from U.S. Appl. No. 10/972,025 (published as U.S. Patent Application Publication No. 2005-0120316).
Notice of Allowance dated Aug. 28, 2008, from U.S. Appl. No. 10/972,025 (published as U.S. Patent Application Publication No. 2005-0120316).
Notice of Allowance dated Dec. 14, 2011, from U.S. Appl. No. 11/435,426 (published as U.S. Patent Application Publication No. 2006-0282492).
Notice of Allowance dated Mar. 5, 2012, from U.S. Appl. No. 12/400,672 (published as U.S. Patent Application Publication No. 2009-0228847).
Office action dated Jun. 25, 2008, from related U.S. Appl. No. 11/435,426.
Office action dated Jan. 23, 2009, from U.S. Appl. No. 11/435,426 (published as U.S. Patent Application Publication No. 2006-0282492).
Office action dated Sep. 2, 2009, from U.S. Appl. No. 11/435,426 (published as U.S. Patent Application Publication No. 2006-0282492).

(56) References Cited

OTHER PUBLICATIONS

Office action dated Dec. 14, 2009, from U.S. Appl. No. 11/435,426 (published as U.S. Patent Application Publication No. 2006-0282492).

Final Office action dated Aug. 25, 2011, from U.S. Appl. No. 11/435,426 (published as U.S. Patent Application Publication No. 2006/0282492).

Office action dated Feb. 2, 2007, from U.S. Appl. No. 10/972,025 (published as U.S. Patent Application Publication No. 2005-0120316).

Office action dated Jan. 11, 2008, from U.S. Appl. No. 10/972,025 (published as U.S. Patent Application Publication No. 2005-0120316).

Office action dated Jun. 2, 2008, from U.S. Appl. No. 10/972,025 (published as U.S. Patent Application Publication No. 2005-0120316).

Office action dated Sep. 26, 2011, from U.S. Appl. No. 12/380,138 (published as U.S. Patent Application Publication No. 2009-0172613).

Office action dated Mar. 29, 2012, from U.S. Appl. No. 12/380,138 (published as U.S. Patent Application Publication No. 2009-0172613).

Office action dated Aug. 11, 2011, from U.S. Appl. No. 12/400,672 (published as U.S. Patent Application Publication No. 2009-0228847).

Office action dated Oct. 18, 2011, from U.S. Appl. No. 12/400,672 (published as U.S. Patent Application Publication No. 2009-0228847).

Okhmatovski et al., "Evaluation of Layered Media Green's Functions via Rational Function Fitting," *IEEE Microwave and Wireless Components Letters*, vol. 14, No. 1, pp. 22-24 (Jan. 2004).

Qi et al., "On-Chip Inductance Modeling of VLSI Interconnects," *IEEE Solid-State Circuits Conf.*, 12 pp. (2000).

Ranjan et al., "Use of Symbolic Performance Models in Layout-Inclusive RF Low Noise Amplifier Synthesis," *IEEE*, pp. 130-134 (Sep. 2004).

Restle et al., "A Clock Distribution Network for Microprocessors," *IEEE Journal of Solid-State Circuits*, vol. 36, No. 5, pp. 792-799 (May 2001).

Rosa, "The Self and Mutual Inductance of Linear Conductors," *Bulletin of the National Bureau of Standards*, vol. 4, pp. 301-344 (1908).

Ruehli, "Inductance Calculations in a Complex Circuit Environment," *IBM J. Res. Develop.*, vol. 16, pp. 470-481 (1972).

Sakurai, "Closed-Form Expressions for Interconnection Delay, Coupling, and Crosstalk in VLSI's," *IEEE Trans. on Electron Devices*, vol. 40, No. 1, pp. 118-124 (Jan. 1993).

Soitec, "Wafer Solutions by Application," downloaded from http://www.soitec.com/en/products/, 2 pp. (document marked 2009).

Srivastava et al., "Analytical Expressions for High-Frequency VLSI Interconnect Impedance Extraction in the Presence of a Multilayer Conductive Substrate," *IEEE Trans. on Computer-Aided Design of Integrated Circuits and Systems*, vol. 28, No. 7, pp. 1047-1060 (Jul. 2009).

Srivastava et al., "High-Frequency Mutual Impedance Extraction of VLSI Interconnects in the Presence of a Multi-Layer Conducting Substrate," *Design, Automation and Test in Europe*, pp. 426-431 (2008).

Suaya et al., "Modeling and Extraction of Nanometer Scale Interconnects: Challenges and Opportunities," *Proc. 23rd Advanced Metallization Conf.*, 11 pp. (2006).

Verghese et al., "Substrate Coupling in Mixed-Mode and RF Integrated Circuits," *IEEE*, pp. 297-303 (Sep. 1997).

Verghese et al., "SUBTRACT: A Program for the Efficient Evaluation of Substrate Parasitics in Integrated Circuits," *IEEE*, pp. 194-198 (Nov. 1995).

Verghese et al., "Verification of RF and Mixed-Signal Integrated Circuits for Substrate Coupling Effects," *IEEE Custom Integrated Circuits Conf.*, pp. 363-370 (May 1997).

Verghese et al., "Verification Technique for Substrate Coupling and Their Application to Mixed-Signal IC Design," *IEEE*, vol. 31, No. 3, pp. 354-365 (Mar. 1996).

Weisshaar et al., "Accurate Closed-Form Expressions for the Frequency-Dependent Line Parameters of On-Chip Interconnects on Lossy Silicon Substrate," *IEEE Trans. on Advanced Packaging*, vol. 25, No. 2, pp. 288-296 (May 2002).

Written Opinion dated Jul. 7, 2009, from International Patent Application No. PCT/US2009/036571.

Yang et al., "Discrete complex images of a three-dimensional dipole above and within a lossy ground," *IEE Proc. H Microwaves, Antennas, and Propagation*, vol. 138, No. 4, pp. 319-326 (Aug. 1991).

Yavuz et al., "Critical Study of the Problems in Discrete Complex Image Method," *IEEE Int'l Symp. on Electromagnetic Compatability*, pp. 1281-1284 (2003).

Ymeri et al., "New Analytic Expressions for Mutual Inductance and Resistance of Coupled Interconnects on Lossy Silicon Substrate," *Topical Meeting on Silicon Monolithic Integrated Circuits in RF Systems*, pp. 192-200 (Sep. 2001).

Yuan et al., "A Direct Discrete Complex Image Method from the Closed-Form Green's Functions in Multilayered Media," *IEEE Trans. on Microwave Theory and Techniques*, vol. 54, No. 3, pp. 1025-1032 (Mar. 2006).

Yue et al., "Design Strategy of On-Chip Inductors for Highly Integrated RF Systems," *ACM*, 6 pp. (Jun. 1999).

Office action dated Nov. 19, 2012, from U.S. Appl. No. 13/448,116 (published as U.S. Patent Application Publication No. 2012-0204139).

\* cited by examiner

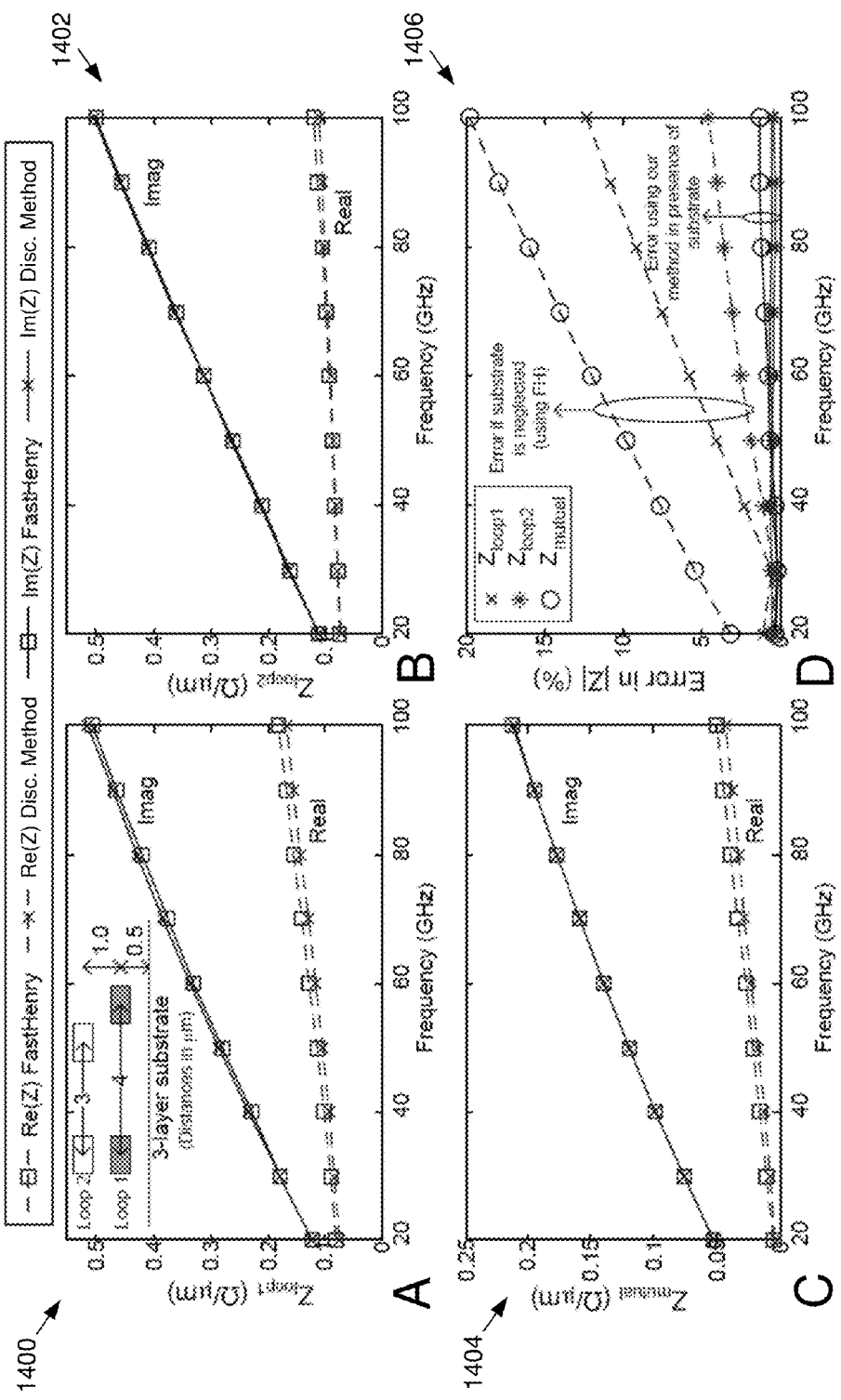
FIGS. 14A-D

US 9,230,054 B2

HIGH-FREQUENCY VLSI INTERCONNECT AND INTENTIONAL INDUCTOR IMPEDANCE EXTRACTION IN THE PRESENCE OF A MULTI-LAYER CONDUCTIVE SUBSTRATE

CROSS REFERENCE TO RELATED APPLICATIONS

This application is a divisional of U.S. patent application Ser. No. 14/247,078, filed Apr. 7, 2014, entitled "High-Frequency VLSI Interconnect and Intentional Inductor Impedance Extraction in the Presence of a Multi-Layer Conductive Substrate," which is a divisional of U.S. patent application Ser. No. 13/525,107, filed Jun. 15, 2012, entitled "High-Frequency VLSI Interconnect and Intentional Inductor Impedance Extraction in the Presence of a Multi-Layer Conductive Substrate," now U.S. Pat. No. 8,732,648, which is a divisional of U.S. patent application Ser. No. 12/400,672, filed Mar. 9, 2009, entitled "High-Frequency VLSI Interconnect and Intentional Inductor Impedance Extraction in the Presence of a Multi-Layer Conductive Substrate," now U.S. Pat. No. 8,214,788, which claims the benefit of U.S. Provisional Patent Application No. 61/034,978, filed Mar. 8, 2008, entitled "High-Frequency Mutual Impedance Extraction of VLSI Interconnects in the Presence of a Multi-Layer Conducting Substrate," and U.S. Provisional Patent Application No. 61/053,660, filed May 15, 2008, entitled "High-Frequency VLSI Interconnect Impedance Extraction in the Presence of a Multi-Layer Conductive Substrate," all of which are hereby incorporated by reference.

FIELD

This application pertains generally to the field of analyzing the electrical characteristics of circuit designs. For example, embodiments of the disclosed technology can be used to perform impedance extraction for circuit layouts (including layouts with intentional inductors) in the presence of a multi-layer substrate (e.g., as part of a physical verification process).

BACKGROUND

As VLSI technology continues to scale, the number of wires in an integrated circuit, as well as the impact of the wires on circuit delay, noise, and power dissipation, increases rapidly. Hence, impedance extraction techniques that are computationally efficient as well as reasonably accurate are desired. However, interconnect impedance extraction presents a challenging task owing to the sheer size of the problem, both in terms of computation time and required memory. The complexity of the extraction problem is further compounded as lithography scaling enables faster transistors, driving maximum signal propagation frequencies on interconnects into the range of 20-100 GHz. In this frequency regime, it is desirable to analyze the effect on interconnect circuit parameters arising from the presence of complex substrate structures underneath or over the interconnect layers. The underlying physics includes, for example, transient currents in interconnects that are the sources of time-varying magnetic fields, which in turn induce currents in other interconnects as well as eddy currents in the lossy substrate. The presence of these eddy currents modifies the impedance matrix of the interconnects. At high frequencies, the effect of a low resistivity substrate on interconnect impedance can be a matter of significant concern. Often, a very high-resistivity (~1000 Ω-cm) substrate is used (underlying a low-resistivity surface layer for active devices) in radio-frequency or mixed-signal ICs in order to substantially decrease the importance of substrate eddy currents. However, low-resistivity substrates continue to be used for latch-up avoidance. Hence, in order to efficiently and accurately compute the impact of the multi-layer substrate on interconnect impedance, it is desirable to use a parasitic extraction methodology that incorporates this effect.

In general, conventional interconnect extraction tools are too expensive, in terms of computation time and/or memory, to handle this problem. For example, with the industry standard tool FastHenry, the substrate must be specified as an explicit conductive layer(s) demanding several thousand filaments at high frequencies. The resulting linear system is rapidly overwhelmed by the size requirements related to the partitioning of the substrate, even for single-layer substrate media. This constitutes orders of magnitude overhead in computation time and memory requirements, even for the simplest interconnect configurations.

Accordingly, improved methods for performing interconnect impedance extraction in the presence of a multi-layer conductive substrate are desired.

SUMMARY

Disclosed below are representative embodiments of methods, apparatus, and systems for performing interconnect impedance extraction in the presence of a multi-layer conductive substrate. For example, embodiments of the disclosed technology comprise computationally efficient methods to accurately compute the frequency-dependent impedance of VLSI interconnects in the presence of multi-layer conductive substrates. The disclosed methods, apparatus, and systems should not be construed as limiting in any way. Instead, the present disclosure is directed toward all novel and nonobvious features and aspects of the various disclosed embodiments, alone and in various combinations and subcombinations with one another. The methods, apparatus, and systems are not limited to any specific aspect or feature or combination thereof, nor do the disclosed embodiments require that any one or more specific advantages be present or problems be solved.

In one disclosed embodiment, semiconductor chip design information is received. The semiconductor chip design information comprises substrate profile information indicating electrical characteristics of a multi-layer substrate over or under which a circuit design is to be implemented. Parameters are computed for an approximation of the multi-layer substrate's contribution to a Green's function at one or more frequencies of interest. A representation is generated of the multi-layer substrate's contribution to the Green's function using the computed parameters. Impedance values are computed and output for signal-wire segments in the circuit design using the representation of the multi-layer substrate's contribution to the Green's function and using geometrical information about the circuit design (e.g., the impedance values can be stored as an impedance matrix in volatile or nonvolatile computer memory). In some implementations, the signal-wire segments in the circuit design can comprise signal-wire segments for an intentional inductor. Furthermore, in certain implementations, the parameters for the approximation of the multi-layer substrate's contribution to the Green's function can be computed for a plurality of frequencies of interest. The parameters of the approximation can be computed, for example, by fitting a non-linear least squares problem (e.g., using a variable projection technique).

In some implementations, circuit design information is also received. The circuit design information can comprise information indicative of a geometric layout of at least signal-wire segments and ground-wire segments in the circuit design. In particular implementations, the circuit design can be a first circuit design, the circuit design information can be first circuit design information, and the geometric layout can be a first geometric layout. In such implementations, second circuit design information can be received, where the second circuit design information comprises information indicative of a second geometric layout of at least signal-wire segments and ground-wire segments in a second circuit design. In addition, the parameters for the approximation of the multi-layer substrate's contribution to the Green's function can be reused to compute impedance values for the signal-wire segments in the second circuit design. In certain implementations, the circuit design can be modified based at least in part on the computed impedance values. In some implementations, a netlist representative of electrical characteristics of the circuit design and comprising the impedance values can be generated. For example, the circuit design can include an intentional inductor, and the netlist can comprise information about a resistance part and a reactance part of the electrical characteristics exhibited by the intentional inductor. In some implementations, the impedance values comprise mutual impedance values and self impedance values.

In another embodiment disclosed herein, semiconductor chip design information is received. The semiconductor chip design information comprises substrate profile information for a substrate over or under which a circuit design is to be implemented. A representation of electrical effects of the substrate at an operating frequency of interest is generated and stored. The representation of this embodiment represents the electrical effects of the substrate as a combined effect of a linear combination of complex exponentials. In particular implementations, the complex exponentials include unknown parameters, which can be computed using a non-linear least squares fitting technique. Further, the complex exponentials can correspond to images in a vector potential formulation caused by source magnetic dipoles. In some implementations, the substrate has multiple layers. In certain implementations, representations can be generated and stored for multiple other operating frequencies of interest. In further implementations, layout information indicative of at least signal-wire segments in a circuit design is received. In these implementations, impedance values for the signal-wire segments in the circuit design can be computed using the representation of the electrical effects of the substrate at the operating frequency of interest and stored.

In another embodiment disclosed herein, layout information indicative of at least signal-wire segments in a circuit design is received. At least one signal-wire segment is identified as having a length that exceeds a transverse distance to a nearest neighboring return path by more than a threshold amount (e.g., 20 times). A first impedance extraction technique is performed for the at least one signal-wire segment identified. The first impedance extraction technique generates a first representation of impedance effects in the circuit design. A second impedance extraction technique is performed for other signal-wire segments in the circuit design. The second impedance extraction technique generates a second representation of the substrate effect on impedance in the circuit design. In this embodiment, the first impedance extraction technique and the second impedance extraction technique both account for electrical effects caused by a multi-layer substrate. Furthermore, the first impedance extraction technique is computationally more efficient but less accurate than the second impedance extraction technique. In certain implementations, the first representation is refined using the second representation to generate a complete representation of the impedance effects in the circuit design. The first impedance extraction technique performed in this embodiment can use an approximation of a two-dimensional Green's function and the second impedance extraction technique can use an approximation of a three-dimensional Green's function. Furthermore, in particular implementations, both the first impedance extraction technique and the second impedance extraction technique do not represent the multi-layer substrate as a plurality of filaments.

In another disclosed embodiment, layout information indicative of at least signal-wire segments in a circuit design is received. Substrate profile information indicative of electrical characteristics of a substrate (e.g., a multi-layer substrate) over which the circuit design is to be implemented is also received. An impedance extraction technique is performed using the layout information and the substrate profile information. In this embodiment, the impedance extraction technique generates a plurality of impedance values for the signal-wire segments, but does not represent the substrate as a plurality of filaments during impedance extraction. A representation of electrical characteristics of the circuit design is generated. The representation can be, for example, a netlist that includes the impedance values. In certain implementations, the impedance extraction is performed using an approximation of a Green's function in the presence of the substrate. The Green's function can be due to a magnetic dipole. Furthermore, in some implementations, the impedance extraction can be performed using a representation of the substrate that comprises a superposition of complex exponentials. The representation of the electrical characteristics of the circuit design is a netlist that includes the impedance values.

Embodiments of the disclosed methods can be performed by software stored on one or more tangible computer-readable media (e.g., one or more optical media discs, volatile memory components (such as DRAM or SRAM), or nonvolatile memory or storage components (such as hard drives)) and executed on a computer. Such software can comprise, for example, an electronic-design-automation ("EDA") synthesis or verification tool. Such software can be executed on a single computer or on a networked computer (e.g., via the Internet, a wide-area network, a local-area network, a client-server network, or other such network). Additionally, any circuit description, design file, data structure, data file, intermediate result, or final result (e.g., a portion or all of a Spice or Spice-type netlist having impedance information) created or modified using any of the disclosed methods can be stored on a tangible computer-readable storage medium (e.g., one or more optical media discs, volatile memory or storage components (such as DRAM or SRAM), or nonvolatile memory or storage components (such as hard drives)). Furthermore, any of the software embodiments (comprising, for example, computer-executable instructions for causing a computer to perform any of the disclosed methods) or circuit descriptions, design files, data structures, data files, intermediate results, or final results created or modified by the disclosed methods can be transmitted, received, or accessed through a suitable communication means.

The foregoing and other objects, features, and advantages of the invention will become more apparent from the following detailed description, which proceeds with reference to the accompanying figures.

BRIEF DESCRIPTION OF THE DRAWINGS

FIG. 7C is a graph showing residual error in the complex images approximation using DCIM and the exemplary 2D impedance extraction embodiment for a 3-layer substrate with 5 images as a function of frequency.

FIGS. 14A-C are graphs showing the self (FIGS. 14A-B) and mutual (FIG. 14C) impedance for two conductor loops lying on different metal layers, in the presence of 3-layer substrate, as a function of frequency. The interconnect configuration is shown in the inset of FIG. 14A. Each conductor has a width w of 1.0 µm, thickness t of 0.5 µm. The number of complex images is K=5, and 5×3 filaments are used per conductor. FIG. 14D is a graph whose solid lines show the percentage errors in the magnitude of the impedance computations using the exemplary 2D impedance extraction embodiment disclosed herein with respect to FastHenry for the same configuration. The dashed lines show the error in impedance if the substrate is neglected.

FIG. 27A is a graph showing the self impedance of loop1 and mutual impedance between loops 1 and 2, as a function of frequency, in presence of 3-layer substrate, and FIG. 27B is a graph showing self impedance of loop2 at 100 GHz, as a function of loop width, both with and without the substrate.

DETAILED DESCRIPTION

I. General Considerations

Figure 1:
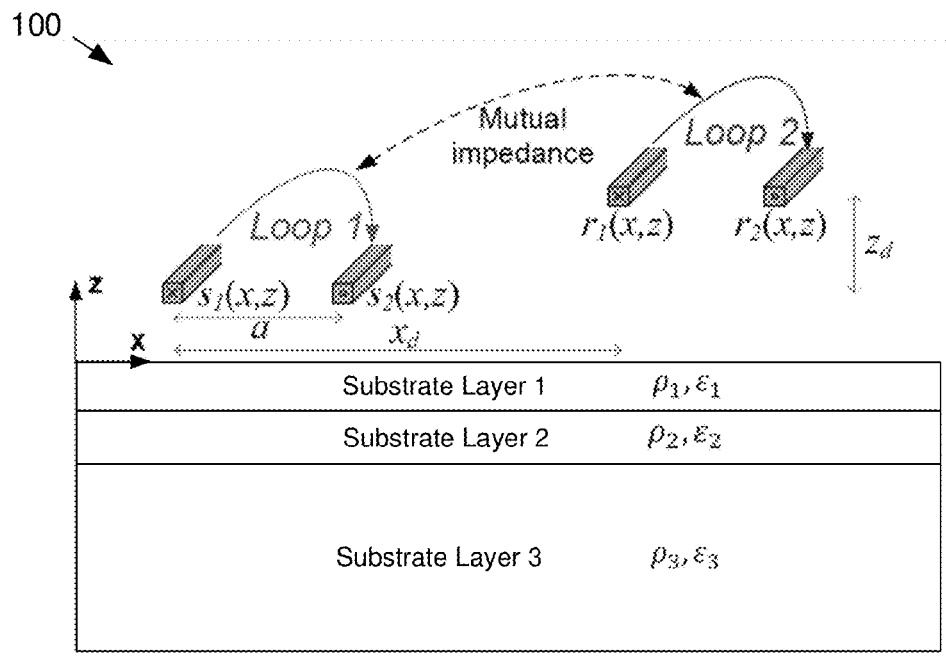
FIG. 1 is a schematic block diagram of a general interconnect configuration with magnetic interactions between the two illustrated conductor loops.

Disclosed below are representative embodiments of methods, apparatus, and systems for extracting impedance in a circuit design. The disclosed methods, apparatus, and systems should not be construed as limiting in any way. Instead, the present disclosure is directed toward all novel and non-obvious features and aspects of the various disclosed embodiments, alone and in various combinations and subcombinations with one another. The methods, apparatus, and systems are not limited to any specific aspect or feature or combination thereof, nor do the disclosed embodiments require that any one or more specific advantages be present or problems be solved.

More specifically, embodiments of computationally efficient methods to accurately compute the frequency-dependent impedance of VLSI interconnects in the presence of multi-layer conductive substrates are described. In certain embodiments, the resulting accuracy (e.g., errors less than 2%) and CPU time reduction (e.g., more than an order of magnitude) are a result of a Green's function approach with the correct quasi-static limit, a modified discrete complex image approximation to the Green's function, and a continuous dipole expansion to evaluate the magnetic vector potential at the short distances relevant to VLSI interconnects. These embodiments permit the evaluation of the self and mutual impedance of multiconductor current loops, including substrate effects, in terms of easily computable analytical expressions that involve their relative separations and the electromagnetic parameters of the multi-layer substrate.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "generate" to describe the disclosed methods. These terms are high-level abstractions of the actual operations that are performed. The actual operations that correspond to these terms may vary depending on the particular implementation and are readily discernible by one of ordinary skill in the art.

The disclosed technology can be used, for example, to analyze impedance effects on digital, analog, or mixed-signal integrated circuit designs before the circuits are physically implemented. The disclosed technology can be applied, for example, to any circuit design or situation where wire impedance effects may affect signal delay or signal integrity or power consumption. For instance, the disclosed embodiments can be used to analyze the high-frequency behavior of wires or interconnect in an integrated circuit design (e.g., an application-specific integrated circuit ("ASIC"), a programmable logic device ("PLDs") such as a field programmable gate array ("FPGA"), a system-on-a-chip ("SoC"), or a microprocessor) or in the off-chip interconnect at the board or package level (e.g., multilayered packages or printed circuit boards). The disclosed technology can also be used for the analysis of intentional inductors or other passive devices (e.g., intentional inductor or passive devices in an integrated circuit design, off-chip circuitry, or at the package level).

As more fully explained below, embodiments of the disclosed methods can be performed by software stored on one or more tangible computer-readable media (e.g., one or more optical media discs, volatile memory or storage components (such as DRAM or SRAM), or nonvolatile memory or storage components (such as hard drives)) and executed on a computer. Such software can comprise, for example, an electronic-design-automation ("EDA") synthesis tool. Such software can be executed on a single computer or on a networked computer (e.g., via the Internet, a wide-area network, a local-area network, a client-server network, or other such network). The software embodiments disclosed herein can be described in the general context of computer-executable instructions, such as those included in program modules, which can be executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment. For clarity, only certain selected aspects of the software-based implementations are described. Other details that are well known in the art are omitted. For example, it should be understood that the disclosed technology is not limited to any specific computer language, program, or computer.

Additionally, any circuit description, design file, data structure, data file, intermediate result, or final result (e.g., a portion or all of a Spice or Spice-like netlist or subcircuit representation comprising impedance information as a function of frequency, data indicative of parameters used with the Green's function approximations, a portion or all of a Green's function representation (such as a Green's function matrix), a portion or all of a impedance matrix, or a portion or all of circuit design information) created or modified using any of the disclosed methods can be stored on a tangible computer-readable storage medium (e.g., one or more optical media discs, volatile memory or storage components (such as DRAM or SRAM), or nonvolatile memory or storage components (such as hard drives)).

Furthermore, any of the software embodiments (comprising, for example, computer-executable instructions for causing a computer to perform any of the disclosed methods) can be transmitted, received, or accessed through a suitable communication means. Similarly, any circuit description, design file, data structure, data file, intermediate result, or final result (e.g., a portion or all of a Spice or Spice-like netlist comprising impedance information, data indicative of parameters used with the Green's function approximations, a portion or all of a Green's function representation (such as a Green's function matrix), a portion or all of a impedance matrix, or a portion or all of circuit design information) created or modified using any of the disclosed methods can be transmitted, received, or accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. Such communication means can be, for example, part of a shared or private network.

Moreover, any circuit description, design file, data structure, data file, intermediate result, or final result (e.g., a portion or all of a Spice or Spice-like netlist comprising impedance information, data indicative of parameters used with the Green's function approximations, a portion or all of a Green's function representation (such as a Green's function matrix), a portion or all of a impedance matrix, or a portion or all of circuit design information) produced by any of the disclosed methods can be displayed to a user using a suitable display device (e.g., a computer monitor or display). Such displaying can be performed as part of a computer-implemented method of performing any of the disclosed methods.

The disclosed methods can be used at one or more stages of an overall synthesis scheme. For example, any of the inductance extraction methods disclosed can be used during physical synthesis (e.g., during the physical verification process) in order to evaluate and improve a circuit design. Circuits manufactured from such circuit designs are also considered to be within the scope of this disclosure. For example, after synthesis is performed using embodiments of the disclosed methods, the resulting circuit design can be fabricated into an integrated circuit using known microlithography techniques. The disclosed technology is particularly suitable for verifying the correctness of a circuit design.

Certain embodiments of the disclosed methods are used to compute impedance effects in a computer simulation, physical verification tool, or other electronic design automation ("EDA") environment wherein the impedance in a circuit representation is analyzed. For example, the disclosed methods typically use circuit design information (for example, a netlist, HDL description (such as a Verilog or VHDL description), GDSII description, Oasis description, or the like) stored on computer-readable storage media. For presentation purposes, however, the present disclosure sometimes refers to the circuit and its circuit components by their physical counterpart (for example, wires, conductors, paths, and other such terms). It should be understood, however, that any such reference not only includes the physical components but also representations of such circuit components as are used in simulation, physical verification, or other such EDA environments.

Figure 33:
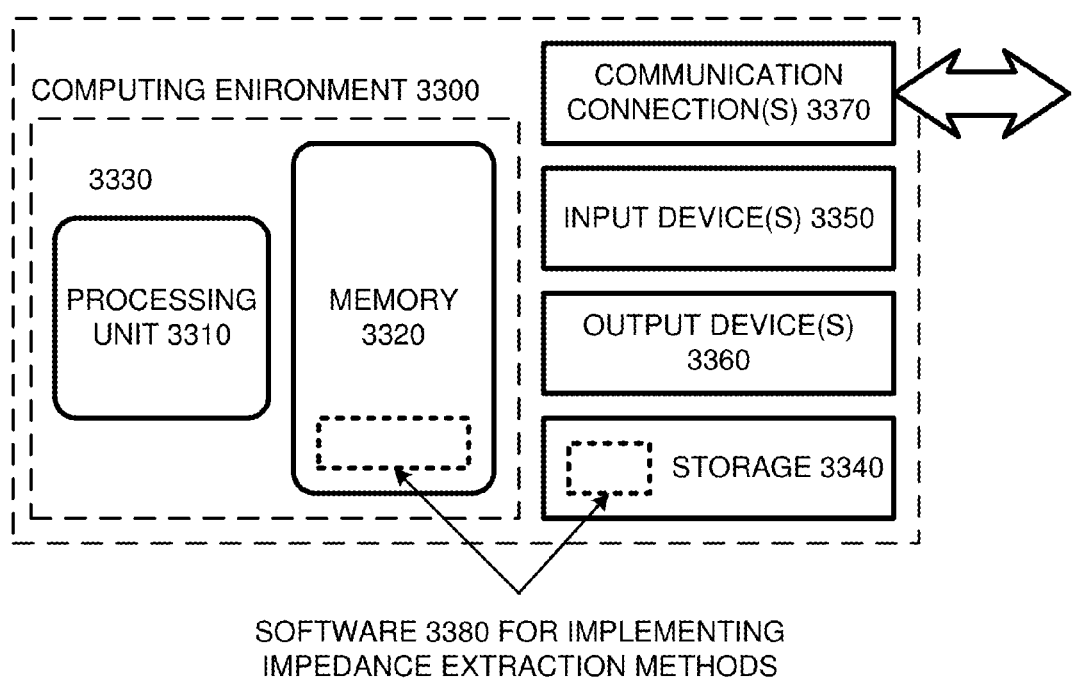
FIG. 33 is a schematic block diagram of an exemplary computing system on which embodiments of the disclosed methods can be implemented.

FIG. 33 illustrates a generalized example of a suitable computing environment 3300 in which several of the described embodiments can be implemented. The computing environment 3300 is not intended to suggest any limitation as to scope of use or functionality, as the methods described herein can be implemented in diverse general-purpose or special-purpose computing environments.

With reference to FIG. 33, the computing environment 3300 includes at least one processing unit 3310 and memory 3320. In FIG. 33, this most basic configuration 3330 is included within a dashed line. The processing unit 3310 executes computer-executable instructions and may be a real or a virtual processor. In a multi-processing system, multiple processing units execute computer-executable instructions to increase processing power. The memory 3320 may be volatile memory (e.g., registers, cache, RAM), non-volatile memory (e.g., ROM, EEPROM, flash memory, etc.), or some combination of the two. The memory 3320 stores software 3380 implementing one or more of the described impedance extraction techniques.

The computing environment may have additional features. For example, the computing environment 3300 includes storage 3340, one or more input devices 3350, one or more output devices 3360, and one or more communication connections 3370. An interconnection mechanism (not shown) such as a bus, controller, or network interconnects the components of the computing environment 3300. Typically, operating system software (not shown) provides an operating environment for other software executing in the computing environment 3300, and coordinates activities of the components of the computing environment 3300.

The storage 3340 may be removable or non-removable, and includes magnetic disks, magnetic tapes or cassettes, CD-ROMs, DVDs, or any other medium which can be used to store information and which can be accessed within the computing environment 3300. The storage 3340 can store instructions for the software 3380 implementing any of the described impedance extraction techniques.

The input device(s) 3350 can be a touch input device such as a keyboard, mouse, pen, or trackball, a voice input device, a scanning device, or another device that provides input to the computing environment 3300. For audio or video encoding, the input device(s) 3350 can be a sound card, video card, TV tuner card, or similar device that accepts audio or video input in analog or digital form, or a CD-ROM or CD-RW that reads audio or video samples into the computing environment 3300. The output device(s) 3360 can be a display, printer, speaker, CD-writer, or another device that provides output from the computing environment 3300.

The communication connection(s) 3370 enable communication over a communication medium to another computing entity. The communication medium is not a storage medium but conveys information such as computer-executable instructions, impedance extraction information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The various impedance extraction methods disclosed herein can be described in the general context of computer-readable media. Computer-readable media are any available media that can be accessed within or by a computing environment. By way of example, and not limitation, with the computing environment 3300, computer-readable media include tangible computer-readable storage media such as memory 3320 and storage 3340.

II. Two-Dimensional Treatment of VLSI Interconnect Impedance Extraction in the Presence of Multi-Layer Conductive Substrate A. Introduction In this disclosure, embodiments for computing the frequency-dependent impedance of VLSI interconnects in the presence of multi-layer conductive substrates are described. The disclosed embodiments are accurate, yet computationally inexpensive compared to conventional methods. For VLSI interconnect impedance extraction, certain embodiments of the disclosed technology rely on a loop impedance formalism, which leads to the correct physical behavior of closed on-chip currents. FIG. 1 is a schematic block diagram 100 illustrating a basic interconnect configuration as can be evaluated using embodiments of the disclosed loop impedance extraction method in the presence of a multi-layer substrate. In these embodiments, the long distance behavior of impedance parameters falls off as a power law, instead of the unphysical logarithmic behavior in PEEC. Hence, in the loop formalism, the separations between conductor loops with appreciable mutual impedances can be upper bounded by a few tens of micrometers for current and future technology nodes, and larger separations can be neglected. Many of the disclosed embodiments concern the high-frequency impedance matrix for interconnects that are sensitive to inductance effects. In certain implementations, the length of such interconnects is greater than 100 µm, much larger than the transverse separations where mutual impedance is appreciable. Hence, for these types of embodiments, a two-dimensional treatment is generally valid. Moreover, up to the maximum frequency of interest for VLSI technology (e.g., about 100 GHz), a quasi-static computation of the magnetic vector potential is justified since the minimum wavelength (~1 mm) is much larger than the relevant physical separations (e.g., a few micrometers), separations for which these are substantial.

Figure 2:
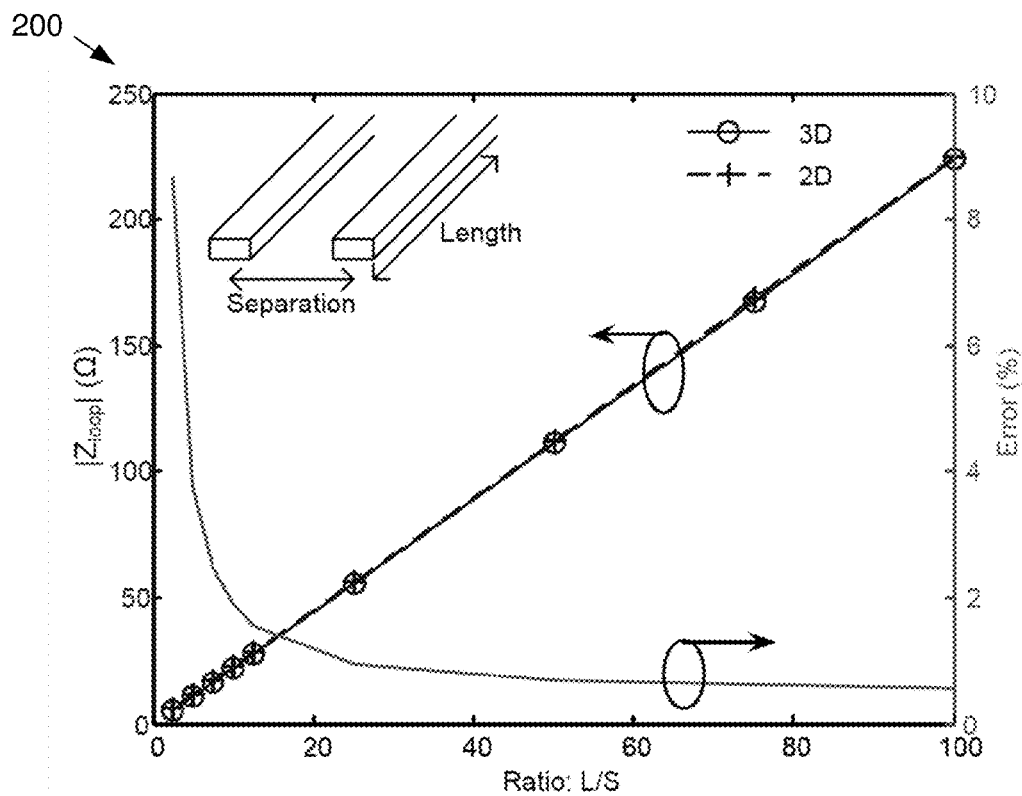
FIG. 2 is a graph showing a comparison between the exemplary 2D impedance extraction embodiment disclosed herein with a 3D computation (left y-axis) as a function of the ratio of conductor lengths to transverse separation (L/S) in the presence of a 3-layer substrate, at 100 GHz. The error percentage due to the 2D impedance extraction embodiment is shown on the right y-axis.
Figure 18:
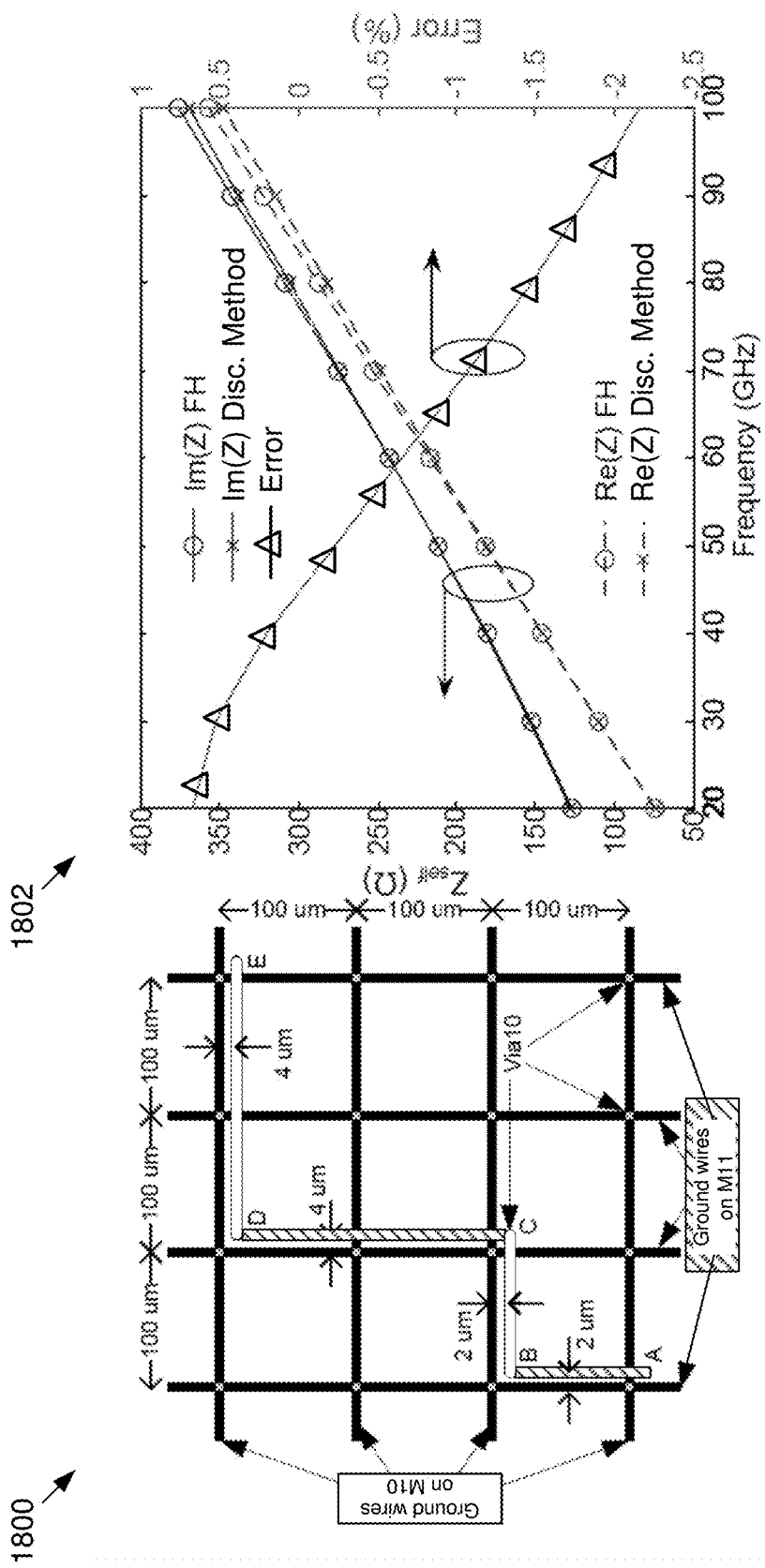
FIG. 18 includes graphs showing the impedance of a Manhattan interconnect laid out on metal layers M10 and M11 above a 3-layer substrate. A grid of ground wires provides nearby return paths to each wire segment. Interconnect geometry parameters are as per global wires at the 45 nm node.

FIG. 2 is a graph 200 showing that the error in loop impedance due to the exemplary 2D approximation disclosed herein is small when the conductor lengths exceed 20 times the transverse separations between them. For impedance extraction of Manhattan interconnects, each "bundle" of conductors formed by a signal line and its return paths, is divided into segments along their length such that the conductor cross-sections and their separations are uniform in each segment. As discussed, the common length of the conductors in each segment is desirably at least 20 times larger than the separations between them to permit the use of the 2D approximation (though this amount can be set to any other threshold). Timing-critical global interconnects that are designed to keep inductive effects under control often satisfy this constraint. In this case, the self impedance of each bundle, and the mutual impedance between adjacent parallel bundles, can be computed using the exemplary 2D impedance extraction embodiment disclosed in this section. Bundles that are perpendicular to each other have no mutual interaction, while the mutual impedance between bundles that are far apart can be neglected. The exemplary 2D embodiment described in this section can thus be applied to Manhattan VLSI interconnects subject to the constraint that each segment of the Manhattan wire is long (e.g., has a length that is greater than its transverse separation from neighboring wires by some threshold amount (such as 20)) and has nearby return paths. FIG. 18 is a schematic block diagram 1800 illustrating one such suitable interconnect layout.

Figure 15:
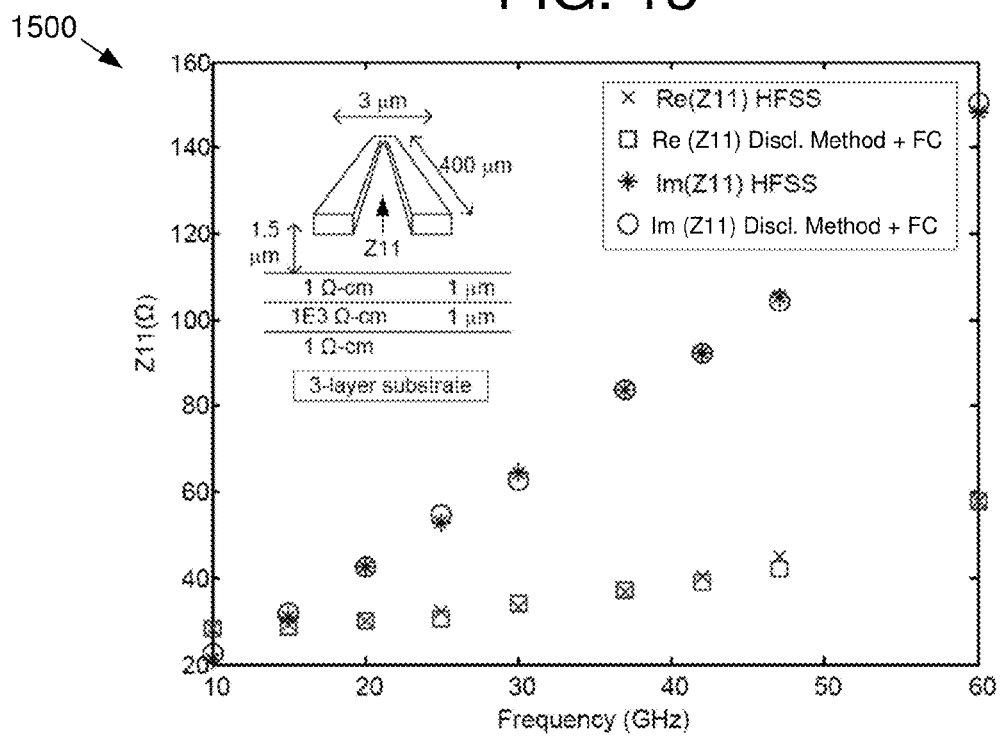
FIG. 15 is a graph showing the impedance Z11 of the one-port network formed by a closed conductor loop (shown in the inset of FIG. 15) above a 3-layer substrate when compared with HFSS. The magneto-quasi-static impedance obtained using the exemplary 2D impedance extraction embodiment disclosed herein is combined with capacitance from FastCap ("FC") using a transmission line model in Spice to obtain the Z11 parameter. The conductor width is 1 µm, and the thickness is 0.5 µm.

In order to describe current loop interactions, and in certain embodiments of the disclosed technology, the Green's function for a magnetic dipole in the presence of a multi-layer substrate is computed. This computation is discussed in Section II.C. below. Further, this Green's function describes the two-dimensional problem in the quasi-static approximation. In certain embodiments, up to the maximum frequency of interest for VLSI technology (100 GHz), a quasi-static computation of the magnetic vector potential is justified since the minimum wavelength (>1.5 mm) is much larger than the relevant physical transverse dimensions of the interconnect geometry. However, the skin depth of the substrate layers is often of the same order as the wavelength. Hence, the quasi-static assumption used in this disclosure is validated by comparison with a full-wave field solver (FIG. 15 is a graph 1500 showing one such comparison illustrating the validity of the quasi-static assumption). Furthermore, Section II.B discloses a modified discrete complex images approximation that leads to analytical expressions for the Green's function. In Section II.D., the computation of the impedance matrix according to one exemplary embodiment is presented. For the short separations that are relevant to loop impedance computations, a superposition principle applied to source dipoles can be used and leads to analytical expressions for the self and mutual impedance between conductor loops under the modified discrete complex images approximation, valid for any separation. Finally, in Section II.E., the accuracy of embodiments of the disclosed technology is considered by comparing results to industry standard electromagnetic field solvers and considering the computational efficiency of the substrate Green's function approach.

In brief, exemplary embodiments using analytical formulations to compute the loop impedance matrix for general VLSI interconnect configurations in the presence of a multi-layer conductive substrate are described. Particular implementations of these embodiments are suitable for system level extraction of Manhattan interconnects.

B. Background

The two-dimensional quasi-static Green's function for an elementary excitation consisting of a single monopole current, in the presence of a stratified substrate, is discussed in A. Weisshaar et al., "Accurate closed-form expressions for the frequency-dependent line parameters of on-chip interconnects on lossy silicon substrate," *IEEE Transactions on Advanced Packaging*, vol. 25, no. 2, pp. 288-296, May 2002. The configuration considered is shown in the schematic block diagram 200 of FIG. 2, where a single line current (monopole source) at co-ordinates (x', z') lies above a 3-layer conductive substrate. Translational invariance of the Green's function permits placement of the source at x'=0 without any loss of generality. The monopole Green's function, $G_{0,mono}$(x, z, x', z'), for the magnetic vector potential A(x, z) in region $R_0$ (above the substrate) satisfies:

$$\nabla^2 G_{0,mono}(x,z,x',z') = -\mu\delta(x-x')\delta(z-z'),$$

$$x'=0, z \geq 0 \qquad (1)$$

Since there are no sources inside the substrate layers (regions $R_i$, i>0), each of which has conductivity $\sigma_i$, permittivity $\in_i$, and permeability $\mu$, the Green's functions in these regions satisfy:

$$\nabla^2 G_i(x,z,x',z') - j\omega\mu(\sigma_i + j\omega\in_i)G_i(x,z,x',z') = 0,$$

$$i>0, z \leq 0 \qquad (2)$$

Solving (1) and (2), using continuity at the interface boundaries between different regions, results in an integral expression for $G_{0,mono}$(x, z, x', z'):

$$G_{0,mono}(x, z, 0, z') = -\frac{\mu}{2\pi} \times \int_0^\infty \left( e^{-|z-z'|\lambda} \frac{\cos(\lambda x)}{\lambda} - g_N(\lambda) e^{-(z+z')\lambda} \frac{\cos(\lambda x)}{\lambda} \right) \cdot d\lambda \qquad (3)$$

The derivation of this expression is set forth elsewhere and need not be repeated here. See, e.g., A. Weisshaar et al., "Accurate closed-form expressions for the frequency-dependent line parameters of on-chip interconnects on lossy silicon substrate," *IEEE Transactions on Advanced Packaging*, vol. 25, no. 2, pp. 288-296, May 2002; H. Ymeri et al., "New analytic expressions for mutual inductance and resistance of coupled interconnects on lossy silicon substrate," *Topical Meeting on Silicon Monolithic Integrated Circuits in RF Systems*, 2001, pp. 192-200; K. Coperich et al., "Systematic development of transmission-line models for interconnects with frequency-dependent losses," *IEEE Transactions on Microwave Theory and Techniques*, vol. 49, no. 10, pp. 1677-1685, October 2001; and A. Niknejad et al., "Analysis of eddy-current losses over conductive substrates with applications to monolithic inductors and transformers," *IEEE Transactions on Microwave Theory and Techniques*, vol. 49, no. 1, pp. 166-176, January 2001.

The function $g_N(\lambda)$, which characterizes the substrate contribution for an N-layer substrate, has the functional form:

$$g_N(\lambda) = \frac{Q_N(\lambda) - \lambda}{Q_N(\lambda) + \lambda} \qquad (4)$$

where the terms $Q_N(\lambda)$ are easily derived and are dependent on the properties ($\sigma$, $\in$, $\mu$) of each substrate layer. For the simplest case of a 1-layer substrate (N=1) extending to z=−∞ (occupying a half-space), $$Q_1(\lambda) = \sqrt{\lambda^2 + \gamma_1^2}. \qquad (5)$$

The quantity $\gamma_1^2 = j\omega\mu(\sigma_1 + j\omega\in_1)$ is determined by the frequency ($\omega$) and substrate properties: permeability ($\mu$), resistivity $$\left(\rho = \frac{1}{\sigma_1}\right)$$

and permittivity ($\in_1$). The first term in the integrand in (3), which represents the source contribution in free space, is analytically integrable. The second term, which represents the substrate contribution and involves $g_N(\lambda)$, cannot be integrated analytically. Several techniques have been proposed to compute the Green's function (3), which are reviewed briefly below.

1. Computation of the Substrate Green's Function

A straight-forward approach to evaluating the substrate Green's function is to use numerical integration techniques. However, this approach is computationally too expensive to handle complex VLSI interconnect configurations typically consisting of millions of wires. Alternative approaches to compute this Green's function, as discussed below, approximate the term $g_N(\lambda)$ in (3) with suitable expressions that make the substrate contribution to the Green's function analytically integrable.

2. Approximate Complex Image Method

In this approach, $g_1(\lambda)$ (for a 1-layer substrate) is approximated by its Taylor series expansion around $\lambda=0$, leading to the expression:

$$\frac{\sqrt{\lambda^2 + \gamma_1^2} - \lambda}{\sqrt{\lambda^2 + \gamma_1^2} + \lambda} = e^{-2\lambda/\gamma_1}\left(1 + \frac{\lambda^3}{3\gamma_1^3} + \ldots\right) \quad (6)$$

Keeping only the first term in the series expansion, expression (3) becomes:

$$G_{0,mono}(x, z, 0, z') \approx -\frac{\mu}{2\pi}\int_0^\infty \left(e^{-|z-z'|\lambda} - e^{-\left(z+z'+\frac{2}{\gamma_1}\right)\lambda}\right)\frac{\cos(\lambda x)}{\lambda} \cdot d\lambda \quad (7)$$

The expression in (7) is analytically integrable. The first exponential term arises from the source (line current) at the point (0, z'), while the second one represents the effect of an opposing current (negative sign) lying at the point $$\left(0, -z' - \frac{2}{\gamma_1}\right).$$

In other words, the effect of the substrate is represented, in this approximation, by a single image of the source line current. The image is located "inside" the substrate at a depth given by a complex number, hence the name "complex image". This method has been applied to VLSI interconnect extraction. However, the above approximation is valid only when the separation of the observation point (x, z) from the source at (0, z') is much larger than the skin depth ($\delta = \sqrt{2/(\omega\mu\sigma)}$) inside the substrate. Table I shows that the micrometer-size separations of interest for impedance extraction are much smaller than the skin depth at 50 GHz, for any realistic value of substrate resistivity. Hence, this method, although suitable for computing the interaction of antennas with the earth (substrate), is not suitable for VLSI interconnects.

TABLE I

SUBSTRATE RESISTIVITY VALUES AND CORRESPONDING SKIN DEPTH AT 50 GHZ FREQUENCY

| | Resistivity ($\Omega$-cm) | | | |
|---|---|---|---|---|
| | 0.01 | 0.1 | 1 | 10 |
| Skin Depth ($\mu$m) | 22.5 | 71.2 | 225 | 711 |

3. Rational Function Fit Method (RFFM)

An alternative method for evaluating the substrate Green's function involves approximating it by a rational function, which can be integrated analytically. The rational function fit in the complex $\lambda$ plane can be uniquely defined in terms of a set of K pole-residue pairs:

$$\int_0^\infty g_N(\lambda)e^{-(z+z')\lambda}\frac{\cos(\lambda x)}{\lambda}d\lambda \cong \int_0^\infty \sum_{n=1}^k \frac{C_n}{j\lambda^2 - A_n}d\lambda \quad (8)$$

The pole-residue extraction demands a non-linear least-square fit for every point (x, z) in space and is computationally expensive. Achieving accuracy within 1-2% using this technique often requires a number of poles K of the order of 100 for each (x, z) point. The number of such points (x, z) must also be large. For these reasons, even though this methodology can be applied for parasitic extraction of interconnects, it is computationally expensive and memory intensive.

4. Discrete Complex Images Method ("DCIM")

The DCIM can be considered as an extension to the approximate complex image method, which approximates $g_N(\lambda)$ using a number of complex images:

$$g_N(\lambda) \approx \sum_{j=1}^M b_j e^{-c_j\lambda}, \quad (9)$$

where each jth exponential term represents an image and ($b_j$, $c_j$)$\in\mathbb{C}$. Both M and ($b_j$, $c_j$) are the variables to be adjusted. The resultant integral has a similar form as that shown in H. Ymeri et al., "New analytic expressions for mutual inductance and resistance of coupled interconnects on lossy silicon substrate," *Topical Meeting on Silicon Monolithic Integrated Circuits in RF Systems*, 2001, pp. 192-200, and can be evaluated analytically. The DCIM is the method of choice for evaluating the three-dimensional fullwave Green's functions for layered media, which are known as Sommerfeld layered-media Green's functions. However, finding a set of complex images ($b_j$, $c_j$) that result in an accurate approximation to the Green's function remains challenging. The DCIM has been applied to VLSI interconnect impedance extraction in Fast-Maxwell for single-layer substrate configurations.

C. Green's Function for a Magnetic Dipole in the Presence of a Conductive Substrate The magnetic monopole Green's function leads to a PEEC approach that has an unphysical long distance behavior with the inductance per unit length decaying logarithmically with wire separation, instead of the correct power law decay associated with closed current approaches. See, e.g., A. Ruehli, "Inductance calculations in a complex integrated circuit environment," *IBM Journal of Research and Development*, vol. 16, no. 5, pp. 470-481, 1972; and R. Escovar et al., "An improved long distance treatment for mutual inductance,"

*IEEE Transactions on Computer-Aided Design of Integrated Circuits and Systems*, vol. 24, no. 5, pp. 783-793, May 2005.

Figure 3A:
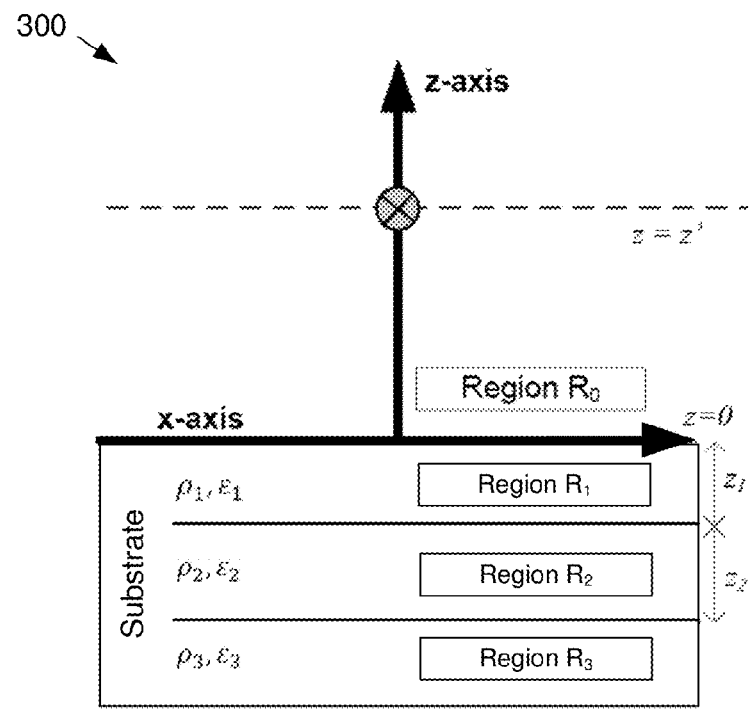
FIG. 3A is a cross-sectional schematic diagram of an open line current located at (0, z') lying above a three-layer substrate.
Figure 3B:
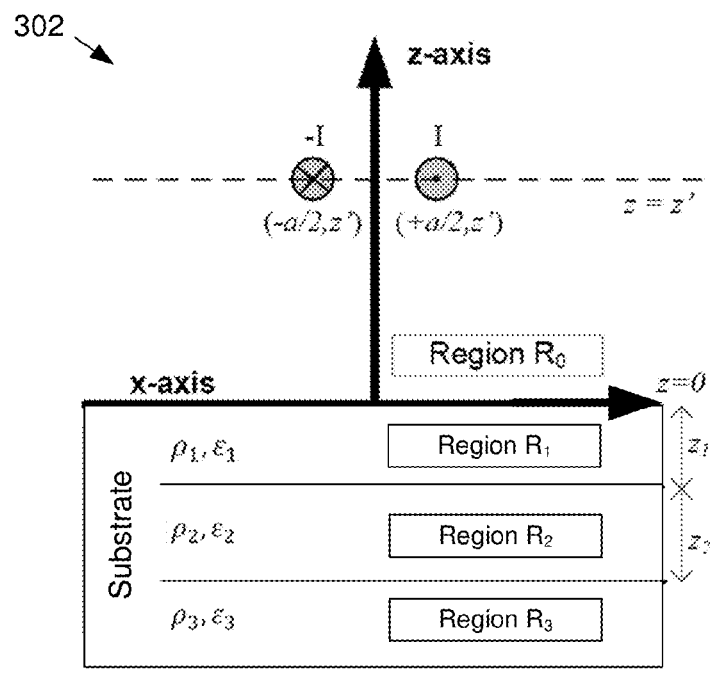
FIG. 3B is a cross-sectional schematic diagram of a two-dimensional magnetic dipole formed by two parallel opposing line current (−I and I) lying above a three-layer substrate. The third layer (Region $R_3$) extends to $z=-\infty$.

The end result is dense and non-diagonal-dominant impedance matrices. In this disclosure, embodiments of the disclosed technology involve computing physically measurable quantities (e.g., in terms of loop quantities) that result in sparse impedance matrices. One exemplary embodiment (referred to herein as the exemplary 2D impedance extraction embodiment) is based on a Green's function corresponding to a closed elementary loop: a magnetic dipole. The Green's function in this embodiment has the correct long distance behavior for the magnetic field and the correct low frequency behavior corresponding to magneto-quasi-static phenomena. It can be verified that it is the quasi-static limit of the Sommerfeld layered-media Green's function. The block diagrams 300, 302 of FIGS. 3A and 3B schematically show a horizontal magnetic dipole in two-dimensions (two parallel lines carrying opposing currents forming a current loop) in the presence of a 3-layer substrate. The dipole of this embodiment is centered at (x'=0, z'). The two line currents (−I and I) are located at (−α/2, z') and (+α/2, z'), such that the diameter of the dipole is α. The magnetic vector potential A(x, z) due to this dipole satisfies the relation:

$$\nabla^2 A_{0,dipole}^{hor}(x, z, x', z') = -\mu I \times \left(\delta\left(x+\frac{a}{2}\right)\delta(z-z') - \delta\left(x-\frac{a}{2}\right)\delta(z-z')\right) \quad (10)$$

$$= -\mu(Ia) \times \left(\frac{\delta\left(x+\frac{a}{2}\right)\delta(z-z') - \delta\left(x-\frac{a}{2}\right)\delta(z-z')}{a}\right),$$

$$x' = 0, z \geq 0$$

A dipole can be defined as the limit of the configuration in FIG. 3B, when α→0 and I→∞, such that the dipole moment per unit length, $$p = \frac{\mu}{2\pi} Ia \quad (11)$$

is constant. Hence, the Green's function for the magnetic vector potential $A_{0,dipole}^{hor}$ due to a unitary horizontal magnetic dipole (p=1) satisfies the relation:

$$\nabla^2 G_{0,dipole}^{hor}(x, z, x' = 0, z') =$$

$$-2\pi * \lim_{a \to 0} \left(\frac{\delta\left(x+\frac{a}{2}\right)\delta(z-z') - \delta\left(x-\frac{a}{2}\right)\delta(z-z')}{a}\right) \quad (12)$$

Since there are no sources in the substrate, Expression (2) remains valid. Using continuity at the interface boundaries between different regions, Expression (12) for a unitary magnetic dipole situated at (0, z') gives:

$$G_{0,dipole}^{hor}(x, z, x' = 0, z') = \quad (13)$$

$$-\lim_{a \to 0} \frac{\int_0^\infty \left(e^{-|z-z'|\lambda} - g_N(\lambda)e^{-(z+z')\lambda}\right)\frac{2\sin(\lambda x)\sin\left(\lambda\frac{a}{2}\right)}{\lambda} \cdot d\lambda}{a} =$$

$$-\int_0^\infty \left(e^{-|z-z'|\lambda} - g_N(\lambda)e^{-(z+z')\lambda}\right)\sin(\lambda x) \cdot d\lambda$$

The Green's function for a vertical magnetic dipole can be derived in a similar fashion:

$$G_{0,dipole}^{ver}(x, z, x' = 0, z') = -\int_0^\infty \left(e^{-|z-z'|\lambda} + g_N(\lambda)e^{-(z+z')\lambda}\right)\cos(\lambda x) \cdot d\lambda \quad (14)$$

In general, $g_N(\lambda)$, which is the term characterizing the substrate contribution for an N-layer substrate, can be cast into the form shown in Expression (4). The corresponding $Q_N(\lambda)$ functions become increasingly more complex as the number of layers is increased. For a single-layer substrate, $Q_1(\lambda)$ satisfies Expression (5). The corresponding expressions for two- and three-layer substrates are:

$$Q_2(\lambda) = m_1 \times \frac{(m_1 + m_2)e^{2m_1 z_1} - (m_1 - m_2)}{(m_1 + m_2)e^{2m_1 z_1} + (m_1 - m_2)} \quad (15)$$

$$Q_3(\lambda) = m_1 \times \frac{1 - e^{-2m_1 z_1} q(\lambda)}{1 + e^{-2m_1 z_1} q(\lambda)}, \text{ with} \quad (16)$$

$$q(\lambda) = \frac{\begin{bmatrix}(m_1 + m_2)(m_2 - m_3) + \\ (m_1 - m_2)(m_2 + m_3)e^{2m_1(z_2-z_1)}\end{bmatrix}}{\begin{bmatrix}(m_1 + m_2)(m_2 + m_3) + \\ (m_1 - m_2)(m_2 - m_3)e^{2m_1(z_2-z_1)}\end{bmatrix}}$$

In (15) and (16), $z_1$ refers to the thickness of the top substrate layer and $z_2$ refers to the thickness of the second substrate layer (in the case of 3-layer substrate) while the last substrate layer extends to −∞, as shown in FIGS. 3A and 3B. The coefficients $m_i$, corresponding to the ith substrate layer, are given by:

$$m_i(\lambda) = \sqrt{\lambda^2 + \gamma_i^2} = \sqrt{\lambda^2 + j\omega\mu(\sigma_i + j\omega\epsilon_i)} \quad (17)$$

Typical semi-conductor chip substrates have two or three layers with different resistivity values. Hence, the expressions presented so far encompass the relevant scenarios to characterize realistic process configurations. For substrates consisting of more than three layers, it is straightforward to find the extensions of Expressions (15) and (16). Next, an example of an accurate analytical approximation to the dipole Green's function in the presence of multi-layer substrates is described. The described example is not to be construed as limiting, however, as the resulting approximation can be varied from implementation to implementation without departing from the underlying principles of the disclosed technology.

1. Modified Discrete Complex Images Method

In Expressions (13), (14), the term containing $g_N(\lambda)$ prevents an analytical expression for the Green's function. Using the DCIM, for example, $g_N(\lambda)$ can be approximated by a sum of complex exponentials, Expression (9), leading to the desired integrable form of the substrate Green's function. The main difficulty with the DCIM is the search for a suitable set of "complex images", $Z_j$, that gives accurate results. Exemplary embodiments of the disclosed technology are based on simplifying the search for these complex exponentials. For example, one can start with a new look at the form of the dipole Green's function (G) in the presence of a substrate. For a single-layer substrate, with $Q_1(\lambda)$ given by (5), the following algebraic replacement can be performed:

$$g_1(\lambda) = \tag{18}$$

$$e^{-2\tanh^{-1}\left(\lambda/\sqrt{\lambda^2+\gamma_1^2}\right)} = e^{-2\tanh^{-1}\left((\lambda/\gamma_1)/\sqrt{1+(\lambda/\gamma_1)^2}\right)} = e^{-2\sinh^{-1}(\lambda/\gamma_1)}$$

This alternative functional representation of $g_1(\lambda)$ naturally leads to a separation of the coefficient $1/\gamma_1$, which constitutes the sole complex part of the exponent. The separation of this complex term allows the approximation of the expression $g_1(\lambda)$ using real coefficients ($\alpha_k$). This is in contrast with the DCIM which involves complex coefficients ($c_j$). Furthermore, coefficients $\beta_k$ can be added to perform a linear combination of the complex exponentials and the following approximation can be used:

$$g_1(\lambda) \approx \sum_{k=1}^{K} \beta_k e^{-\alpha_k\left(\frac{\lambda}{\gamma_1}\right)} \tag{19}$$

$$\alpha_k \in \mathbb{R}, \beta_k \in \mathbb{R}$$

Figure 4:
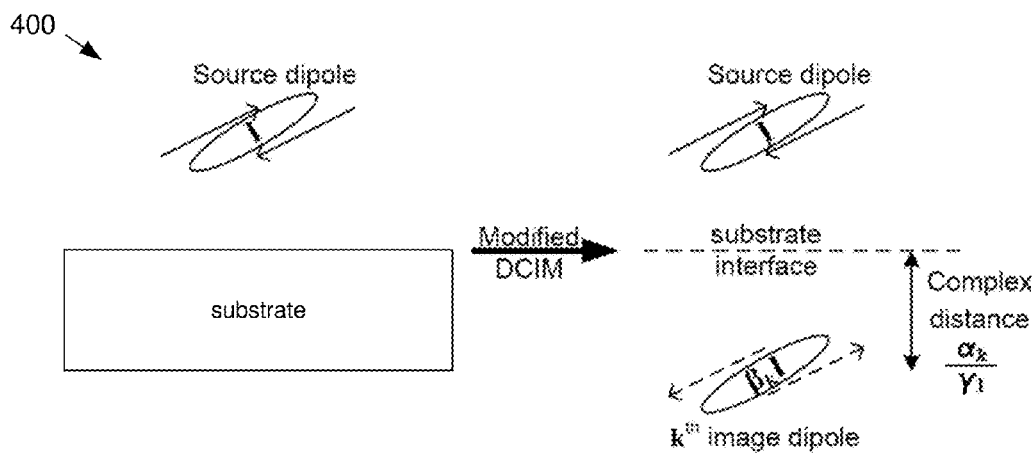
FIG. 4 is a schematic block diagram showing a physical interpretation of the modified discrete complex images method ("DCIM") used in embodiments of the disclosed technology.

Physically, the approximation (19) has a similar interpretation to that of the discrete complex images method. The kth term in the approximation constitutes an image of the dipole current source at a complex distance $\alpha_k/\gamma_1$, while the coefficient $\beta_k$ modifies the magnitude of the image current. This is shown schematically by representation 400 in FIG. 4.

From (19) it is clear that $\alpha_k > 0$ to ensure convergence. Moreover, since $g_1(0)=1$, it follows that $\Sigma_k \beta_k = 1$. The non-linear fitting algorithm used in embodiments of the disclosed technology finds an accurate approximation with the parameters ($\alpha_k$, $\beta_k$) that naturally satisfy these properties. Matlab's in-built function "fminsearch," for example, can be used to determine the best fit to the parameters $\alpha_k$, $\beta_k$. In one exemplary embodiment, the starting value of all parameters is set to 1. Since $\alpha_k \in \mathbb{R}$, the search space for the set of "complex images" is smaller.

The number of images, K, determines the computational expense in finding the set of images ($\alpha_k$, $\beta_k$) and the accuracy of the approximation, for a given substrate configuration. Large values of K lead to instabilities making it difficult to find a good fit. In experiments that were performed using this exemplary approximation, it was found that K=5 gives desired accuracy for the impedance (within 2% of field solver) while keeping the computation time for the set of images ($\alpha_k$, $\beta_k$) within a few minutes.

Inserting (19) into (13) and (14), the following analytical expressions can be obtained for the Green's functions:

$$G_{0,dipole}^{hor}(x, z, z') \approx \tag{20}$$

$$-\int_0^\infty \left( e^{-|z-z'|\lambda} - \sum_{k=1}^{K} \beta_k e^{-\alpha_k \frac{\lambda}{\gamma_1}} e^{-(z+z')\lambda} \right) \sin(\lambda x) d\lambda =$$

$$-\left[ \frac{x}{|z-z'|^2+x^2} - \sum_{k=1}^{K} \left( \beta_k \frac{x}{\left(z+z'+\frac{\alpha_k}{\gamma_1}\right)^2+x^2} \right) \right]$$

$$G_{0,dipole}^{ver}(x, z, z') \approx \tag{21}$$

$$-\int_0^\infty \left( e^{-|z-z'|\lambda} + \sum_{k=1}^{K} \beta_k e^{-\alpha_k \frac{\lambda}{\gamma_1}} e^{-(z+z')\lambda} \right) \cos(\lambda x) d\lambda =$$

$$-\left[ \frac{|z-z'|}{|z-z'|^2+x^2} + \sum_{k=1}^{K} \left( \beta_k \frac{z+z'+\frac{\alpha_k}{\gamma_1}}{\left(z+z'+\frac{\alpha_k}{\gamma_1}\right)^2+x^2} \right) \right]$$

The same replacement (19) can be used for 2-layer and 3-layer substrate configurations. Hence, for the general N-layer substrate:

$$g_N(\lambda) \approx \sum_{k=1}^{k} \beta_k e^{-\alpha_k\left(\frac{\lambda}{\gamma_1}\right)} \tag{22}$$

$$\alpha_k \in \mathbb{R}, \beta_k \in \mathbb{R}$$

and the expressions (20), (21) remain valid. ($\alpha_k$, $\beta_k$) are parameters that depend only on the substrate profile (resistivity, dielectric constant and thickness of each layer) and the frequency of interest and independent of the design. Hence, the computation of these parameters constitutes a one-time cost for a given technology, at each frequency.

Figure 5A:
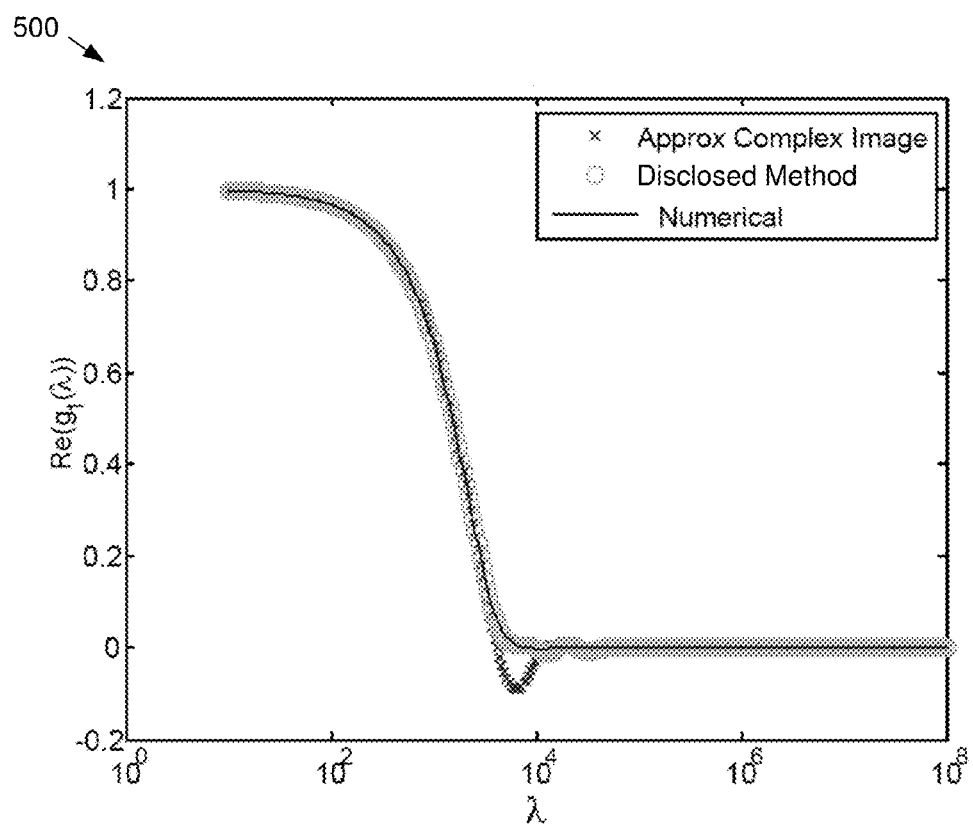
FIG. 5A is a graph showing the approximation of the real part of $g_1(\lambda)$ using the exemplary 2D impedance extraction embodiment disclosed herein (with K=20) and ACIM for a 1-layer substrate, $\rho=1$ $\Omega$-cm.
Figure 5B:
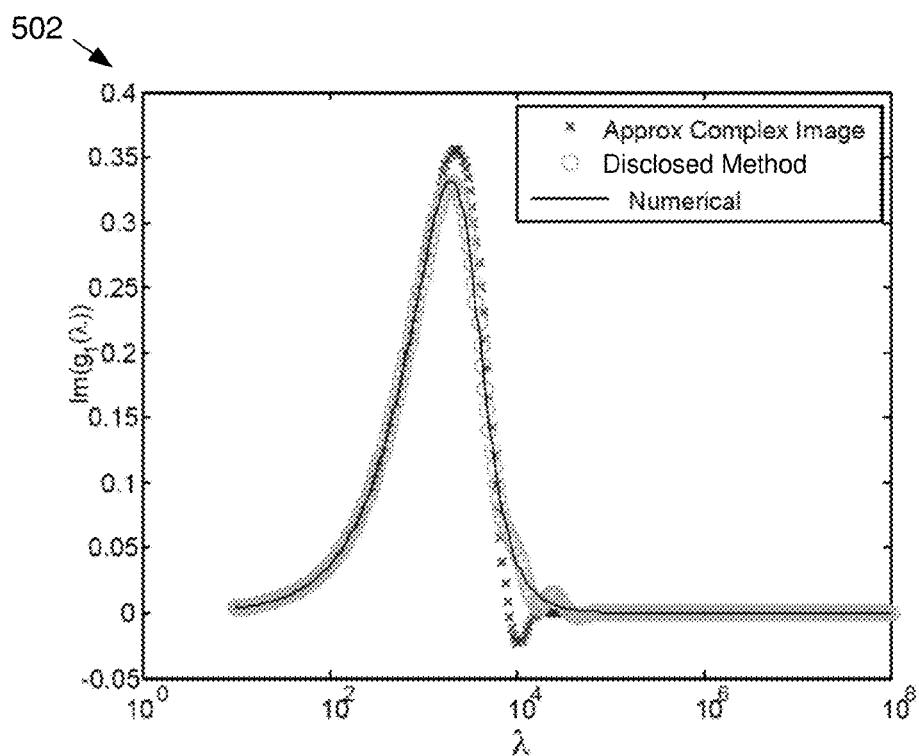
FIG. 5B is a graph showing the approximation of the imaginary part of $g_1(\lambda)$ using the exemplary 2D impedance extraction embodiment (with K=20) and ACIM for a 1-layer substrate, $\rho=1$ $\Omega$-cm.
Figure 5C:
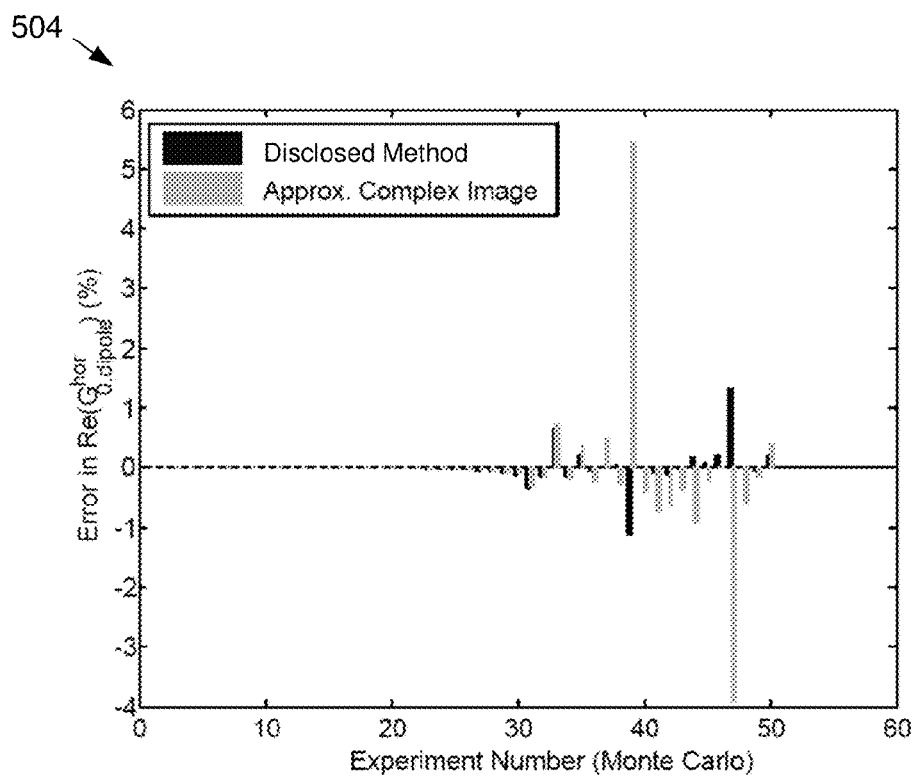
FIG. 5C is a graph showing Monte-Carlo results for error in the substrate Green's function using the exemplary 2D impedance extraction embodiment with respect to numerical computations. Monte Carlo simulations were done for frequencies of 20-100 GHz, z-separations of 0.5-1.0 µm, x-separations of 0.5-10 µm.

2. Accuracy of the Modified Discrete Complex Images Method and Comparison with Other Methods Graphs 500 and 502 in FIGS. 5A and 5B, respectively, shows that Expression (19) provides a good approximation to the numerically computed value of $g_1(\lambda)$. The same approximation using the ACIM shows significant deviation. Given the oscillatory nature of the Green's function, the x- and z-separations are critical factors affecting the quality of the approximation, besides the frequency and substrate parameters. Monte-Carlo simulations have been performed to evaluate the substrate Green's function $G_{0,dipole}^{hor}$ from Expression (20) over a wide range of frequencies and x-, z-separations. Graph 504 in FIG. 5C plots the resulting error in the Green's function computation for a typical 1-layer substrate. While the error using the exemplary technique is small, the ACIM sometimes gives much larger errors. This is because the ACIM is not valid for all x-, z-separations and frequencies, as explained in Section II.B. The cases with small error are those in which the randomly chosen geometries are such that the effect of the substrate is small and the error in the ACIM is not reflected in the overall Green's function.

Figure 6A:
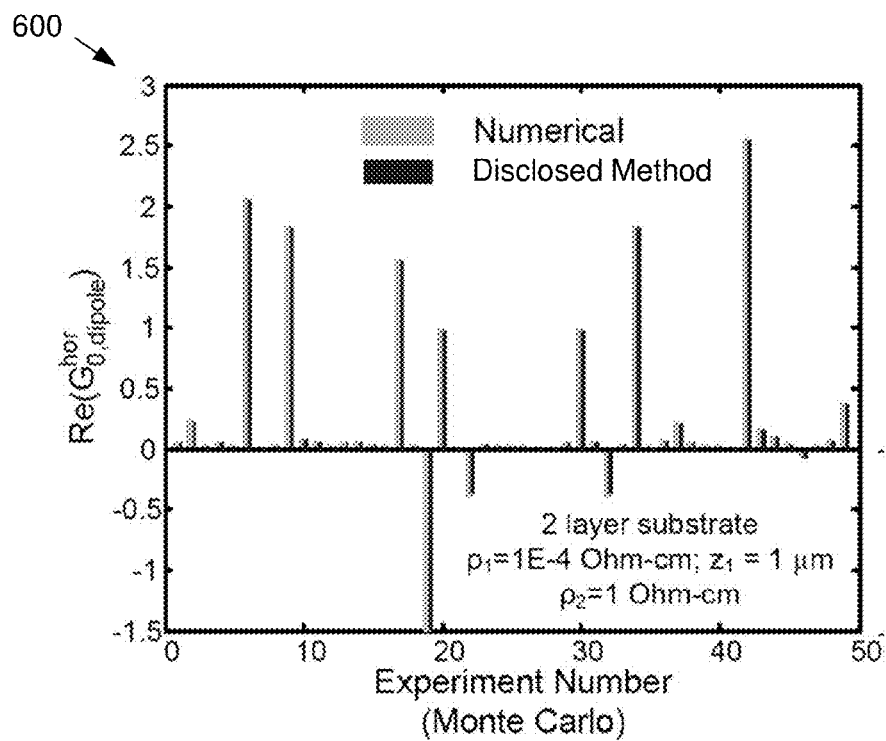
FIGS. 6A-6C are Monte-Carlo simulations comparing the approximation (Expression (20)) of the substrate Green's function to a numerical evaluation of Expression (13) for a 2-layer substrate with K=20 image (FIG. 6A) and a 3-layer substrate with two different profiles (FIGS. 6B and 6C) with K=5 images. In the graphs, the frequency range is 20-100 GHz, z-separations are 0.5-1.0 µm, and x-separations are 0.5-10 µm.
Figure 6B:
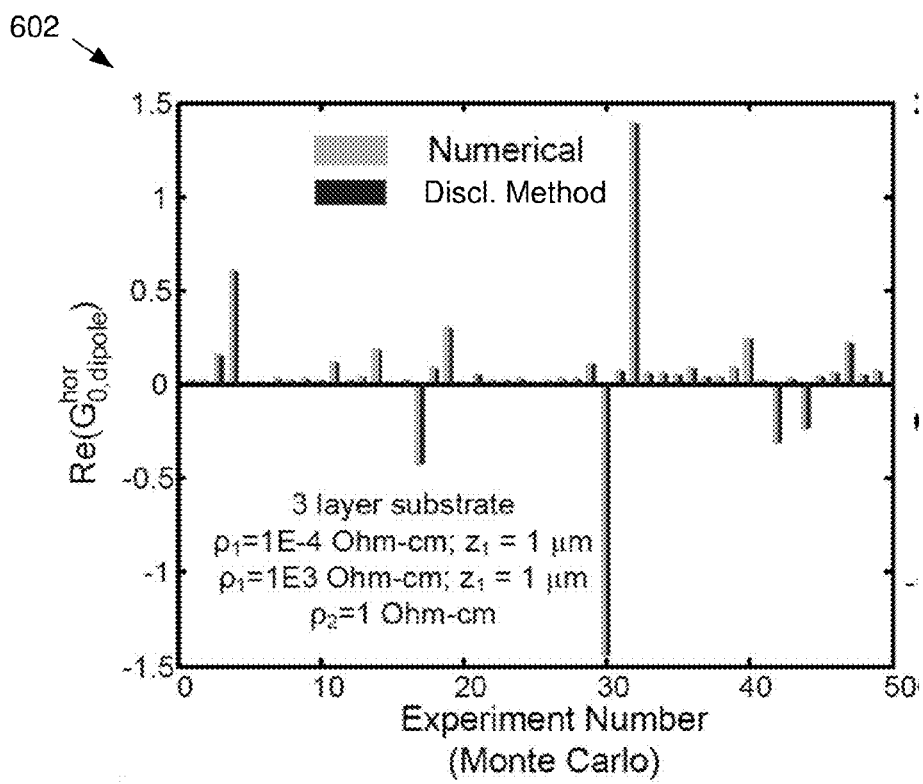
Figure 6C:
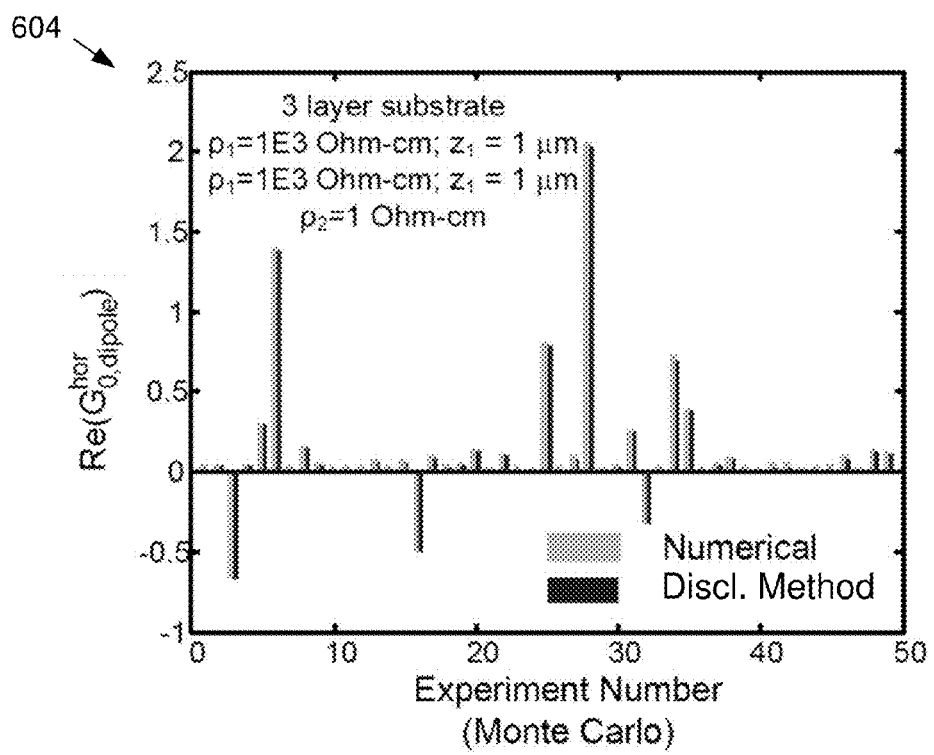

The Monte-Carlo results for typical 2-layer and 3-layer substrates are shown in graphs 600, 602, and 604 of FIGS. 6A, 6B, and 6C, respectively. In all illustrated cases, the analytical expression for the substrate Green's function shown in Expression (20) provides excellent agreement with the numerical calculation. Similar results are obtained for Expression (21).

Figure 7A:
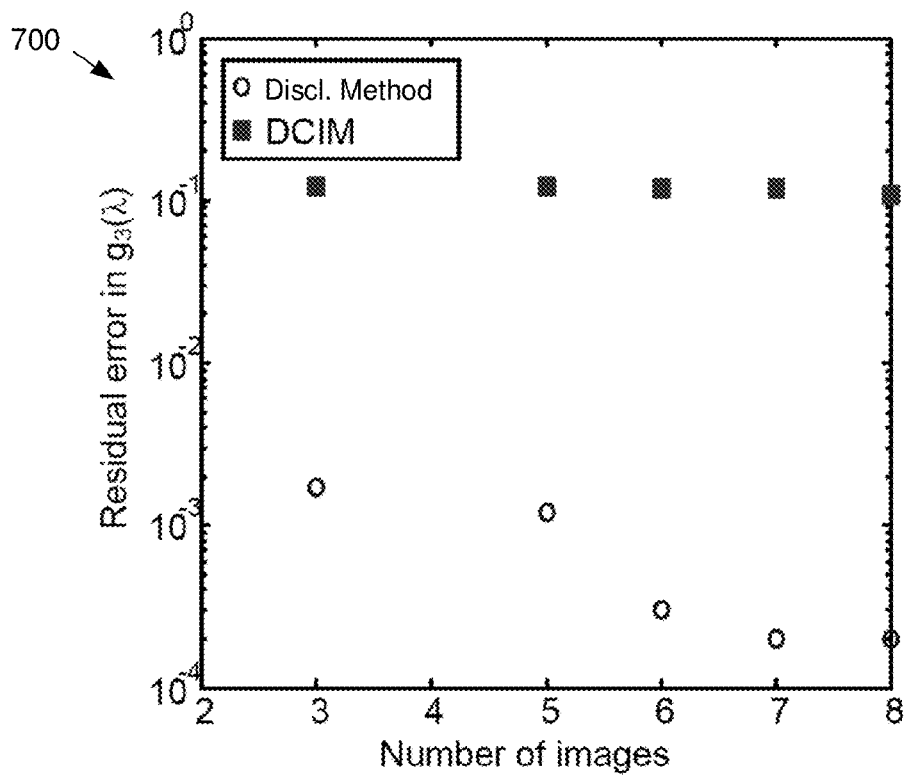
FIGS. 7A-7C are graphs showing the residual error (FIG. 7A) and CPU time (FIG. 7B) on a 2 GHz processor for computing the complex images approximation using the DCIM and the exemplary 2D impedance extraction embodiment disclosed herein for a 3-layer substrate at 90 GHz.
Figure 7B:
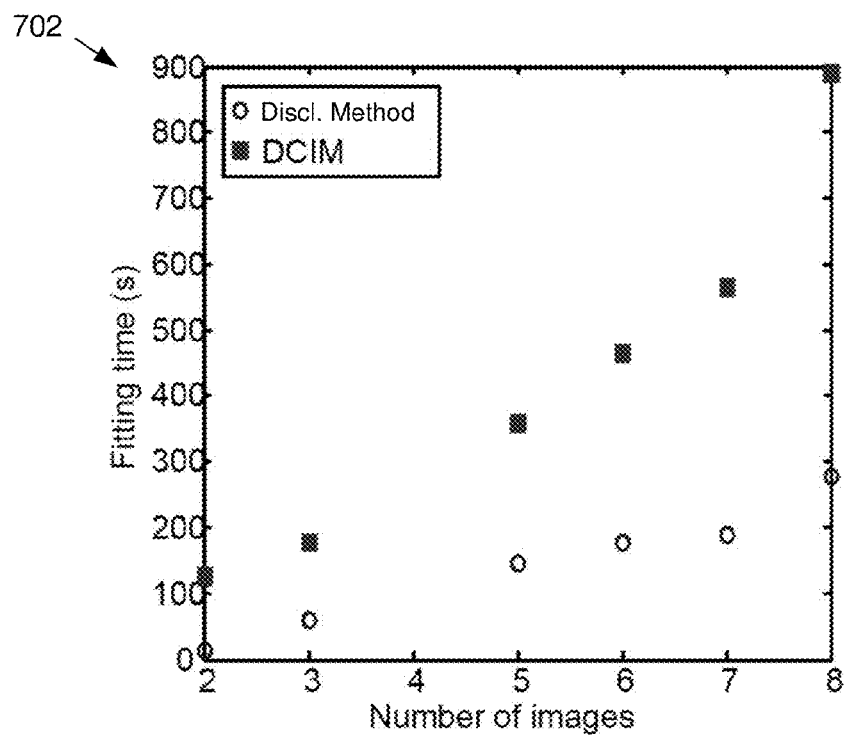
Figure 7C:
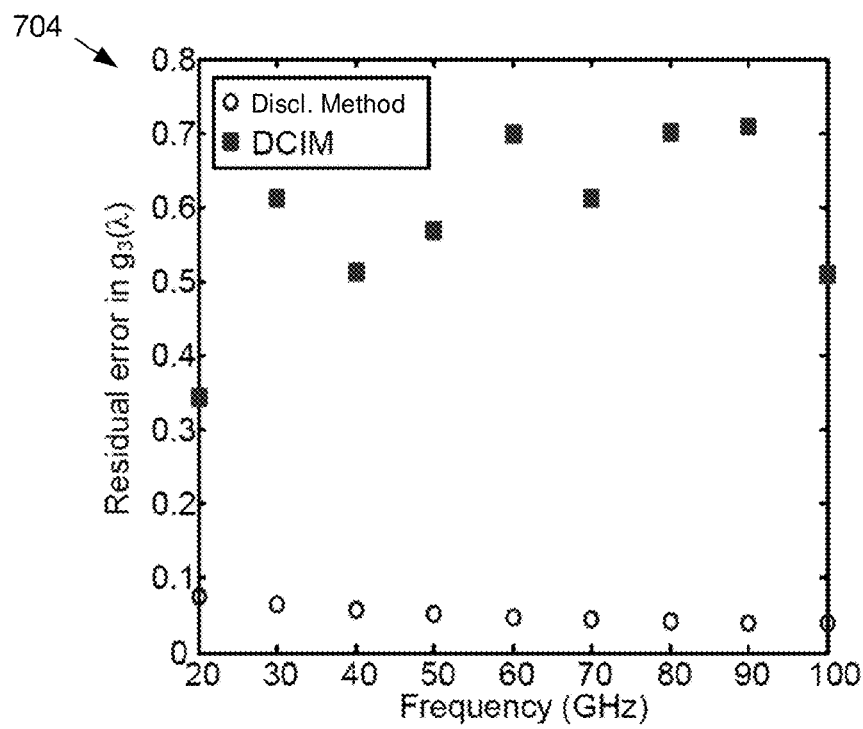
Figure 8:
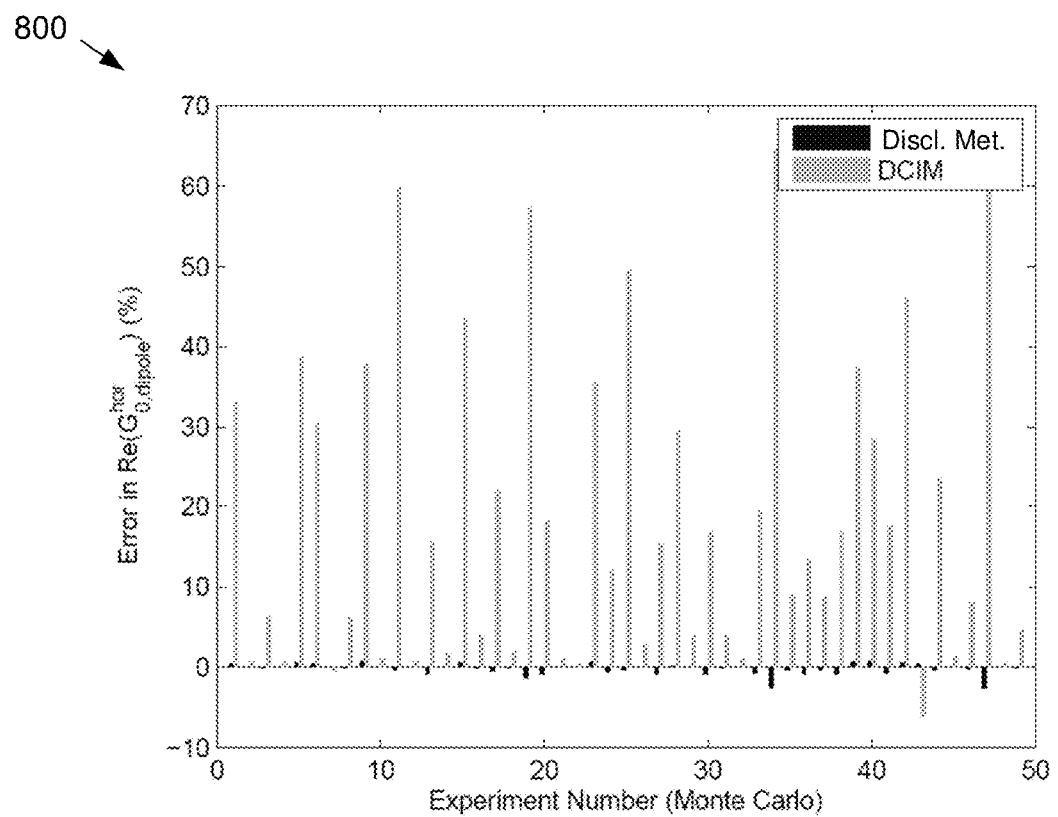
FIG. 8 is a graph showing the error in the substrate Green's function computation (Expression (20)) using DCIM and the exemplary 2D impedance extraction embodiment disclosed herein with respect to numerical computations for a 3-layer substrate. In the graph, the number of images M=K=5. Monte Carlo simulations were performed for a frequency range of 20-100 GHz, z-separations of 0.5-1.0 µm, and x-separations of 0.5-10 µm.

Although several techniques have been proposed to implement DCIM to approximate the 3D substrate Green's function, it still remains a challenging task. To implement DCIM for the 2D quasi-static Green's function, the Variable Projections (VARPRO) method can be used, which can be used for exponential fitting problems. The sampling points in $\lambda$, are user-defined, giving wide latitude for non-uniform sampling to account for the rapid variations in $g_N(\lambda)$. Moreover, the linear coefficients ($b_j$ in Expression (9), or $\beta_k$ in Expression (22)) are uniquely determined once a solution to the nonlinear parameter least square problem is found. Hence, random starting values are needed only for the non-linear parameters ($c_j$ in Expression (9), or $\alpha_k$ in Expression (22)). The residual errors and the computation time to perform the two fits corresponding to Expressions (22) and (9) are compared in graphs 700 and 702 shown in FIGS. 7A and 7B as a function of the number of complex images. It is found that the exemplary 2D impedance extraction embodiment converges to an optimal solution faster and with greater accuracy than the DCIM. Graph 704 in FIG. 7C shows that the results from the exemplary 2D impedance extraction embodiment are smooth as a function of frequency, a property not shared by the DCIM. Finally, graph 800 in FIG. 8 compares the Green's function computation using DCIM and the exemplary 2D impedance extraction embodiment for the same number of complex images. The superior performance of the exemplary 2D impedance extraction embodiment stems from the fact that the search for exponential fitting parameters, which is in unconstrained complex space under the DCIM, is constrained to a search for real coefficients applied to a specific complex number ($1/\gamma_1$ in Expression (22)) with the exemplary 2D impedance extraction embodiment.

In comparison with RFFM, one advantage of the exemplary 2D impedance extraction embodiment is in terms of computation cost. Computing the Green's function G(x, z, x', z') using RFFM involves evaluation of the pole-residue pairs in Expression (8) for each pair of points (x, z) and (x', z'). Impedance extraction of a general interconnect configuration requires numerous computations of G, at coordinates that are not known a priori. In Table II, the computation time is shown for one element of the loop impedance matrix shown in Expression (33). Since the impedance matrix for a realistic interconnect configuration may require hundreds of such computations (the interconnect shown in Section II.E with 15 filaments per conductor requires $15^2$=225 such computations), the cost of using RFFM quickly becomes prohibitive. On the other hand, with the exemplary 2D impedance extraction embodiment, the complex exponentials fit does not need to be repeated for every interconnect configuration. Hence, even though the computation time for each fitting step with RFFM may be reduced by trading-off accuracy, this will not bridge the orders of magnitude gap in impedance computation expense between RFFM and the disclosed method.

TABLE II

COST OF COMPUTING ONE ELEMENT OF THE LOOP IMPEDANCE MATRIX WITH RFFM AND WITH THE DISCLOSED 2D EMBODIMENT, IN THE PRESENCE OF A 2-LAYER SUBSTRATE. $T_i$: TIME TO EXTRACT SET OF COMPLEX IMAGES (ONE TIME COST); $T_p$: TIME TO COMPUTE ONE SET OF POLE-RESIDUE FITS; $n_{fits}$: NUMBER OF POLE-RESIDUE FITS NEEDED PER Z-MATRIX ELEMENT (USING DDA); $T_z$: TIME TO COMPUTE ONE Z-MATRIX ELEMENT

|  | $T_i$ (s) | $T_p$ (s) | $n_{fits}$ | $T_z$ (s) |
|---|---|---|---|---|
| RFFM | 0 | 16.9 | 40 | 674 |
| Disclosed Method | 91.34 | 0 | 0 | <1 sec. |

D. Interconnect Impedance Computation Using the Green's Function for a Magnetic Dipole In this section, computing interconnect impedances for a set of interacting conductors in the presence of a multi-layer conductive substrate is discussed. Because embodiments of the disclosed technology concern a two-dimensional scenario, the conductors are assumed to have a common length, L. The general impedance extraction problem is shown schematically in diagram 100 of FIG. 1, where Loop1 denotes the source of the magnetic field and Loop2 the affected conductor loop. The self-impedance of each loop, and the mutual impedance between the two loops, in the presence of the multilayer substrate is sought. This section presents exemplary analytical expressions to compute these impedances. The magnetic vector potential A(x, z) due to the source conductor loop is first computed in Section II.D.1. These exemplary expressions for A(x, z) are valid for all separations. In Section II.D.2, the mutual and self impedance computation using these analytical expressions is explained for conductors with cross-sectional dimensions small enough to be represented as single filaments. Finally, Section II.D.3 discusses the computation for wide/thick conductors which are discretized into multiple filaments in order to capture the internal skin effects.

1. Magnetic Vector Potential Due to a Finite Size Conductor Loop

The Green's functions in Expressions (20) and (21) give the magnetic vector potential at the point (x, z) due to a unitary magnetic dipole (p=1) located at (0, z'). In the general case, the vector potential at (x, z) due to a finite size magnetic dipole is obtained by integrating the Green's function times the source dipole moment density (P(x', z')) over the coordinates of the source:

$$A(x, z) = \int_{x'z'} G(x, z, x', z') P(x', z') dx' dz' \qquad (23)$$

Figure 9A:
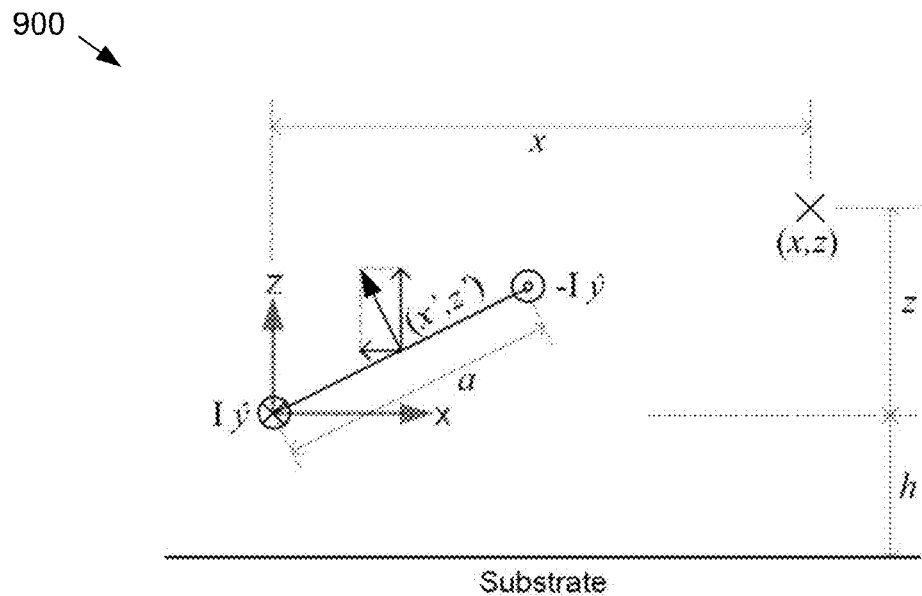
FIG. 9A is a schematic block diagram of a source current loop represented as single dipole at its center (according to the exemplary dipole approximation ("DA") disclosed herein) and resolved into horizontal and vertical components.

It has been shown that when the separations between the source (x', z') and the destination (x, z) is larger than roughly 5 times the diameter of the source dipole (a in the wire configuration shown in schematic block diagram 900 of FIG. 9(a)), the dipole can be approximated by a point source at its center. This is the "dipole approximation" ("DA"), which is discussed in more detail in R. Escovar et al., "An improved long distance treatment for mutual inductance," *IEEE Transactions on Computer-Aided Design of Integrated Circuits and Systems*, vol. 24, no. 5, pp. 783-793, May 2005, and United States Patent Application Publication No. 2005/0120316, which are hereby incorporated herein by reference. Under this approximation, the magnetic vector potential is given by:

$$A_{DA}(x, z) = G(x, z, x', z') \times \frac{\mu}{2\pi} Ia \qquad (24)$$

where I denotes the current flowing through Loop1, $\alpha$ is the diameter of the dipole (the distance between the two conductors forming the loop) and $$p = \frac{\mu}{2\pi} Ia$$

is the dipole moment acting at the point (x', z') which lies at its center. This is shown schematically in block diagram 900 of FIG. 9A. Since the vector potential resulting from both horizontal and vertical components of the dipole moment, p, are directed along the third dimension ŷ, the value of the Green's function G(x, z, x', z') in Expression (24) is simply the algebraic sum of $G_{0,dipole}^{hor}$ and $G_{0,dipole}^{ver}$.

However, for impedance extraction, it is desirable to accurately compute the vector potential when separations are of the order of, or smaller than, the diameter of the source dipole.

Figure 9B:
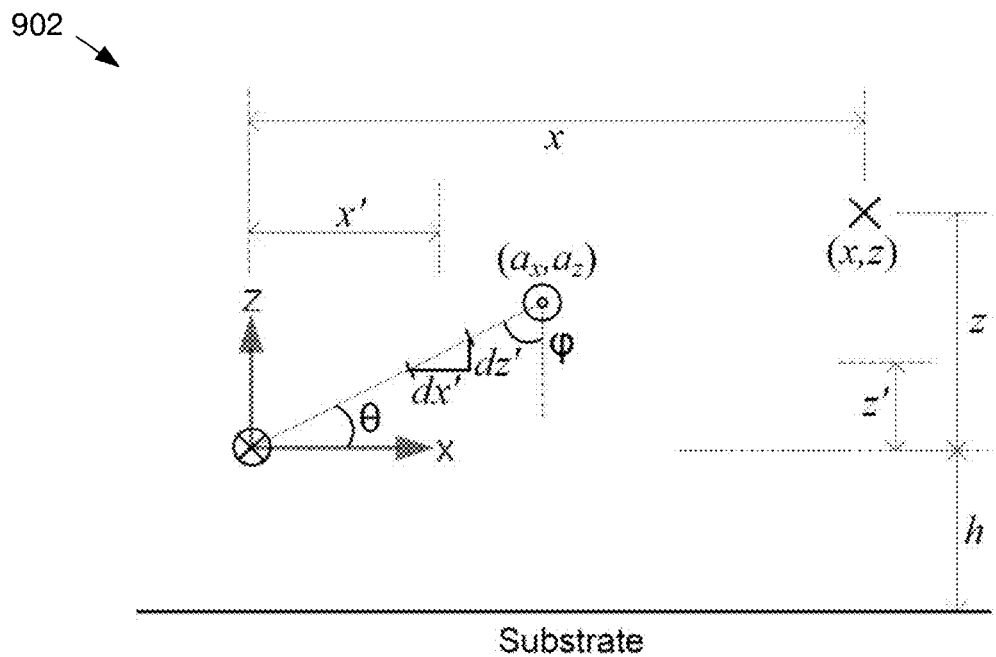
FIG. 9B is a schematic block diagram of a source current loop represented as a continuous distribution of magnetic dipoles along the line joining the two ends of the conductor loop. This approximation is valid even at very short distances from the source loop.

In this scenario, the dipole approximation is no longer valid and, in one exemplary embodiment, the source is replaced by a continuous distribution of magnetic dipoles along the line joining the two ends of the source current loop. As shown by the configuration in schematic block diagram 902 of FIG. 9B, each infinitesimal magnetic dipole located at (x', z') is resolved into its horizontal and vertical components with diameters dx' and dz', and dipole moments $$\frac{\mu}{2\pi} I dx' \text{ and } \frac{\mu}{2\pi} I dz',$$

respectively. The vector potential is then given by:

$$A_{cont}(x, z) = \qquad (25)$$
$$A_{cont}^{hor}(x, z) + A_{cont}^{ver}(x, z) = \int_0^{a_x} G_{0,dipole}^{hor}(x, z, x', z') \frac{\mu}{2\pi} I dx' +$$
$$\int_0^{a_z} G_{0,dipole}^{ver}(x, z, x', z') \frac{\mu}{2\pi} I dz'$$

Employing Expressions (20) and (21), analytical expressions for $A_{cont}^{hor}$ and $A_{cont}^{ver}$ are obtained, and are shown below in Section II.F. These expressions allow evaluation of the magnetic vector potential at any point (x, z) due to the (2D) current loop formed by a pair of conductors in the presence of a multilayer substrate. Expression (25) admits analytical solutions easily recovered using Expressions (20) and (21) as input to a symbolic integration tool, such as MATLAB. The results are shown in Expression (35') and are trivial to compute.

2. Impedance Extraction of Single-Filament Conductor Loops

In this section, mutual impedance computation between a source magnetic dipole and the current loop formed by a pair of conductors with common length L is discussed. The mutual inductance, per unit length, can be computed as:

$$M = \frac{\psi}{I \cdot L}, \qquad (26)$$

where $\psi$ denotes the flux due to the source magnetic field integrated over the area subtended by the affected conductor loop. The mutual inductance is a complex number. The real part of M captures the reactive coupling due to the magnetic interaction between the source and the affected loop, while the imaginary part captures the resistive loss due to the eddy currents generated inside the substrate as well as in the victim loop. Accordingly, the mutual impedance $Z=j\omega M$ also has real and imaginary parts. In Expression (26), the flux linkage $\psi$ can be computed by:

$$\Psi = \oint_l A(r) \cdot dl, \qquad (27)$$

where the contour integral is performed over the co-ordinates of the victim conductor loop, while A(r) can be computed by Expression (25) using the analytical expressions shown in Section II.F. For the 2D problem considered, the affected loop consists of the forward and return conductors, each of length L, where L is much larger than the separation between them.

Each of these conductors is located at a point in two-dimensional space, its length oriented along the third dimension $\hat{y}$ (same as the direction of the vector potential A(r)). Hence the integral in Expression (27) reduces to:

$$\psi = A(r_1) \cdot L + A(r_2) \cdot (-L) \qquad (28)$$

A(r) can be computed by Expression (25) using the analytical expressions shown in Section II.F. Substituting Expression (28) in Expression (26) gives:

$$M = \frac{(A(r_1) - A(r_2))L}{I \cdot L} = \frac{A(r_1) - A(r_2)}{I} \qquad (29)$$

Note that the current (I) in Expression (25) and Expression (29) cancels out and, as expected, the resultant expression for inductance is a function of geometrical parameters only.

When computing the self-inductance of a loop, the affected conductor loop coincides with the source loop. In such cases, when the center-to-center distance between two conductors is zero, the preferred way to compute mutual impedance is to use the geometric mean distance (GMD). The GMD of a rectangular cross-section conductor with respect to itself is given by:

$$d = e^{\log(w+t) - 3/2} \qquad (30),$$

where w and t are the width and thickness, respectively, of the conductor filament. Hence, the loop self-inductance is given by:

$$M_{self} = \frac{A(s_1) - A(s_2)}{I}, \qquad (31)$$
$$A(s_1) = A_{cont}^{hor}(d_{s_1}, 0) + A_{cont}^{ver}(0, d_{s_1}),$$
$$A(s_2) = A_{cont}^{hor}(a_x + d_{s_2}, a_z) + A_{cont}^{ver}(a_x, a_z + d_{s_2})$$

where $d_{s_1}$ and $d_{s_2}$ are the GMDs corresponding to the filaments $s_1$ and $s_2$, respectively. The loop self-impedance is then given by:

$$Z_{self} = R_{self} + j\omega M_{self} \qquad (32)$$

where $$R_{self} = \rho L \left( \frac{1}{w_{s_1} t_{s_1}} + \frac{1}{w_{s_2} t_{s_2}} \right)$$

is the static resistance of the forward and return paths of the loop. As mentioned before, another dynamic contribution to the resistance due to magnetic effects is embedded within $j\omega M_{self}$ as the imaginary part of $M_{self}$.

Figure 10A:
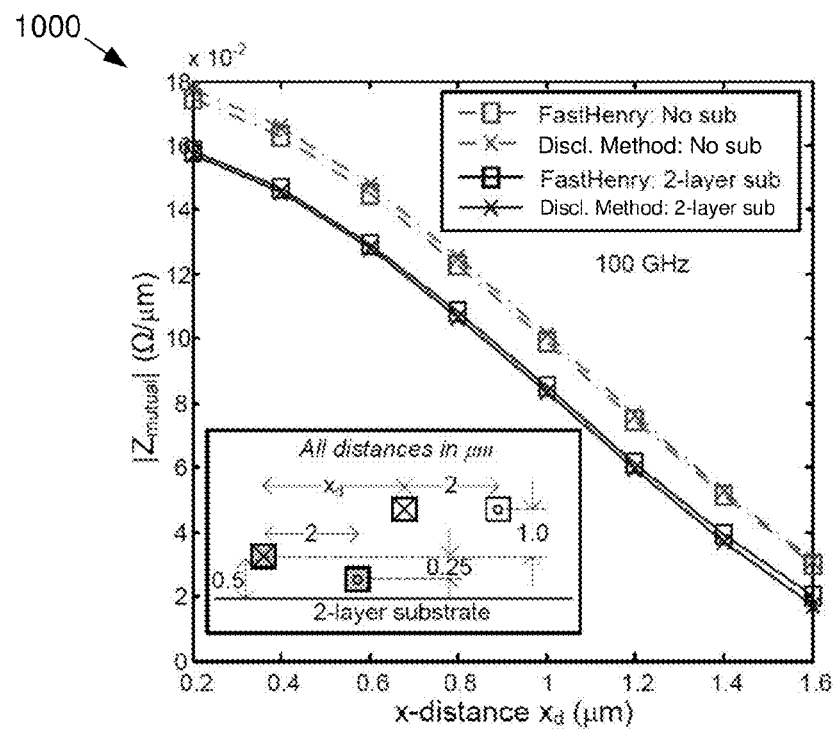
FIG. 10A is a graph showing the mutual impedance (Z=jωM) between a source current loop (shaded) and a victim current loop (unshaded) in the presence of a 2-layer substrate, for different separations $x_d$ at the highest frequency of concern (100 GHz).
Figure 10B:
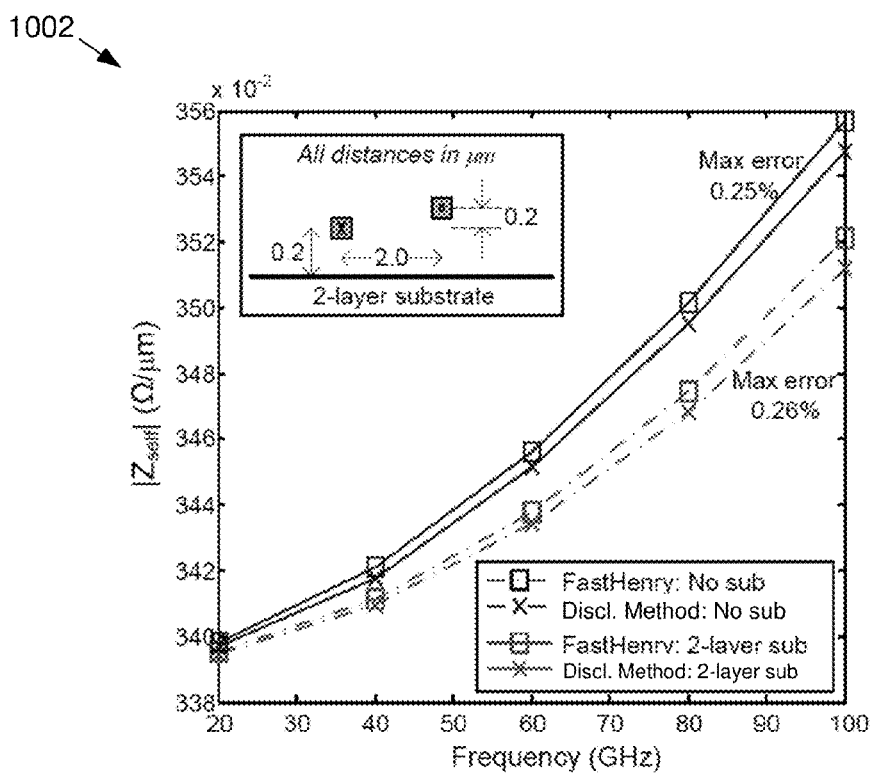
FIG. 10B is a graph of self impedance $|Z_{self}|$ of a conductor loop in the presence of a 2-layer substrate as a function of frequency. The two-layer substrate configuration is the same as in FIG. 6A, where the number of complex images K=5, and for each conductor the width w=0.1 µm and thickness t=0.1 µm (one filament per conductor).

FIG. 10A is graph 1000 showing the mutual impedance, per unit length, for different separations between two single-filament conductor loops, computed using the above analytical expressions compared to the field solver. FIG. 10B is a graph 1002 showing that the self-impedance of a loop formed by a pair of conductors (with and without the substrate) calculated using the above analytical expressions has less than 1% error as compared to the field solver. The conductor cross-sections are chosen so as to allow a single-filament representation of each conductor. The results are accurate both in free-space as well as in the presence of the substrate.

3. Impedance Extraction of Realistic Multiple-Filament Conductor Bundle

Figure 11:
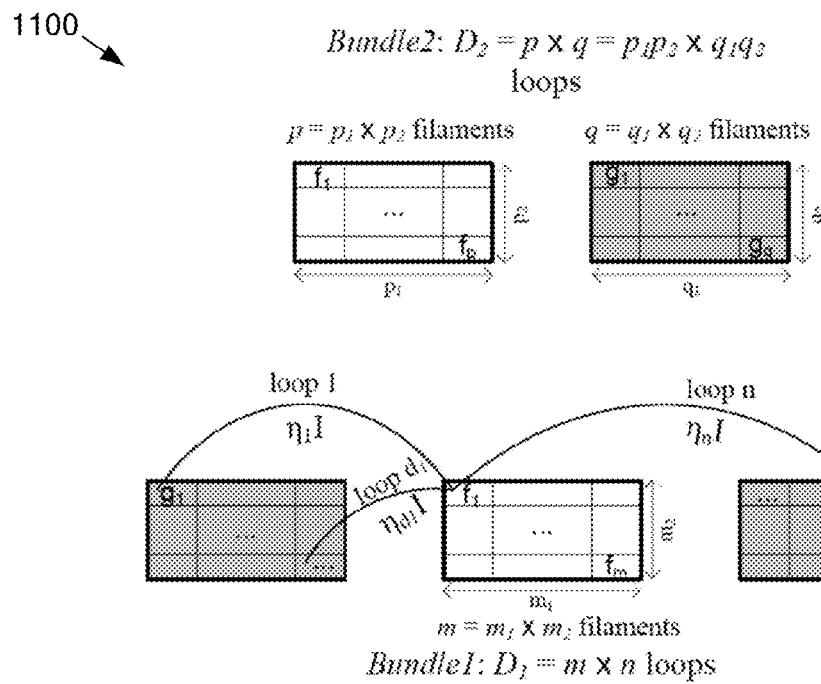
FIG. 11 is a schematic block diagram showing wide and thick conductors discretized into multiple filaments. Bundle1 has m filaments in its signal wire and n filaments in its two return wires, forming $D_1$ loops. Bundle1 carries total current I. Each $d_1^{th}$ loop in Bundle1 carries a fraction $\eta_{d_1}$ of I. Bundle2 has p filaments in the signal and q filaments in the return wire, forming $D_2$ loops.

In case of wide/thick conductors, with cross-sectional dimensions comparable to the skin depth at the frequency of concern, the computation is performed in one embodiment by dividing each conductor into two or more filaments. Moreover, a signal wire may sometimes have more than one nearby ground wire acting as its return path. In certain embodiments, the collection of a signal wire (decomposed into multiple filaments, $f_1$ to $f_m$) and its neighboring ground wires (decomposed into filaments $g_1$ to $g_n$) that constitute its return path is considered. In these embodiments, every filament in the signal wire forms a loop with every filament in the corresponding return wires, resulting in m×n single-filament conductor loops. Such a collection of loops formed by the multiple filaments in a signal wire and its return paths is called a bundle. An example is shown in schematic block diagram 1100 of FIG. 11, where Bundle1 has $D_1$=m×n loops and Bundle2 has $D_2$=p×q loops.

In particular embodiments, the first step in computing the impedance of such bundles composed of multiple loops is to compute the loop impedance matrix. The diagonal elements of the matrix, $Z_{self}$, are the loop self-impedances computed using Expression (32). The off-diagonal terms $j\omega M_{ij}$ are the mutual impedances between loops computed using Expression (29). Each ith loop in a bundle carries a fraction $\eta_i$ of the total current I flowing through it. Once the loop-impedance matrix has been computed using the expressions derived in the previous sub-section, the coefficients $\eta_i$ can be found by solving Kirchhoff's equations:

$$\begin{bmatrix} Z_{self_1} & j\omega M_{12} & \cdots \\ j\omega M_{21} & Z_{self_2} & \cdots \\ \vdots & \vdots & \ddots \end{bmatrix} \begin{bmatrix} \eta_1 I \\ \eta_2 I \\ \vdots \end{bmatrix} = \begin{bmatrix} 1 \\ 1 \\ \vdots \end{bmatrix} \quad (33)$$

$$\sum_i \eta_i = 1, \eta_i \in \mathbb{C}$$

Figure 12:
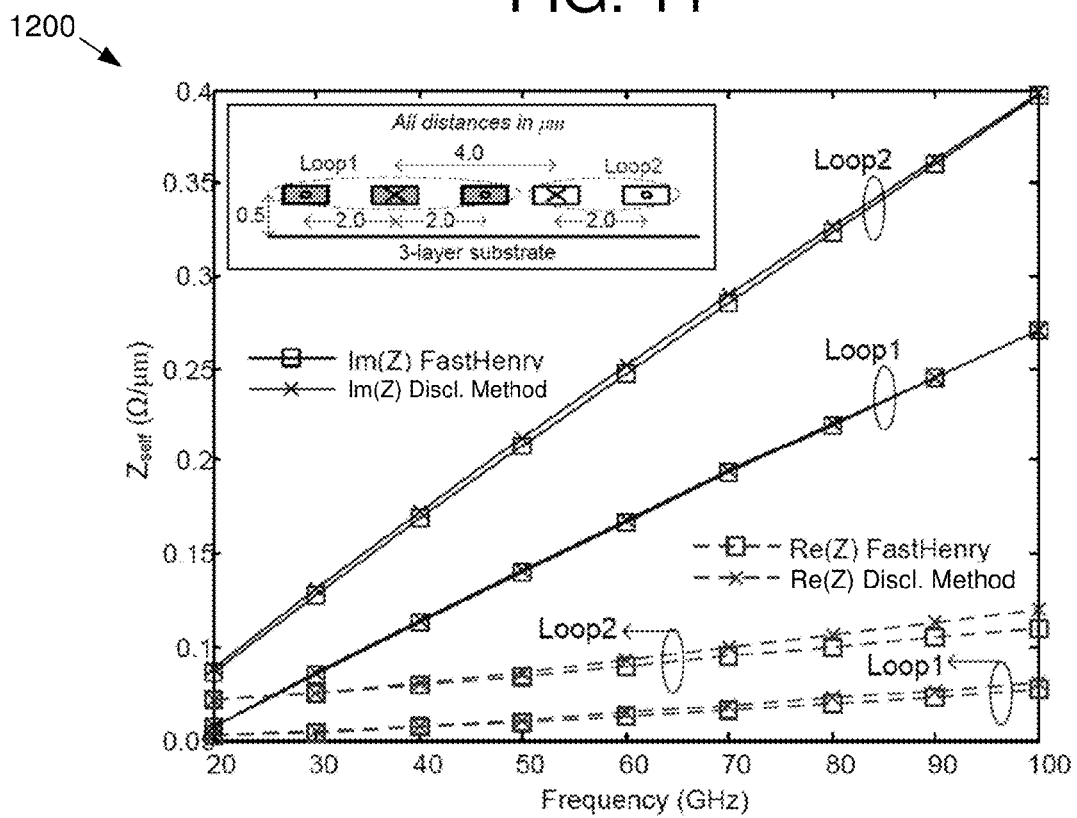
FIG. 12 is a graph showing self impedances of two multiple conductor bundles in the presence of a 3-layer substrate computed using the exemplary 2D embodiment disclosed herein. Each conductor has a width w=1 µm and thickness t=0.5 µm (5×3 filaments per conductor), number of complex images K=5. The maximum error shown in $|Z_{self}|$ is 1%.

From the system of equations (33), the loop self impedance of a bundle can be found as $Z=I^{-1}$. For the two bundles shown in FIG. 11, the index $d_1$ ($d_2$) runs over the $D_1$ ($D_2$) constituent loops of Bundle1 (Bundle2). The loop self impedance of Bundle1 (or Bundle2) and the fraction of current $\theta_{d_1}$ (or $\theta_{d_2}$) carried by each of its constituent loops can be found using (33). FIG. 12 shows the frequency-dependent loop self-impedance computation for a pair of bundles composed of 1 μm wide conductors, in the presence of a 3-layer substrate. Each conductor is discretized into multiple filaments to correctly capture skin and proximity effects. The mutual impedance of Bundle1 with respect to the dth loop in Bundle2 can be expressed as:

$$M_{d_2}^{Bundle1} = \sum_{d_1=1}^{D_1} \eta_{d_1} M_{d_1}^{d_2}, \quad (34)$$

where $M_{d_1}^{d_2}$ is the mutual impedance between the $d_1^{th}$ loop in Bundle1 and the $d_2^{th}$ loop in Bundle2. The computation of mutual impedances between these single-filament loops has been explained in the previous sub-section. Finally, the net mutual impedance between Bundle1 and Bundle2 can be computed as:

$$M_{Bundle2}^{Bundle1} = \sum_{d_2=1}^{D_2} \eta_{d_2} M_{d_2}^{Bundle1} \quad (35)$$

E. Results

In this section, the accuracy and computational efficiency of the exemplary 2D impedance extraction embodiment is demonstrated. The exemplary embodiment is based on the 2D magneto-quasi-static assumption, in the presence of a multi-layer conductive substrate. It should be noted that the impedance computation involves integrals of a highly oscillatory Green's function, shown in Expression (13), and a further integral over the source dipole, shown in Expression (25). Both integrals may have significant cancellations depending on the interconnect geometry. Hence, it is not feasible to directly estimate the error in the impedance computation from the error in the Green's function. To verify the accuracy of the exemplary 2D impedance extraction embodiment, Section II.E.1 shows comparisons with the 3D electromagnetic field solver FastHenry, as well as the commercial full-wave field solver HFSS, for a wide range of realistic VLSI interconnect configurations. The computational efficiency of the exemplary 2D impedance extraction embodiment, due to the analytical expressions for the substrate Green's function, is shown in Section II.E.2 through comparisons with 3D (FastHenry) and with 2D PEEC based computations. Note that in all the examples shown, each conductor is discretized into the same number of filaments with the exemplary embodiment as that with FastHenry or PEEC, in order to capture skin and proximity effects.

1. Accuracy

FIG. 12 is a graph 1200 showing the frequency-dependent loop self-impedance for two bundles composed of 1 μm wide conductors, in the presence of a 3-layer substrate. The self impedance computation shows maximum 1% error in the magnitude of impedance in comparison with FastHenry, across the entire frequency range.

Figure 13:
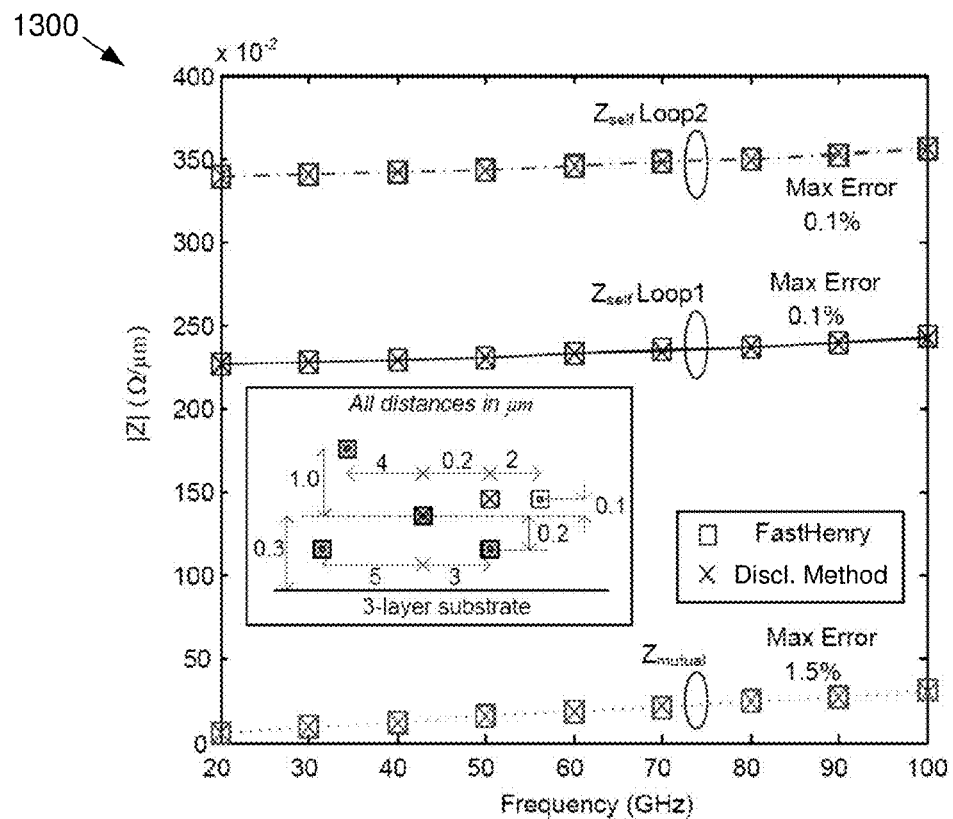
FIG. 13 is a graph showing self and mutual impedances of two multiple conductor bundles in the presence of a 3-layer substrate computed using the exemplary 2D impedance extraction embodiment disclosed herein. Each conductor has a width w of 0.1 µm and a thickness of t=0.1 µm (one filament per conductor). The number of complex images is K=5.

When wide and thick conductors are discretized into multiple filaments to capture skin and proximity effects, the relative positions of the filaments that comprise the conductor loops will not conform to the discrete positions occupied by conductors on individual metal layers. As an example of such a scenario, graph 1300 in FIG. 13 shows that the exemplary 2D impedance extraction embodiment gives small error (<1: 5%) for an arbitrary configuration of multiple conductors, in the presence of a 3-layer substrate.

Graphs 1400, 1402, and 1404 of FIGS. 14A-C plot the self and mutual impedances of two conductor loops on different metal layers. The vertical separation of the conductors above the substrate is chosen such that the effect of the substrate on self and mutual impedance is significant. The dashed lines in graph 1406 of FIG. 14D show that the substrate causes as much as 20% variation in the impedance. It is found that the exemplary embodiment captures the effect of the substrate on interconnect impedance with high accuracy (solid lines show errors less than 2%) in the entire frequency range of interest for digital circuits (20-100 GHz).

Next, the network Z-parameter (Z11) for a conductor loop is compared to that obtained from the commercial fullwave field solver, HFSS. The Z11 parameter is computed by using a Spice distributed transmission line model, wherein the resistance and inductance per unit length are computed by using the disclosed method, and the capacitance is obtained from FastCap. The geometry simulated with HFSS is shown in the inset of graph 1500 of FIG. 15. The conductor loop is closed by including additional metal strips at the far and near ends of the loop. The effect of the additional metal is insignificant since the length of the conductors is much larger than the transverse separation between them. A small gap (0.2 μm) is left at the near end where a lumped port excites the conductor loop. The results of the comparison are shown in graph 1500 of FIG. 15. The maximum error observed in the magnitude of the Z11 parameters for this configuration is less than 2%. Note that for frequencies beyond 60 GHz the results from HFSS become unstable for the configuration shown.

In subsequent paragraphs, the accuracy of the exemplary 2D impedance extraction embodiment disclosed herein is compared with FastHenry for several typical interconnect geometries.

Figure 16:
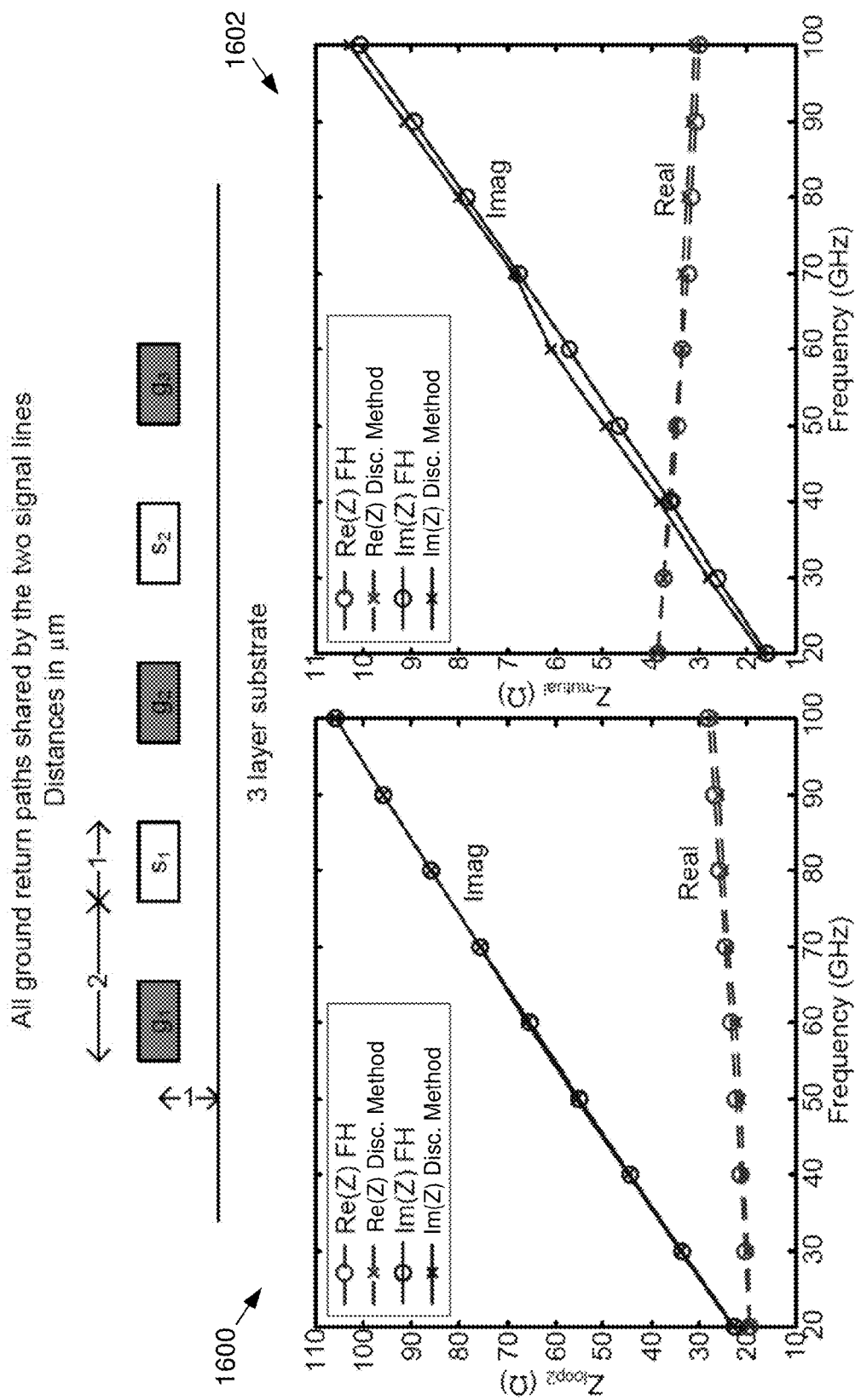
FIG. 16 includes two graphs showing self and mutual impedances of two current loops for the exemplary 2D impedance extraction embodiment disclosed herein where the three ground return paths ($g_1$, $g_2$, $g_3$) are shared by the two signal lines ($s_1$, $s_2$). The common length of the wires is 400 µm, and the conductor thickness is 0.5 µm.
Figure 17:
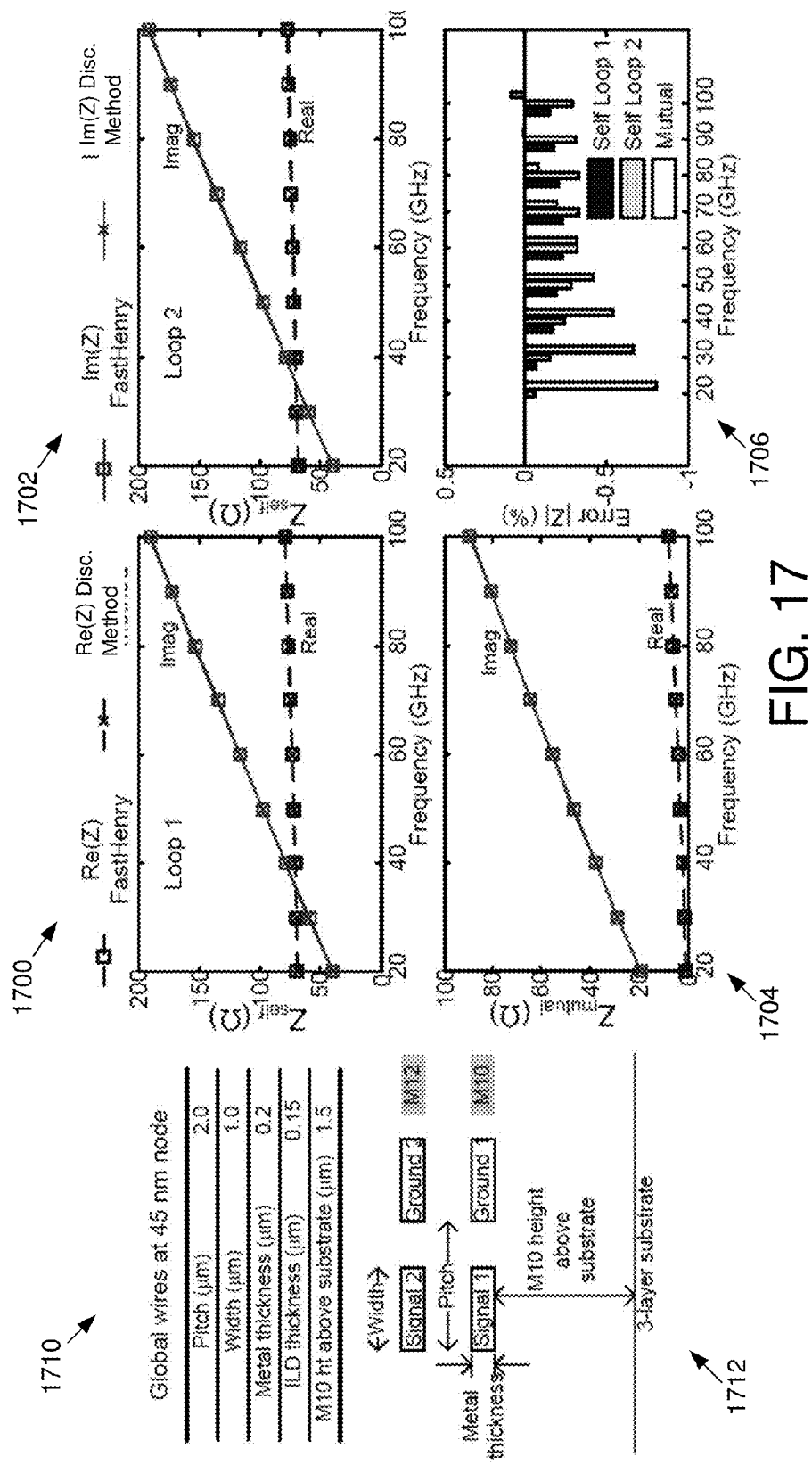
FIG. 17 includes graphs showing self and mutual impedances for a realistic interconnect geometry at 45 nm node (shown alongside) for the exemplary 2D method disclosed herein and the percent error values with respect to FastHenry. The common length of the wires is 400 µm.
Figure 19:
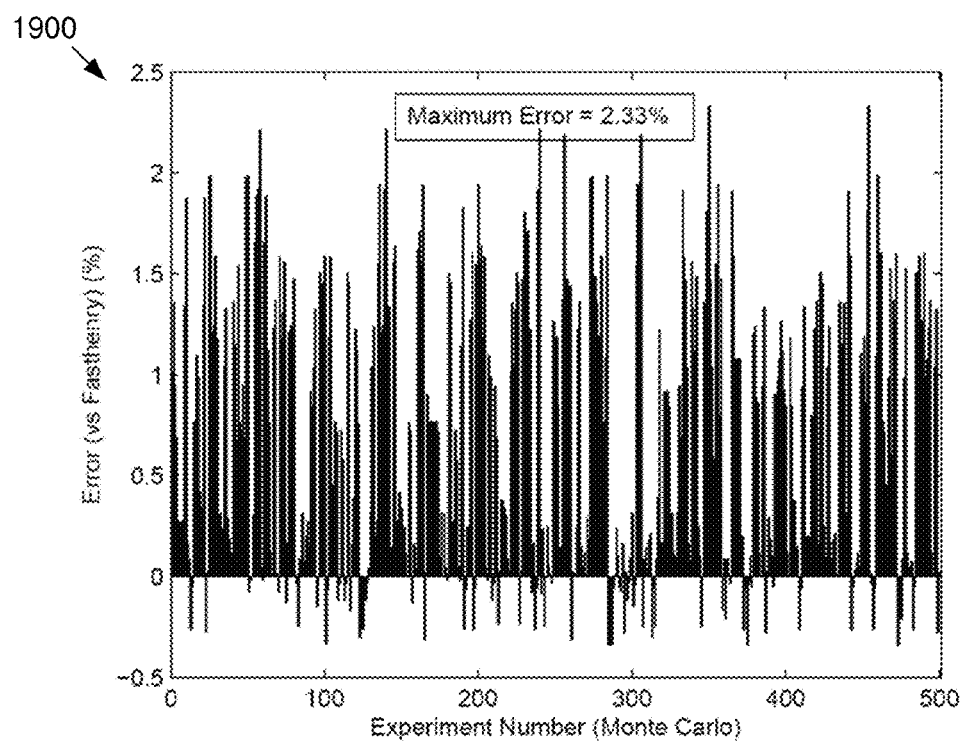
FIG. 19 is a graph showing the error in the loop self impedance computation with respect to FastHenry during Monte Carlo simulation of several randomly generated conductor configurations according to the following parameters: Frequency 20-100 GHz, pitch 2-8 µm, wire width 1-2 µm, height above substrate 1.5-2.2 µm (corresponding to metal layers M10 through M12). Interconnect geometry parameters correspond to global wires at the 45 nm node.

Graphs 1600, 1602 shown in FIG. 16 show the impedance for a common configuration where both the signal lines ($s_1$, $s_2$) share the three ground return paths ($g_1$, $g_2$, $g_3$) to form two bundles: $s_1$-$g_1g_2g_3$ and $s_2$-$g_1g_2g_3$. Results for the self and mutual impedance show good agreement with FastHenry. Graphs 1700, 1702, 1704, and 1706 of FIG. 17 show the impedance computation results for a realistic global interconnect geometry at the 45 nm node. The interconnect geometry parameters 1710 and the configuration 1712 are shown alongside the graphs 1700, 1702, 1704, and 1706. In this case, the error with respect to FastHenry is less than 1%. Schematic block diagram 1800 of FIG. 18 shows a long Manhattan wire with orthogonal segments running on adjacent metal layers M10 and M11, along with a regular grid of ground wires. Each segment of the signal line is routed in close proximity to a segment of the ground grid on the corresponding metal layer—a common design for timing-critical global interconnects to control inductive effects. The mutually perpendicular segments of the Manhattan wire are decoupled (for example, segments AB and BC). On the other hand, the mutual impedance between far apart parallel segments AB-CD (or between BC-DE) can be neglected because of the large separation (100 μm-200 μm) between them. Hence, the exemplary embodiment can be separately applied to each linear segment (AB, BC, CD and DE, respectively) to obtain the impedance of the Manhattan wire. As shown in graph 1802 of FIG. 18, results using the exemplary embodiment have a maximum error about 2% over the entire frequency range of interest. Monte-Carlo simulations for a large number of randomly generated interconnect geometries can be run for global wires at the 45 nm node, over a wide range of frequencies. The results are shown in graph 1900 of FIG. 19. The maximum error observed is 2.33%.

2. Computational Efficiency

The exemplary 2D impedance extraction embodiment disclosed herein is based on analytical expressions for the substrate Green's function, wherein the substrate boundary conditions are implicit. The only filaments that need to be considered in the solution are those corresponding to the interconnects themselves. On the other hand, both FastHenry and the 2D PEEC method used for comparison, are based on the free space Green's function. Hence, the substrate layers are included as explicit conductors. At relevant high frequencies, these layers are typically discretized into a large number of filaments, as shown below, resulting in a large linear system of equations.

Figure 20:
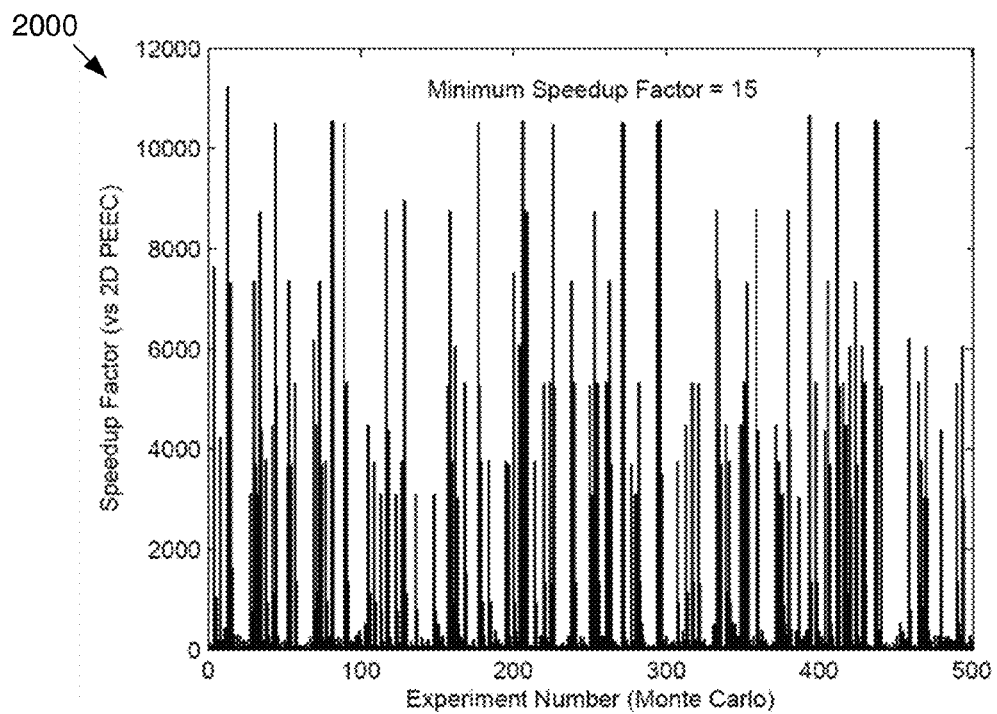
FIG. 20 is a graph showing the speedup in runtime with respect to a 2D PEEC-based self loop impedance computation during Monte Carlo simulation of several randomly generated conductor configurations according to the following parameters: Frequency 20-100 GHz, pitch 2-8 µm, wire width 1-2 µm, height above substrate 1.5-2.2 µm (corresponding to metal layers M10 through M12). Interconnect geometry parameters correspond to global wires at the 45 nm node.

Table III compares the computation time with FastHenry to that with the exemplary 2D impedance extraction embodiment disclosed herein. The number of filaments for representing the substrate in FastHenry is chosen by progressively increasing the number of segments in the substrate layers until the result stabilizes. It is observed that the accuracy levels achieved with the exemplary 2D impedance extraction embodiment are accompanied by almost two orders of magnitude reduction in computation time. Since FastHenry is applicable to general 3D interconnect geometries, the exemplary 2D impedance extraction embodiment is compared with a 2D PEEC-based computation in Table IV. The number of filaments in the substrate for 2D PEEC are selected to ensure that the filament cross-sections are less than the skin depth at the specified frequency. As the thickness of the low-resistivity top layer of the substrate increases to a few μm, the computation cost with 2D PEEC increases substantially due to the larger number of filaments required. On the other hand, with the exemplary 2D impedance extraction embodiment, a change in the substrate layer thickness only demands evaluation of a new set of substrate images while the impedance computation cost remains constant. Hence, Table IV shows orders of magnitude improvement in computational efficiency by using the exemplary 2D impedance extraction embodiment disclosed herein. Finally, the speedup observed from Monte-Carlo simulations on a large number of randomly generated interconnect geometries are shown in FIG. 20. The minimum speedup observed in the self impedance computation with respect to 2D PEEC-based computation, is 15.

TABLE III

COMPUTATION COST FOR SELF AND MUTUAL IMPEDANCE EXTRACTION FOR DIFFERENT INTERCONNECT AND SUBSTRATE CONFIGURATIONS IN COMPARISON WITH FASTHENRY, AT 100 GHZ. $F_{cond}$: FILAMENTS PER CONDUCTORS; $F_{tot}$: TOTAL FILAMENTS INCLUDING SUBSTRATE; $T_i$: TIME TO COMPUTE IMAGES (ONE TIME COST); $T_Z$: TIME TO COMPUTE IMPEDANCE

|  |  | $F_{cond}$ | $F_{tot}$ | $T_i$ (s) | $T_Z$ (s) |
|---|---|---|---|---|---|
| FIG. 10A | FH | 1 | 21640 | — | 517.7 |
|  | Discl. 2D Method | 1 | 4 | 91.34 | <1 sec |
| FIG. 12 | FH | 15 | 21700 | — | 631.4 |
|  | Discl. 2D Method | 15 | 75 | 90.6 | 12.39 |
| FIG. 13 | FH | 1 | 23360 | — | 99.67 |
|  | Discl. 2D Method | 1 | 6 | 90.6 | <1 sec |
| FIG. 14 | FH | 15 | 22400 | — | 108.89 |
|  | Discl. 2D Method | 15 | 60 | 90.6 | 3.62 |

TABLE IV

COMPUTATION COST FOR SELF IMPEDANCE EXTRACTION OF A 2-CONDUCTOR LOOP OVER A 500 μm WIDE 3-LAYER SUBSTRATE, EACH CONDUCTOR 1 μM WIDE AND 0.5 μm THICK, AT 100 GHZ. SUBSTRATE PROFILE IS SHOWN IN FIG. 6(B). $z_1$: THICKNESS OF TOP SUBSTRATE LAYER; $F_{cond}$: NUMBER OF FILAMENTS PER CONDUCTOR; $F_{sub}$: NUMBER OF FILAMENTS FOR SUBSTRATE; $T_i$: TIME TO COMPUTE IMAGES (ONE TIME COST); $T_Z$: TIME TO COMPUTE IMPEDANCE.

| $z_1$ |  | $F_{cond}$ | $F_{sub}$ | $T_i$ (s) | $T_Z$ (s) |
|---|---|---|---|---|---|
| 1 μm | 2D PEEC | 15 | 1323 | — | 110.2 |
|  | Discl. 2D Method | 15 | 0 | 90.6 | <1 sec |
| 2 μm | 2D PEEC | 15 | 1952 | — | 313.7 |
|  | Discl. 2D Method | 15 | 0 | 107.1 | <1 sec |
| 3 μm | 2D PEEC | 15 | 2581 | — | 821.5 |
|  | Discl. 2D Method | 15 | 0 | 166.9 | <1 sec |
| 4 μm | 2D PEEC | 15 | 3829 | — | 2816 |
|  | Discl. 2D Method | 15 | 0 | 75.2 | <1 sec |
| 5 μm | 2D PEEC | 15 | 4468 | — | 4522 |
|  | Discl. 2D Method | 15 | 0 | 146.8 | <1 sec |

Embodiments of general methodologies for self and mutual impedance extraction of VLSI interconnects, in two dimensions, in the presence of a multi-layered conductive substrate have been described. Many of the exemplary approaches are based on the Green's function for a magnetic dipole, which naturally leads to current loops giving the correct physical representation for on-chip conductor currents. The relevant regimes of distances and frequencies are also covered. The resulting exemplary expressions (e.g., (20), (21), (25), (29), (31), (32), (33), (35)), as well as those shown in Section II.F below, are simple analytical expressions depending on parameters that can be easily extracted from real exponential least-square fits to known formulae. The suitability of the described embodiments for massive extraction problems is self-evident. For example, embodiments of the disclosed technology are significantly more accurate than the approximate complex image method, more efficient than the RFFM, and much simpler to realize than the DCIM. In addition, a continuous dipole distribution can be employed to compute the magnetic interaction between conductor loops at very small distances from the source current distribution. This approximation allows one to directly apply the dipole Green's function to self and mutual impedance computation. The results show that this methodology can be applied to accurately compute the impedance of realistic wire configurations in cases where the substrate is found to significantly impact interconnect impedance. The saving in computation time as compared to the electromagnetic field solver, FastHenry, is almost two orders of magnitude.

F. Analytical Expressions for $A_{cont}^{hor}$ and $A_{cont}^{ver}$

In the following equations, the expressions for the freespace terms, $A_{src}^{hor}$ and $A_{src}^{ver}$, and the substrate contribution terms, $A_{sub}^{hor}$ and $A_{sub}^{ver}$, of the magnetic vector potential are shown separately for readability. The following expressions represent the results of computing Expression (25) analytically, and are labeled collectively Expression (25').

$$A_{cont}^{hor}(x,z) = \int_0^{a_x} G_{0,dipole}^{hor}(x,z,x',z')\frac{\mu}{2\pi} I\, dx' = A_{src}^{hor}(x,z) - A_{sub}^{hor}(x,z)$$

$$A_{cont}^{ver}(x,z) = \int_0^{a_z} G_{0,dipole}^{ver}(x,z,x',z')\frac{\mu}{2\pi} I\, dz' = A_{src}^{ver}(x,z) + A_{sub}^{ver}(x,z)$$

$$A_{src}^{hor}(x,z) = -\frac{\mu I}{2\pi} \times \begin{cases} -\frac{1}{2}\ln\left|\frac{(x+a_x)^2+z^2}{x^2+z^2}\right| & \ldots \text{if } \tan\theta = 0, \\ \frac{1}{1+\tan^2\theta}\ln\left|\frac{x-a_x}{x}\right| & \ldots \text{if } z = x\tan\theta, \\ f(A,B,C,x,a_x) & \ldots \text{otherwise,} \end{cases}$$

where,
$A = 1 + \tan^2\theta;\ B = -2x - 2z\tan\theta;$
$C = x^2 + z^2.$ $$A_{sub}^{hor}(x,z) = -\frac{\mu I}{2\pi} \times$$

$$\begin{cases} \sum_i \frac{-\beta_i}{2}\ln\left|\frac{(x-a_x)^2+\left(z+2h+\frac{\alpha_i}{\gamma_1}\right)^2}{x^2+\left(z+2h+\frac{\alpha_i}{\gamma_1}\right)^2}\right| & \ldots \text{if } \tan\theta = 0, \\ \sum_i \beta_i f(A,B,C,x,a_x) & \ldots \text{otherwise,} \end{cases}$$

where,
$A = 1 + \tan^2\theta;\ B = -2x + 2\left(z+2h+\frac{\alpha_i}{\gamma_1}\right)\tan\theta;$
$C = x^2 + \left(z+2h+\frac{\alpha_i}{\gamma_1}\right)^2.$ $$A_{src}^{ver}(x,z) = -\frac{\mu I}{2\pi} \times \begin{cases} -\frac{1}{2}\ln\left|\frac{x^2+(z-a_z)^2}{x^2+z^2}\right| & \ldots \text{if } \tan\phi = 0, \\ \frac{1}{1+\tan^2\phi}\ln\left|\frac{z-a_z}{z'}\right| & \ldots \text{if } x = z\tan\phi, \\ f(A,B,C,z,a_z) & \ldots \text{otherwise,} \end{cases}$$

where,
$A = 1 + \tan^2\phi;\ B = -2z - 2z\tan\phi;$
$C = x^2 + z^2.$ $$A_{sub}^{ver}(x,z) =$$

$$-\frac{\mu I}{2\pi} \times \begin{cases} \sum_i \frac{\beta_i}{2}\ln\left|\frac{x^2+\left(z+a_z+2h+\frac{\alpha_i}{\gamma_1}\right)^2}{x^2+\left(z+2h+\frac{\alpha_i}{\gamma_1}\right)^2}\right| & \ldots \text{if } \tan\phi = 0, \\ \sum_i \beta_i f(A,B,C,z,a_z) & \ldots \text{otherwise,} \end{cases}$$

where,
$A = 1 + \tan^2\phi;\ B = -2x\tan\phi + 2\left(z+2h+\frac{\alpha_i}{\gamma_1}\right);$
$C = x^2 + \left(z+2h+\frac{\alpha_i}{\gamma_1}\right)^2.$ where, in the previous three equations, $$f(A,B,C,x,a_x) =$$

$$\frac{2x+B/A}{\sqrt{-B^2+4AC}}\left[\tan^{-1}\left(\frac{B+2Aa_x}{\sqrt{-B^2+4AC}}\right) - \tan^{-1}\left(\frac{B}{\sqrt{-B^2+4AC}}\right)\right] - \frac{1}{2A}\ln\left|\frac{Aa_x^2+Ba_x+C}{C}\right|,\text{ and}$$

$$f(A,B,C,z,a_z) =$$

$$\frac{2z+B/A}{\sqrt{-B^2+4AC}}\left[\tan^{-1}\left(\frac{B+2Aa_z}{\sqrt{-B^2+4AC}}\right) - \tan^{-1}\left(\frac{B}{\sqrt{-B^2+4AC}}\right)\right] - \frac{1}{2A}\ln\left|\frac{Aa_z^2+Ba_z+C}{C}\right|$$

III. Three-Dimensional Treatment of VLSI Interconnect Impedance Extraction in the Presence of Multi-Layer Conductive Substrate

A. Introduction

Figure 21:
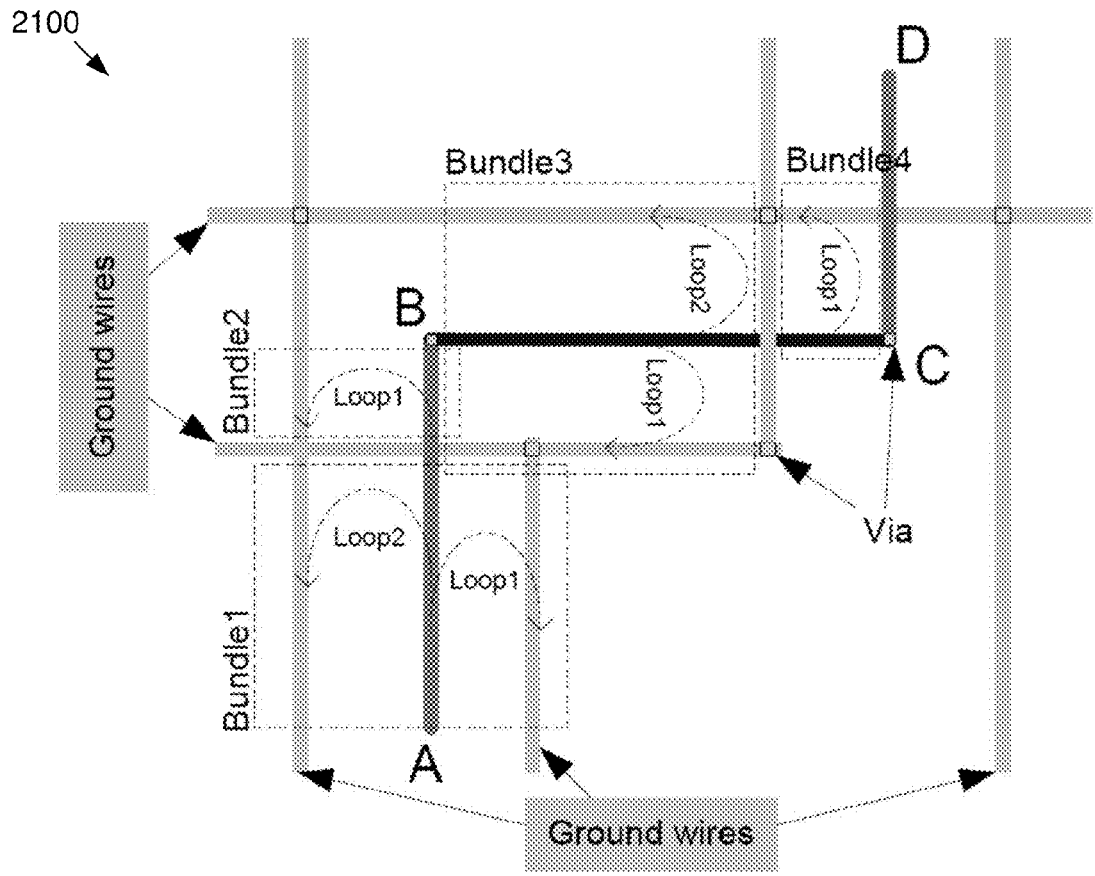
FIG. 21 is a schematic block diagram showing a general Manhattan circuit layout with linear segments AB-BC-CD flanked by ground wires which offer return paths. Segmentation of the interconnect configuration into bundles, along with the constituent loops, is shown with dashed boxes and curves, respectively.

For high-frequency VLSI interconnect impedance extraction, current loops formed by a signal wire and its parallel return paths which carry currents in the opposite direction can be considered. The collection of a signal wire and its return paths can be partitioned along their length to form bundles, as shown in the schematic diagram 2100 of FIG. 21. In each bundle, all wires have the same length and the cross-section of each conductor as well as the separation between conductors is uniform along its length. Each bundle comprises multiple current loops, each formed by a pair of parallel opposing current filaments (explained in further detail in Section III.C.2.) The current loop is the smallest unit referred to in the description of interconnect loop impedance below. An example of such a current loop is shown in schematic diagram 2200 of FIG. 22.

The physical equivalent of a current loop describing on-chip interconnect currents, as shown above, is a magnetic dipole. These magnetic dipoles constitute the sources of magnetic fields that interact with other conductors, and are described below. For on-chip conductors in VLSI circuits, the relevant length scales for conductor bundles (few hundred micrometers) are much smaller than the wavelength at the highest frequency of concern (few millimeters at 100 GHz). Hence, a quasi-static description of the magnetic field is appropriate (this quasi-static assumption is validated below with the comparisons of the results from the exemplary method described herein with results from full-wave field solvers).

1. Vector Potential Green's Function in Integral Form

Figure 22:
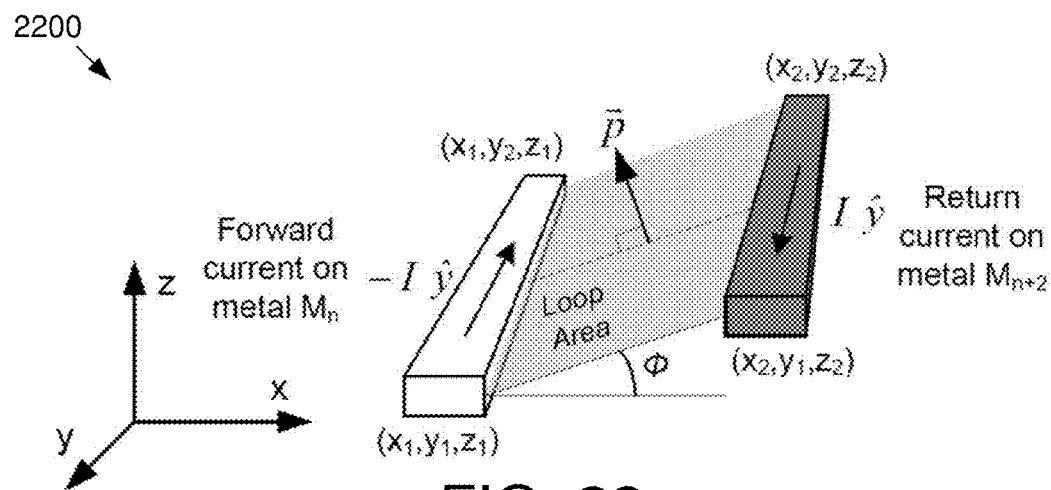
FIG. 22 is a schematic block diagram showing a current loop formed by two parallel current filaments carrying current in opposite directions, constituting a planar magnetic dipole source.

Because on-chip conductors are confined to discrete metal layers in the x-y plane, the current loops they form are planar, although they may have arbitrary orientations, as shown by diagram 2200 in FIG. 22. For a planar loop carrying current I, its magnetic dipole moment $\vec{p}$ is perpendicular to the plane containing the loop, and its magnitude is given by:

$$|\vec{p}| = I \times \text{LoopArea} \tag{36}$$

Rotational symmetry allows one to choose the y-axis along the length of the wires forming the current loop. In this case, $\vec{p}$ is orthogonal to the y-axis:

$$\vec{p} = p_x \hat{x} + p_z \hat{z} = |\vec{p}|[\sin(\phi)\hat{x} + \cos(\phi)\hat{z}] \tag{37}$$

In order to efficiently compute the self and mutual impedance of interconnects, a Green's function approach can be employed to first compute the magnetic vector potential fields due to an infinitesimal magnetic dipole source at a point in three-dimensional space. Finite interconnect loops can then be treated as a superposition of point sources over the area occupied by the loops, as shown later in Section III.A.2. In the presence of a multi-layered conductive substrate, analytical expressions for this Green's function that allow for the impedance computation to be performed efficiently can be used. This approach is referred to herein as the exemplary 3D impedance extraction embodiment.

Consider two opposite currents $I\hat{y}$ and $-I\hat{y}$ in the x-y plane, centered at (x', y', z') and separated by an infinitesimal distance a, lying above a multi-layered substrate, as shown in FIG. 2. The two currents constitute a $\hat{z}$-directed magnetic dipole. In one exemplary embodiment of the disclosed technology, the following analytical expression for the $\hat{y}$-directed vector potential Green's function $G_{R_0}^{dipolezy}$ can be used:

$$G_{R_0}^{dipolezy}(x, y, z, x', y', z') = \tag{38}$$

$$\frac{-\mu}{2(2\pi)^2} \times \int_{-\infty}^{\infty} \int_{-\infty}^{\infty} \left( \begin{array}{c} \left(\frac{k_x}{k_z} e^{jk_x(x-x')+jk_y(y-y')}\right) \times \\ \left(e^{jk_z|z-z'|} + \frac{k_z - k_z'}{k_z + k_z'} e^{jk_z(z+z')}\right) \end{array} \right) dk_x dk_y$$

The above expression for the dipole Green's function has the expected form—the first term corresponding to a magnetic dipole source in free space (no substrate), and the second arising due to the presence of the substrate. Moreover, the substrate term (referred to herein as the secondary field) is nearly identical in form to the free space term (primary field), except for the coefficient:

$$\chi_1 = \frac{k_z - k_z'}{k_z + k_z'} \tag{39}$$

Evidently, $\chi_1$ is the only factor in Expression (38) dependent on substrate properties, while all other parameters are merely geometry dependent. For an N-layer substrate, the general coefficient $\chi_N$ can be derived in similar fashion, yielding the following expression:

$$G_{R_0}^{dipolezy}(x, y, z, x', y', z') = \tag{40}$$

$$\frac{-\mu}{2(2\pi)^2} \times \int_{-\infty}^{\infty} \int_{-\infty}^{\infty} \left( \begin{array}{c} \left(\frac{k_x}{k_z} e^{jk_x(x-x')+jk_y(y-y')}\right) \times \\ \left(e^{jk_z|z-z'|} + \chi_N e^{jk_z(z+z')}\right) \end{array} \right) dk_x dk_y$$

2. Discrete Complex Images for the Substrate

The effect of multi-layered substrate media on the vector potential field due to various sources such as 3D electric and magnetic dipoles, 2D line currents, and 2D magnetic dipoles, have been studied in the published literature. In all cases, net field at $\vec{r}$ due to a source located at $\vec{r}'$ (where both $\vec{r}, \vec{r}'$ are located in the region above the substrate) is obtained in similar form as shown above: the sum of a primary field due to the source in free space and a secondary field due to the substrate. It is noteworthy that although the particular expressions for the two terms may vary depending on the source, the coefficient $\chi_N$ always appears unaltered.

Although analytical expressions are well-known for the primary field component of the substrate Green's function (38), analytical computation of the entire integral expression is hampered by the coefficient $\chi_N$. Hence, to obtain closed-form expressions for the substrate Green's function, the exemplary 3D impedance extraction embodiment disclosed herein uses a suitable approximation to $\chi_N$ that transforms the secondary field expression into an anaytically integrable form. In one desirable implementation, the preferred approximation for $\chi_N$, called the "discrete complex images method" ("DCIM"), uses a linear sum of complex exponentials. It was shown above that the following modified approximation for the DCIM extends several desirable properties to the general approach, including lower fitting time and smoothness across a wide range of frequencies:

$$\chi_N = \sum_{k=1}^{N} \beta_k e^{-\alpha_k (\lambda/\gamma_1)} \tag{41}$$

where $\lambda = \sqrt{k_x^2 + k_y^2} \in (0, \infty)$, $\gamma_1^2 = j\omega\mu(\sigma_1 + j\omega\epsilon_1)$, and $\alpha_k, \beta_k$ are found by non-linear least squares fitting. A detailed discussion of the fitting procedure is provided in Section III.C.1 below. It was shown above that under the above approximation the effect of the substrate is captured as the effect of M images of the source dipole. The z-displacement of the kth image dipole is dependent on $\alpha_k$, and its dipole moment is a fraction $\beta_k$ of the source dipole moment ($\Sigma_k \beta_k = 1$), as shown in schematic block diagram 2300.

Using the above approximation, and noting that the exponentials in Expression (41) readily combine with those in the integrand of Expression (38), the net field in the presence of the substrate takes the general form:

$$F_{net}(\vec{r}, \vec{r}') = F_{primary}(\vec{r}, \vec{r}') + \chi_N F_{secondary}(\vec{r}, \vec{r}') = F_{primary}(\vec{r}, \vec{r}') + \Sigma_{k=1}^{M} \beta_k \tilde{F}_{primary}(\vec{r}, \vec{r}', \alpha_k) \tag{42}$$

where $\tilde{F}_{primary}$ is the field due to an image of the source dipole and has a functional form similar to the term $F_{primary}$. Hence, if analytical expressions are found for $F_{primary}$, or the Green's function in free space, they can be applied to compute the secondary field as well. The following section will use this approach to derive analytical expressions for the substrate Green's function corresponding to a magnetic dipole.

3. Analytical Green's Function for Magnetic Dipole in Free Space

Now, for a single current $I\hat{y}$ in free space (no substrate), the vector potential Green's function in the quasi-static domain is well-known:

$$G_{free} = \frac{\mu}{4\pi} \frac{1}{|\vec{r} - \vec{r}'|} \tag{43}$$

$$|\vec{r} - \vec{r}'| = \sqrt{(x-x')^2 + (y-y')^2 + (z-z')^2}$$

Noting that the vector potential Green's function for a magnetic dipole consisting of two opposite currents is given by the gradient between the Green's functions corresponding to the two isolated currents, Expression (43) can be used to get an alternative representation of the dipole Green's function in free space:

$$G_{free}^{dipolezy} = \tag{44}$$

$$\hat{y} \lim_{a \to 0} \frac{\mu}{4\pi} \times \frac{1}{a} \left( \frac{1}{\sqrt{\left(x - x' + \frac{a}{2}\right)^2 + (y-y')^2 + (z-z')^2}} - \frac{1}{\sqrt{\left(x - x' - \frac{a}{2}\right)^2 + (y-y')^2 + (z-z')^2}} \right) =$$

$$\frac{\mu}{4\pi} \frac{(x-x')}{[(x-x')^2 + (y-y')^2 + (z-z')^2]^{3/2}}$$

Indeed the same expression can be derived by using the definition of magnetic dipole moment:

$$\vec{p} = \int \vec{r} \times \vec{J}(\vec{r}') d^3r' = \hat{z} Ia \tag{45}$$

and the Green's function for a magnetic dipole:

$$G_{free}^{dipolezy} = \frac{\mu}{4\pi} \frac{\left(\vec{r} - \vec{r}'\right) \times \vec{p}}{|\vec{r} - \vec{r}'|^3 |\vec{p}|} = \hat{y} \frac{\mu}{4\pi} \frac{(x-x')}{[(x-x')^2 + (y-y')^2 + (z-z')^2]^{3/2}} \tag{46}$$

Recognizing this simple form of the vector potential Green's function for on-chip interconnect currents in free space, and noting that in the presence of a substrate the Green's function can be approximated by a linear combination of the free space Green's function for the dipole source and that for each of its complex images, the multiple dimension integrals of the kind shown in Expression (38) can be avoided. Convenient analytical expressions can thus be obtained for the substrate Green's function, as shown in the next section.

B. An Exemplary Impedance Extraction Method for General VLSI Interconnects in Presence of Multi-Layer Substrate 1. Analytical Magnetic Vector Potential Green's Function for a 3D Magnetic Dipole in Unbounded Space The quasi-static magnetic vector potential at $\vec{r}$ due to a magnetic dipole located at a point $\vec{r}'$ in unbounded/free space (no substrate), is given by:

$$\vec{A}(\vec{r}, \vec{r}') = \frac{\mu}{4\pi} \times \frac{\vec{p} \times (\vec{r} - \vec{r}')}{|\vec{r} - \vec{r}'|^3} \tag{47}$$

The vector potential Green's function ($G^{free}(\vec{r}, \vec{r}')$) gives the vector potential ($A(\vec{r}, \vec{r}')$) in unbounded space due to a unitary magnetic dipole ($|\vec{p}|=1$) located at ($\vec{r}'$). In this discussion, the notation ($G_{uv}(\vec{r}, \vec{r}')$) is used to describe the v-directed component of the vector potential Green's function due to a u-directed magnetic dipole, where u, v refer to one of the three co-ordinate axes. The relevant expressions for $G_{uv}$ are described below. Mathematically, G is a second-rank tensor $\vec{\vec{G}}$.

Due to the choice of co-ordinates, the y-component of $\vec{p}$ is zero in Expression (37). Hence, $$G_{yx} = G_{yy} = G_{yz} = 0. \tag{48}$$

Moreover, the cross product in Expression (47) implies that $G_{uv}$ is perpendicular to the source dipole moment $\vec{p}$. In other words, the Green's function due to an x-directed dipole source will have no component in the x-direction. Hence:

$$G_{xx} = G_{yy} = G_{zz} = 0. \tag{49}$$

Since the interaction between wires that lie in the x-y plane (vertical conductors or vias are ignored) is considered, the components $G_{uv}$ along $\hat{z}$ are not relevant. Hence, $G_{xz}$ (the only non-zero component along $\hat{z}$) is ignored.

From the observations above, the vector potential Green's function (in the x-y plane) at a point $\vec{r}'=(x, y, z)$, due to a unit magnetic dipole source located at a point $r'=(x', y', z')$ in unbounded space, can be written as:

$$\vec{\vec{G}} = \begin{pmatrix} 0 & G_{xy} & G_{xz} \\ 0 & 0 & 0 \\ G_{zx} & G_{zy} & 0 \end{pmatrix} \tag{50}$$

Substituting (37) in (47), and with $|\vec{p}|=1$, we get:

$$G_{xy}(x, y, z, x', y', z') = \hat{y} \frac{\mu}{4\pi} \times \frac{\sin(\phi)(z-z')}{[(x-x')^2 + (y-y')^2 + (z-z')^2]^{3/2}} \tag{51}$$

$$G_{zy}(x, y, z, x', y', z') = \hat{y} \frac{\mu}{4\pi} \times \frac{\cos(\phi)(x-x')}{[(x-x')^2 + (y-y')^2 + (z-z')^2]^{3/2}} \tag{52}$$

$$G_{zx}(x, y, z, x', y', z') = -\hat{x} \frac{\mu}{4\pi} \times \frac{\cos(\phi)(y-y')}{[(x-x')^2 + (y-y')^2 + (z-z')^2]^{3/2}} \tag{53}$$

Figure 23:
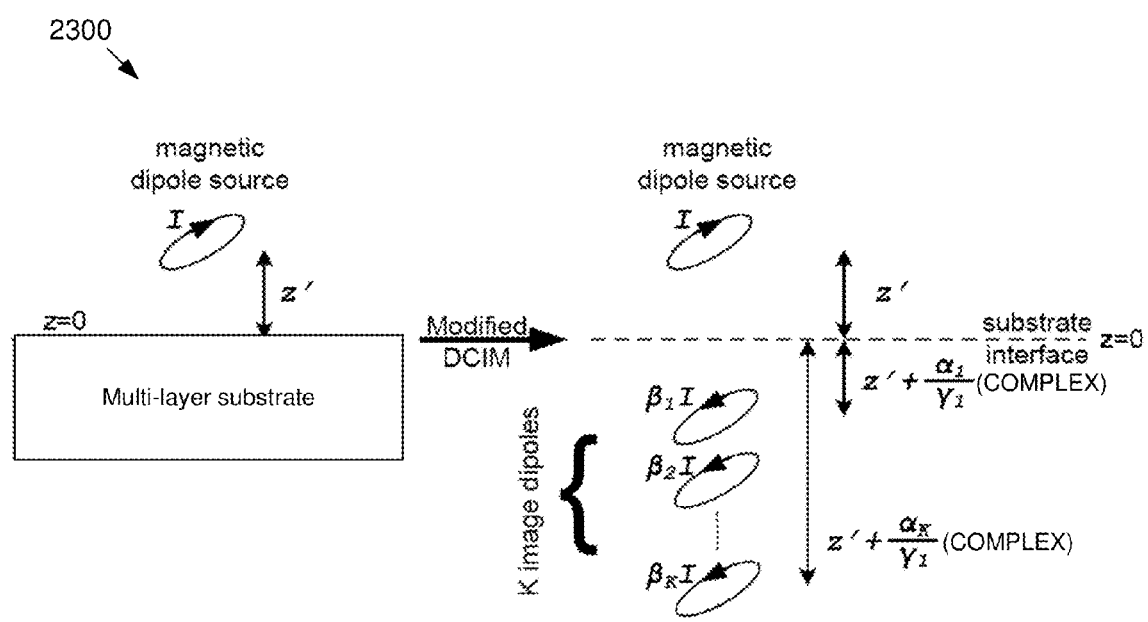
FIG. 23 shows a representation of the substrate as a series of images of the source magnetic dipole using the modified discrete complex images method.

2. Analytical Magnetic Vector Potential Green's Function for a 3D Magnetic Dipole in the Presence of a Multi-Layer Substrate For the vector potential Green's function in the presence of a multi-layer substrate, the modified discrete complex images method explained in Section III.A.2 above can be used to represent the substrate as a series of images of the source dipole (see diagram 2300 of FIG. 23). This representation is obtained from the approximation in Expression (41), where $\alpha_k$ determines the spatial location of each image dipole and $\beta_k$ is its fractional dipole moment $\Sigma_k \beta_k = 1$. The procedure for computing accurate values for the parameters ($\alpha_k$, $\beta_k$) is explained in the following section. Using this approximation, the problem of one dipole source over the substrate is transformed into that of K+1 dipoles (source and its K images) in unbounded unbounded space. The vector potential due to the combined effect of K+1 dipoles is given by the superposition of the vector potential due to each dipole considered in isolation. Hence, the vector potential Green's function at (x,y,z) due to a source dipole located at (x', y', z') in the presence of a multi-layer substrate is given by:

$$\vec{G}^{sub}(x, y, z, x', y', z') = \vec{G}^{free}(x, y, z, x', y', z') + \sum_{k=1}^{K} \vec{G}_k^{img}(x, y, z, x', y', z') \quad (54)$$

The expressions for $\vec{G}^{free}$ are given in Expressions (50)-(53). The expressions for $\vec{G}_k^{img}$, which correspond to the K images of the source dipole, are easily obtained by relocating the source from (x', y', z') to (x', y', −(z'+α_k/γ_1)), and multiplying by the linear coefficient β_k, thus:

$$\vec{G}_k^{img}(x,y,z,x',y',z') = \beta_k \vec{G}^{free}(x,y,z,x',y',-(z'+\alpha_k/\gamma_1)) \quad (55)$$

3. Impedance for a Finite Current Loop

The Green's function shown above gives the vector potential due to a unit magnitude dipole source located at a point $\vec{r}'=(x', y', z')$. To find the vector potential at any point $\vec{r}=(x, y, z)$ due to a finite size current loop, the finite loop can be considered as a superposition of infinitesimally small point sources in the area occupied by the current loop, each having a loop area dx'×dy' and carrying current I. The co-ordinates of the source (x', y', z') span the rectangular area shown in FIG. 22, whose extremities are defined by $(x_1, y_1, z_1)$, $(x_1, y_2, z_1)$, $(x_2, y_1, z_2)$ and $(x_2, y_2, z_2)$. Expressing the z-coordinate of the source in terms of x' and φ: $z_{x'}=z_1+(x'-x_1)\tan(\phi)$, the vector potential at $\vec{r}=(x, y, z)$ due to the finite current loop in unbounded space is given by:

$$\vec{A}^{free}(x, y, z) = \int_{y_1}^{y_2}\int_{x_1}^{x_2}\vec{G}^{free}(x, y, z, x', y', z_{x'})\cdot\hat{I}dx'dy' = \quad (56)$$
$$\hat{y}(A_{xy}(x, y, z) + A_{zy}(x, y, z)) + \hat{x}A_{zx}(x, y, z)$$

where $$A_{xy}(x, y, z) = \int_{y_1}^{y_2}\int_{x_1}^{x_2}G_{xy}(x, y, z, x', y', z_{x'})Idx'dy' \quad (57)$$

$$A_{zy}(x, y, z) = \int_{y_1}^{y_2}\int_{x_1}^{x_2}G_{zy}(x, y, z, x', y', z_{x'})Idx'dy' \quad (58)$$

$$A_{zx}(x, y, z) = \int_{y_1}^{y_2}\int_{x_1}^{x_2}G_{zx}(x, y, z, x', y', z_{x'})Idx'dy' \quad (59)$$

For impedance extraction of VLSI interconnects, two-conductor loops are considered as shown in the schematic block diagram 2200 of FIG. 22, where the currents are either along $\hat{x}$ or $\hat{y}$. Hence, for the particular choice of coordinates used here (no currents along $\hat{x}$), the term $A_{zx}$=0. As expected, the resultant magnetic vector potential is directed along $\hat{y}$, just as the currents in the source loop. The mutual inductance between the source current loop and a victim conductor is given by:

$$M = \frac{\psi}{I} = \frac{\oint_l \vec{A}(\vec{r})\cdot d\vec{l}}{I} \quad (60)$$

where $d\vec{l}$ is the length vector for an infinitesimal element of the victim conductor, $\vec{r}$ is the position vector for this element, and l is the contour along the conductor length.

For a victim conductor oriented along $\hat{y}$ extending from $(x_3, y_3, z_3)$ to $(x_3, y_4, z_3)$, Expression (60) becomes:

$$M^{free} = \frac{\int_{y_3}^{y_4}\vec{A}^{free}(x_3, y, z_3)\cdot d\hat{y}}{I} \quad (61)$$

Taking the components of $\vec{A}(\vec{r})$ along $\hat{y}$ in Expression (56):

$$M^{free} = \quad (62)$$
$$\frac{\int_{y_3}^{y_4}A_{xy}(x_3, y, z_3)dy}{I} + \frac{\int_{y_3}^{y_4}A_{zy}(x_3, y, z_3)dy}{I} = M_{xy}^{free} + M_{zy}^{free}$$

All the integrals shown above can be evaluated in closed form. The exact expressions for $M_{xy}^{free}$ and $M_{zy}^{free}$ are given in Expression (63):

$$M_{xy}^{free} = \quad (63)$$

$$\frac{\mu}{4\pi}\left[\left[\left[\begin{array}{c}M_{zy}^{free}\tan^2(\phi) + \\ \sin(\phi)\left(z_k\cos(\phi)\tanh^{-1}\left(\frac{t}{\sqrt{m^2+v^2}}\right)+\right. \\ \left. v\tan^{-1}\left(\frac{t}{z_k\cos(\phi)}\frac{v}{\sqrt{m^2+v^2}}\right)\right)\end{array}\right]_{y'=y_1}^{y'=y_2}\right]_{x'=x_1}^{x'=x_2}\right]_{y=y_3}^{y=y_4}$$

$$M_{zy}^{free} =$$

$$\frac{\mu}{4\pi}\left[\left[\left[\begin{array}{c}\frac{\cos^3(\phi)}{2}\left(v\ln\left|\frac{\sqrt{m^2+v^2}-v}{\sqrt{m^2+v^2}+v}\right|+\right. \\ \left. 2\sqrt{m^2+v^2}\right)- \\ \cos^2(\phi)\sin(\phi)\left(z_k\cos(\phi)\tanh^{-1}\left(\frac{t}{\sqrt{m^2+v^2}}\right)+\right. \\ \left. v\tan^{-1}\left(\frac{t}{z_k\cos(\phi)}\frac{v}{\sqrt{m^2+v^2}}\right)\right)\end{array}\right]_{y'=y_1}^{y'=y_2}\right]_{x'=x_1}^{x'=x_2}\right]_{y=y_3}^{y=y_4}$$

$$u = x_3 - x'; v = y - y'; z_k = (z_3 - z_1) - (x_3 - x_1)\tan(\phi)$$
$$t = u\sec(\phi) + z_k\sin(\phi); m^2 = t^2 + z_k^2\cos^2(\phi)$$

In the presence of a multi-layer substrate, $\vec{G}^{free}$ in Expression (56) must be replaced by $\vec{G}^{sub}$ from Expression (54) to get:

$$\vec{A}^{sub}(x,y,z) = \int_{y_1}^{y_2}\int_{x_1}^{x_2}\vec{G}^{sub}(x,y,z,x',y',z_{x'})Idx'dy' \quad (64)$$

Using Expressions (54) and (55), the following can be obtained:

$$\vec{A}^{sub}(x,y,z) \approx \int_{y_1}^{y_2}\int_{x_1}^{x_2}\vec{G}^{free}(x,y,z,x',y',z_{x'})Idx'dy' + \sum_{k=1}^{K}\beta_k\int_{y_1}^{y_2}\int_{x_1}^{x_2}\vec{G}^{free}(x,y,z,x',y',\zeta_{x'}^k)Idx'dy' \quad (65)$$

where $$\zeta_{x'}^k = -\left(z_1 + \frac{\alpha_k}{\gamma_1}\right) + (x' - x_1)\tan(\phi)$$

is the z-coordinate of the kth image dipole. Since the integrands have the same form as those in unbounded space, the subsequent integrals for the mutual impedance $M^{sub}$ in the presence of a multi-layer substrate can also be computed analytically:

$$M^{sub} = M_{xy}^{free} + M_{zy}^{free} + \sum_{k=1}^{K}\beta_k(M_{xy}^{img} + M_{zy}^{img}) \quad (66)$$

where $M_{xy}^{img}$ and $M_{zy}^{img}$ are given by the same expressions as those for $M_{xy}^{free}$ and $M_{zy}^{free}$, respectively, with the following modification to Expression (63):

$$z_k = (z_3 + z_1 + \alpha_k/\gamma_1) - (x_3 - x_1)\tan(\phi) \quad (67)$$

The equations above are sufficient to compute the impedance of Manhattan interconnects by orienting the coordinate axes such that relevant conductors are parallel to ŷ. Although the expressions shown are for mutual impedance only, the self impedance can be computed trivially using the same expressions while replacing the distance u=$x_3$-x' with the Geometric Mean Distance ("GMD") of the conductor with respect to itself.

Besides Manhattan interconnects which are always inclined at right angles, we are also interested in computing the impedance of inductors, which may comprise conductor segments inclined at arbitrary angle θ. In this case, we choose a co-ordinate system that aligns the source current loop to ŷ. For the victim conductor extending from ($x_3$, $y_3$, $z_3$) to ($x_4$, $y_4$, $z_3$), the x-coordinate can be expressed in terms of is y-coordinate as: $x_y = x_3 + (y - y_3)\tan(\theta)$. The mutual impedance is then given by the integrals shown in Expression (68). The integrals are also analytically performed (using well-known symbolic integration tools, such as MATLAB) but the expressions are omitted for the sake of brevity.

$$M^{free} = \int_{y_3}^{y_4}\frac{\mu}{4\pi}\cos(\phi)\left[\left[-\sinh^{-1}\left(\frac{y-y'}{\sqrt{(x_y-x')^2+(z_3-z_{x'})^2}}\right)\right]_{x'=x_1}^{x'=x_2}\right]_{y'=y_1}^{y'=y_2}dy + \quad (68)$$

$$\int_{y_3}^{y_4}\frac{\mu}{4\pi}\sin(\phi)\left[\left[\tan^{-1}\left(\frac{(x_y-x')(y-y')}{(z_3-z_{x'})\sqrt{(x_y-x')^2+(y-y')^2+(z_3-z_{x'})^2}}\right)\right]_{x'=x_1}^{x'=x_2}\right]_{y'=y_1}^{y'=y_2}dy$$

C. Exemplary Implementations of Impedance Extraction Methodology for VLSI Interconnects 1. Modified Discrete Complex Images for Multi-layer Substrates As explained before, the modified discrete complex images approximation, shown in Expression (30), allows one to represent the effect of the substrate as the combined effect of a series of images of the source magnetic dipole. The advantage of this representation is evident from the convenient analytical expressions for the mutual impedance between conductor currents that have been derived in Section III.B. In Section II above, it was shown that a non-linear least squares fitting approach to compute the complex image parameters, with $\alpha_k$, $\beta_k \in \mathbb{R}$ and starting values $\alpha_k = \beta_k = 1$, provides good accuracy for two-dimensional interconnect configurations (long and narrow loops). In the general case, when the current loops are wide, or when the transverse separation of a signal line from its return path is comparable to the conductor length, the effect of the substrate is more pronounced and higher accuracy is needed. In one exemplary embodiment, the Variable Projections ("VP") algorithm is employed, which has proven very useful in the solution of exponential fitting problems such as Expression (41). In the following paragraphs, the basic principle of the VP algorithm and one exemplary procedure for obtaining accurate complex image approximations for multi-layer substrates employing this algorithm are described.

a. Variable Projection Method for Non-Linear Least Squares Fitting

The search for an accurate set of images ($\alpha_k$, $\beta_k$) for a particular substrate configuration at frequency ω constitutes a non-linear least squares problem—we seek values for $\alpha_k$ and $\beta_k$ so as to minimize the sum of the squares of the discrepancies between the right and left hand sides of Expression (41), for all values of the Fourier transform variable $\lambda \in (0, \infty)$. Exact expressions for $\chi_N(R_1 \ldots R_n, \omega)$ (subsequently referred to simply as $\chi_N$, for conciseness) are known, in terms of λ. Hence, for a set of J observation points in ((0, ∞), we have a vector of observations $\{\lambda_j, \chi_j; \lambda_j \in (0, \infty)\}$ as the input data set to the following non-linear least squares problem:

$$\min_{\beta,\alpha}\sum_{j=1}^{J}\left[\sum_{k=1}^{K}(\beta_k\phi(\alpha_k,\lambda_j) - \chi_j)^2\right] \quad (69)$$

where $\alpha_k$ and $\beta_k$ are the parameters to be determined such that the discrepancy of the model $\beta_k\phi(\alpha_k, \lambda_j)$ with respect to the complex observations $\chi_j$ is minimized. Since this is a non-linear non-convex problem in general, it can have multiple solutions. Writing the J×K matrix $\{\phi(\alpha_k, \lambda_j)\}$ as Φ and the vector of observations $\{\chi_j\}$ as x, the vector residual in Expression (69) is concisely represented as:

$$r_2(\alpha) = \Phi(\alpha)\beta - x \quad (70)$$

Now, for each fixed value of α, Expression (70) is a linear least squares problem, whose solution can be explicitly written as:

$$\beta = \Phi^+(\alpha) x$$

where $\Phi^+(\alpha)$ is the pseudo-inverse of $\Phi$. Replacing this expression in (69), the original non-linear least squares problem becomes:

$$\min_\alpha \|[I - \Phi(\alpha)\Phi^+(\alpha)]x\|$$

Since $I - \Phi(\alpha)\Phi^+(\alpha) = P_{\Phi(\alpha)}^\dagger$ is the projector on the subspace orthogonal to the column space of $\Phi$, Expression (72) has been called the Variable Projection functional. An obvious gain by this procedure, as opposed to the initial problem, is a reduction in the number of variables, since the linear parameters ($\beta_k$) have been eliminated from the problem.

b. Complex Images Using Variable Projection Algorithm

In exemplary embodiments of the disclosed technology, the VP algorithm described above is applied to solve the nonlinear least squares problem to determine the complex images in terms of the best fit parameters $\alpha_k$ and $\beta_k$. The values $(\alpha_k, \beta_k) \in \mathbb{C}$ are allowed. To ensure a good fit, the VP algorithm naturally satisfies the requirements that $\text{Re}(\alpha_k) > 0$ (for convergence) and $\Sigma_k \beta_k = 1$ (which is a property of the input data, χ). Before the VP algorithm is applied to solve the non-linear least squares problem, two choices must be made: the number of exponentials (K) in the model (or the number of complex images), and the starting values for the non-linear parameters $\alpha_k$.

In general, increasing the number of images improves the accuracy of the approximation, while simultaneously increasing the cost of computation. Moreover, a large number of images leads to instabilities that make it difficult to find a good approximation. In certain implementations, choosing K between 5 and 10 is sufficient for an accurate approximation and reasonable computation cost. It has always been observed that K>10 can lead to diminishing returns.

Figure 24:
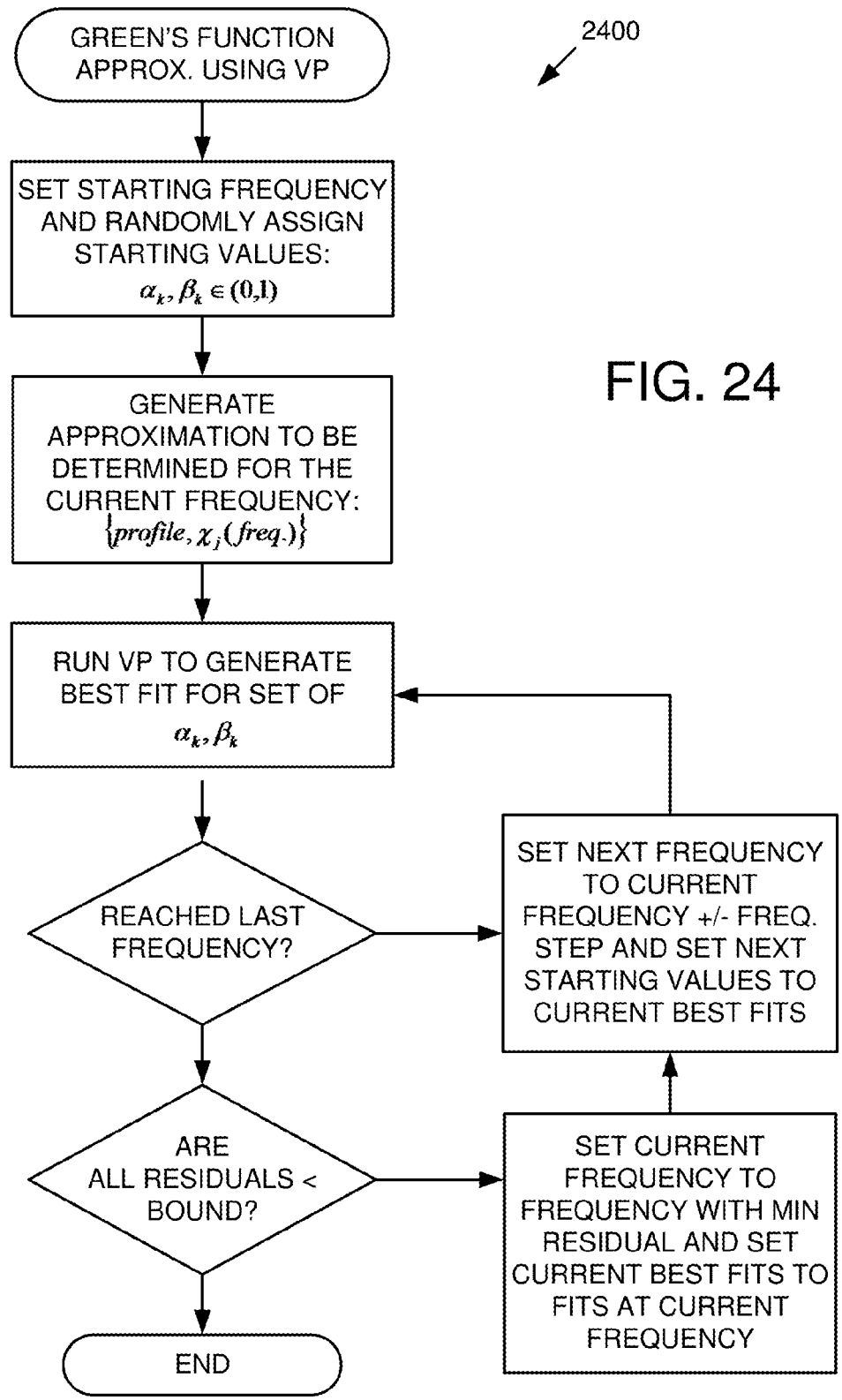
FIG. 24 is a flowchart showing an exemplary method for computing complex images approximation using a variable projections technique in accordance with the disclosed technology.

It has also been found that the choice of starting values for the parameters $\alpha_k$ has a much greater bearing on the accuracy of the approximation than the number of images. As explained in the previous sub-section, the Variable Projection method eliminates the need to guess initial values for the linear parameters $\beta_k$. In embodiments of the disclosed technology, complex image representations of the substrate over a wide range of frequencies (20-100 GHz) are of interest. Since it is known from the modified DCIM that the exponential parameters lie in the vicinity of the complex number 1/γ₁, one can start at one end of the frequency spectrum (say 100 GHz) using random values between 0 and 1 as starting guesses for $\alpha_k$. The best fit values for $\alpha_k$ obtained from the VP algorithm at this frequency are used as the starting guess for an adjacent frequency point. Since χ is a smooth function of ω, the best fit values for obtained from the VP algorithm at this frequency provide a good starting guess for the parameters at the next adjacent frequency, as long as the next frequency point is close enough to the first. This strategy of "continuation" in frequency is applied progressively over the entire frequency range of interest. If the desired level of accuracy is not achieved at all frequency points, this process may be repeated across the frequency range by choosing as starting values the parameters at the frequency point with minimum residual error. This procedure is summarized in flowchart 2400 illustrated in FIG. 24.

2. Impedance Computation for Realistic Dimension Interconnects

The expressions for self and mutual impedance shown in Section III.B are valid for conductors with uniform crosssectional current density. For wide/thick conductors, with cross-sectional dimensions comparable to the Cu skin depth at the frequency of concern, the current density is non-uniform due to skin and proximity effects. In such cases, the computation is performed by dividing each conductor into multiple filaments such that piece-wise constant current density can be assumed for each filament. The discretization into filaments of each conductor in a bundle is shown in schematic block diagram 2500 of FIG. 25. Each ith filament in the conductor carrying the forward current (unshaded) forms a loop with each jth filament in the conductor carrying the return current (shaded), resulting in L loops. The following linear system of equations is then solved to compute the net current I flowing through the twoconductor bundle:

$$\begin{bmatrix} R_1 + j\omega M_{11} & \cdots & j\omega M_{1L} \\ \vdots & \ddots & \vdots \\ j\omega M_{L1} & \cdots & R_L + j\omega M_{LL} \end{bmatrix} \begin{bmatrix} \eta_1 I \\ \vdots \\ \eta_L I \end{bmatrix} = \begin{bmatrix} 1 \\ \vdots \\ 1 \end{bmatrix}, \quad (73)$$

$$\sum_l \eta_l = 1, \eta_l \in \mathbb{C}$$

where $Z_{self_l}$ is the self impedance of the lth loop, $M_{lp}$ is the mutual impedance between the lth and pth loops, and $\eta_l$ is the fraction of the total current I flowing through the lth loop. Finally the impedance of the bundle is given by $Z = I^{-1}$.

Figure 25:
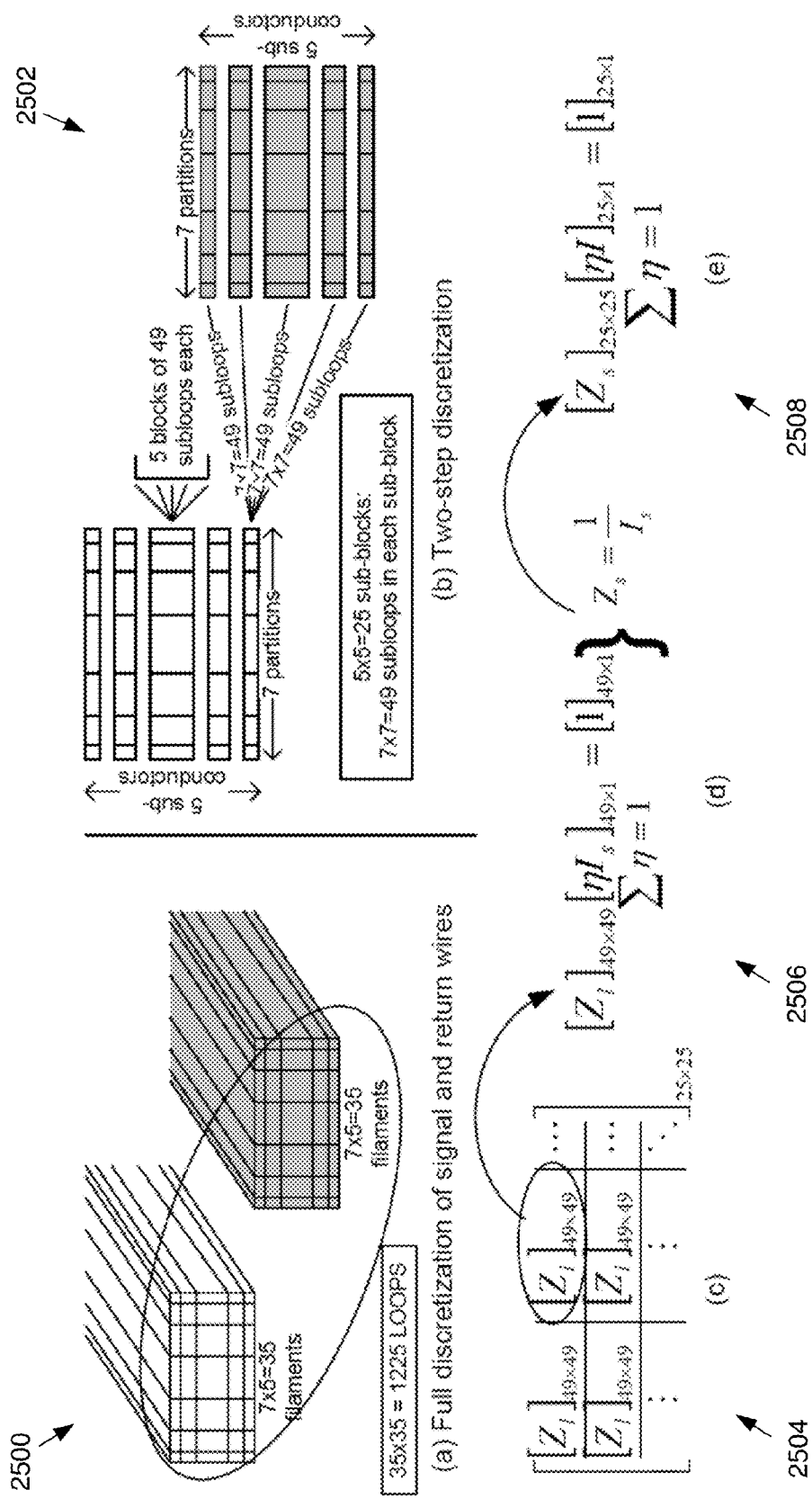
FIG. 25 includes several diagrams. Diagram 2500 shows two wide and thick conductors discretized into multiple filaments. The illustrated signal wire (unshaded) and return wire (shaded) carry opposite currents. Each filament in the signal wire forms a loop with each filament in the return wire. Diagram 2502 shows a two-step discretization of conductors, first along thickness and then along width. Diagram 2504 shows the full impedance matrix for the two-conductor bundle showing block matrices corresponding to the two-step discretization. Diagram 2506 shows the linear system of equations to be solved for each block matrix. Diagram 2508 shows the final linear system of equations to be solved to compute the net current I.

In practice, since the loop impedance matrix shown above is large and ill-conditioned, a hierarchical technique can be employed to solve the linear system. As shown in FIG. 25, instead of discretizing a wire into m×n filaments at once (diagram 2500), each wire is first subdivided into n (wide) filaments along its thickness (height). Each wide filament is then further discretized into m (thin) filaments (diagram 2502) along its width (in diagrams 2500 and 2502, m=7 and n=5). In accordance with this hierarchical (two-step) discretization of the conductors, the corresponding impedance matrix is organised into $S = n^2 \times n^2$ sub-blocks of $m^2 \times m^2$ elements (in the example shown the signal wire and return wire have the same discretization), as shown in diagram 2504.

The solution of the linear system proceeds as follows. For each sth sub-block of $m^2 \times m^2$ elements, the linear system shown in diagram 2506 is solved to obtain an equivalent impedance value $Z_s$. Each $Z_s$ can be interpreted as the net impedance of the corresponding bundle of $m^2$ loops. Finally, the linear system in diagram 2508 formed using $Z_s$ computed for each subblock is solved to obtain the net impedance of the bundle.

D. Results

In this section, the accuracy of the exemplary 3D impedance extraction method is demonstrated for a typical substrate configuration in comparison with the 3D electromagnetic field solver FastHenry, which is also based on the magneto-quasistatic ("MQS") assumption. Note that in all the comparisons shown, each conductor is discretized into the same number of filaments when using the exemplary method as with FastHenry, to capture non-uniform current densities under skin and proximity effects. Also shown are comparisons with the commercial fullwave field solver HFSS to ascertain the validity of the MQS assumption used in the exemplary embodiments disclosed herein.

Figure 26:
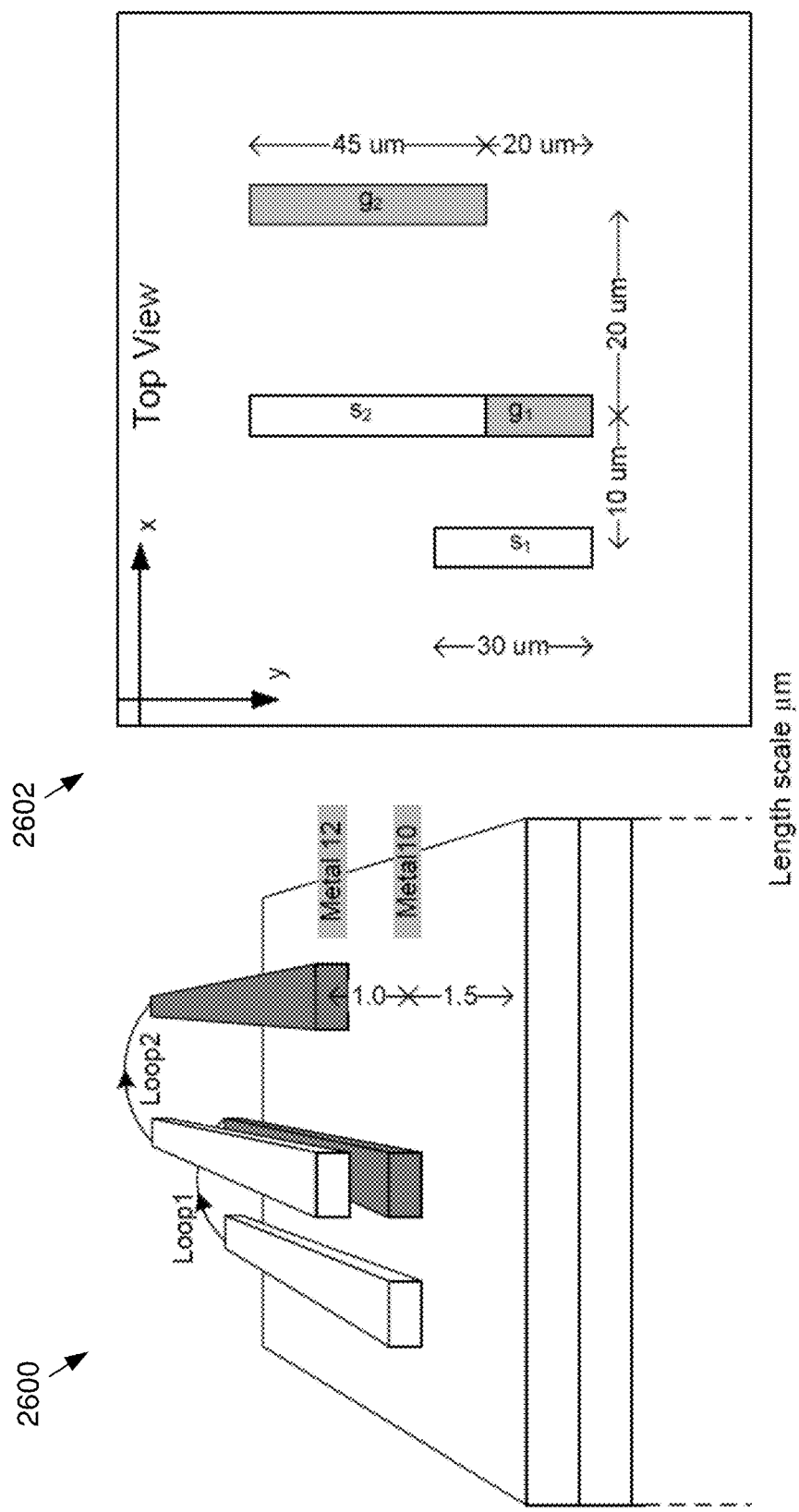
FIG. 26 is a schematic block diagram of interconnect geometry showing two current loops on different metal layers lying over a 3-layer substrate.
Figures 27A, 27B:
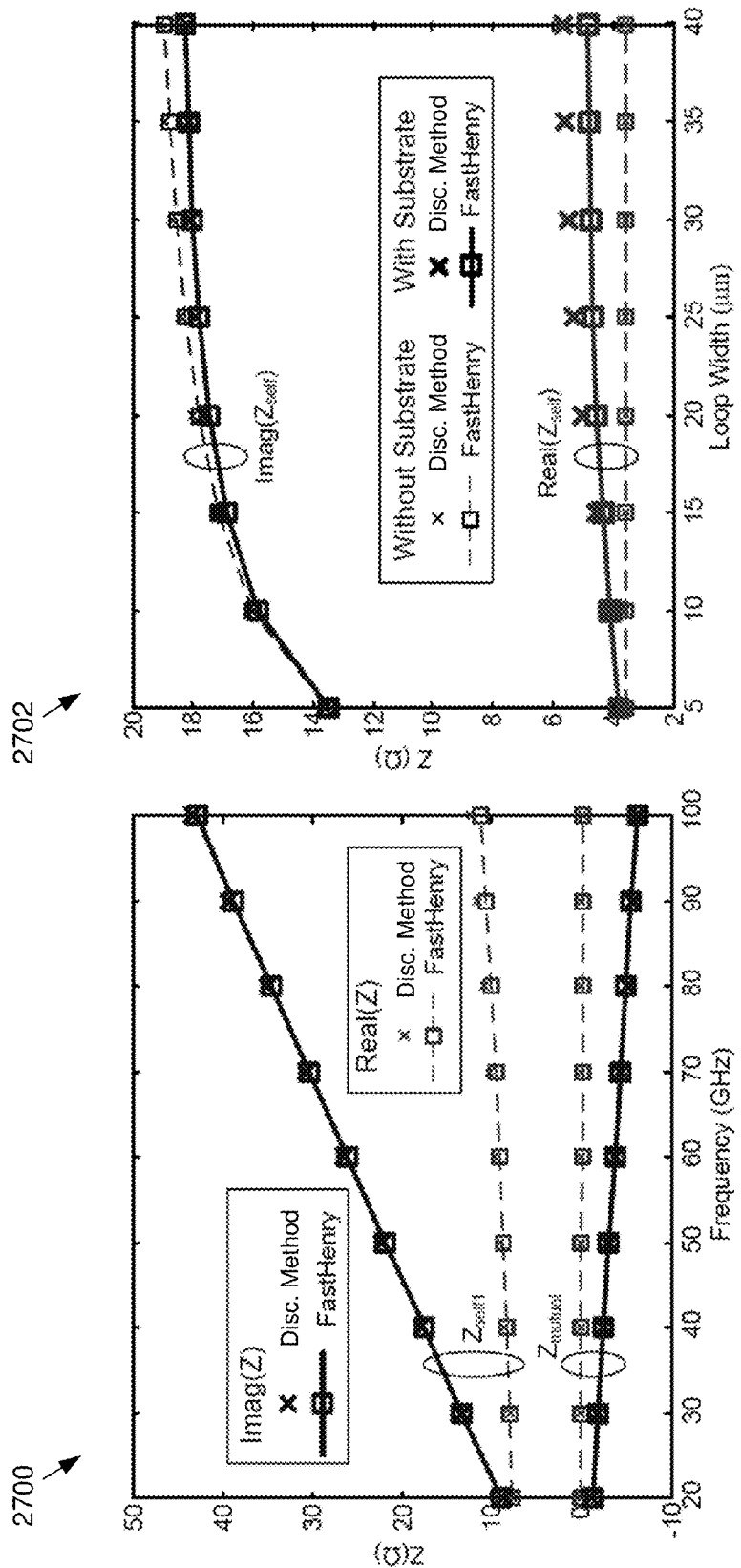
FIGS. 27A and 27B are graphs showing impedance results from the exemplary 3D impedance extraction method disclosed herein compared with FastHenry for the interconnect configuration shown in FIG. 26. In particular.

Schematic block diagrams 2600 and 2602 of FIG. 26 shows the interconnect geometry for two current loops on different metal layers. The interconnect parameters are based on ITRS recommendations for the 45 nm technology node. The impedance computation results using the exemplary three-dimensional quasi-static Green's function approach disclosed herein are shown in graphs 2700 and 2702 of FIGS. 27A and 27B, respectively. For a wide range of frequencies (graph 2700 of FIG. 27A) as well as for different values of separation between signal and return paths, or loop width (graph 2702 of FIG. 27B), the results show good agreement with FastHenry.

Figure 28:
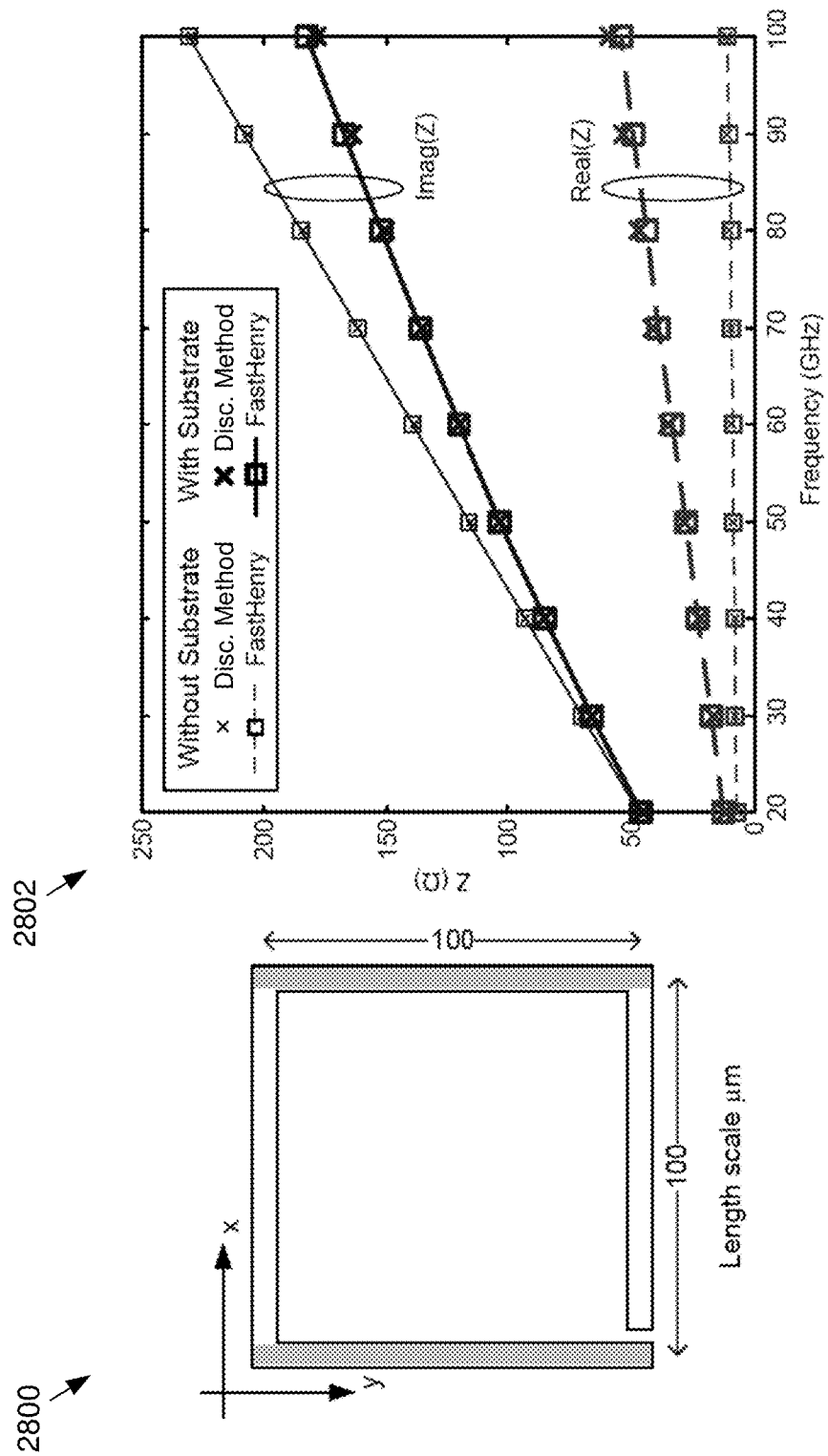
FIG. 28 is a graph showing the impedance of a square interconnect loop as a function of frequency computed using the exemplary 3D impedance extraction embodiment disclosed herein, with and without the substrate, and in comparison with FastHenry. The substrate profile is the same as in FIG. 26.
Figure 29:
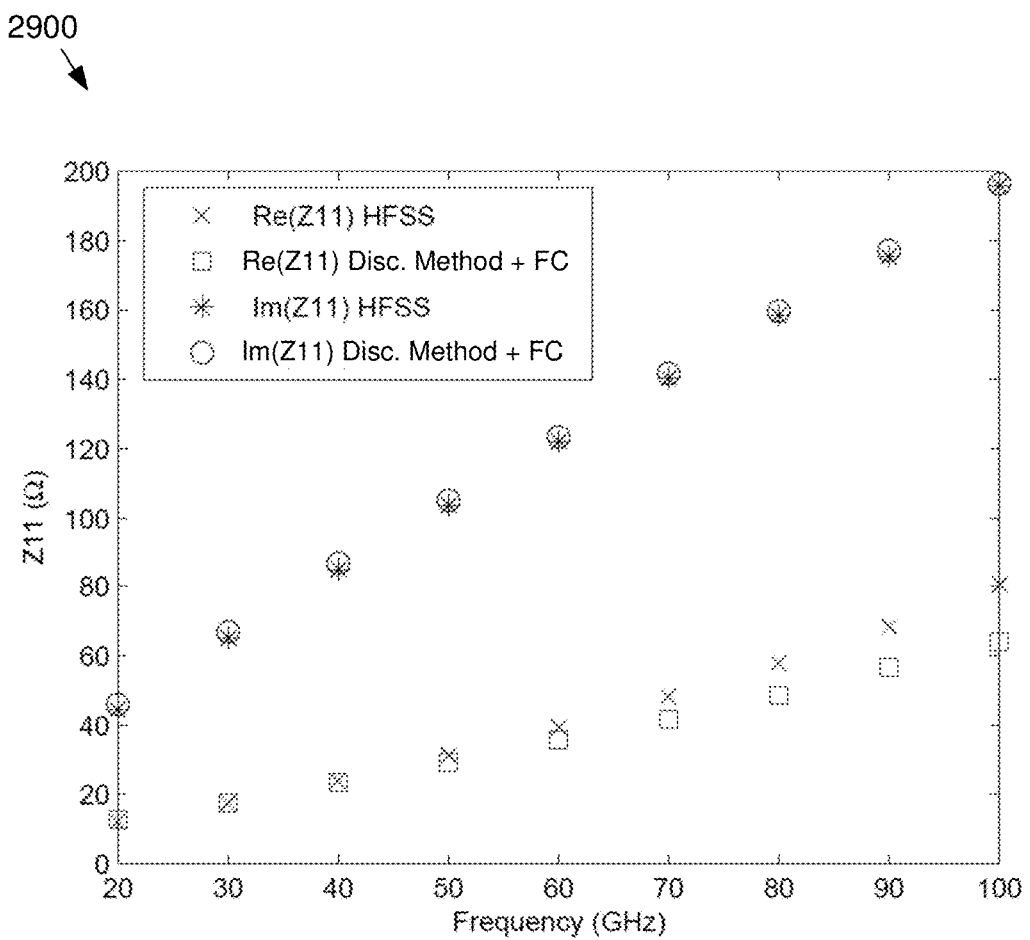
FIG. 29 is a graph of the input impedance network parameter Z11 for a square interconnect loop over a 3-layer substrate, as a function of frequency, in comparison with the fullwave field solver HFSS. The impedance computed using the exemplary 3D impedance extraction embodiment is combined with capacitance for the structure obtained from Fast-Cap. The Z11 parameter is computed using HSPICE. The substrate profile is the same as in FIG. 26.

FIG. 28 includes graph 2802, which shows the computation for a square interconnect loop (a single turn of a spiral inductor, as shown in diagram 2800). In this case, the net impedance of the spiral computed using the exemplary 3D impedance extraction embodiment disclosed herein is obtained by considering a series combination of the two orthogonal current loops (shaded with different colors in the diagram 2800 of FIG. 28). Note that orthogonal loops have no mutual impedance. It is observed that the effect of the substrate on both the real and imaginary parts of impedance increases substantially with frequency, and the exemplary 3D impedance extraction embodiment computation agrees well with FastHenry over the entire frequency range. FIG. 29 includes a graph 2900, which compares the network Z-parameter ($Z_{11}$) for the same configuration as in diagram 2800 to that obtained from the commercial full-wave field solver, HFSS. The equivalent circuit to compute $Z_{11}$ using the exemplary 3D impedance extraction embodiment (including capacitance of the conductor loops obtained using FastCap) is shown alongside.

Figure 30:
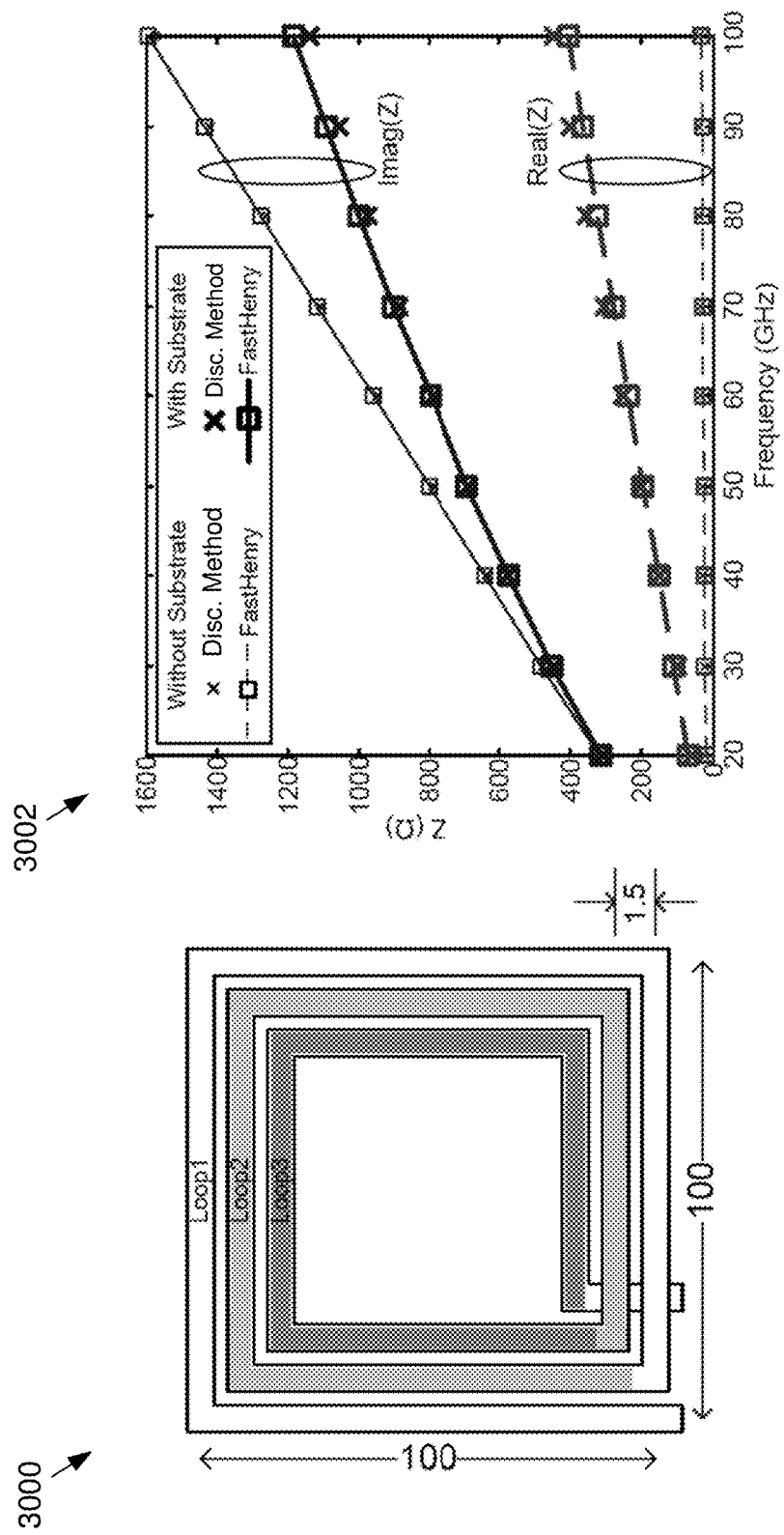
FIG. 30 is a graph of impedance of a three-turn square inductor as a function of frequency and computed using the exemplary 3D impedance extraction embodiment disclosed herein, with and without substrate, in comparison with FastHenry. The substrate profile is the same as in FIG. 26.
Figure 31:
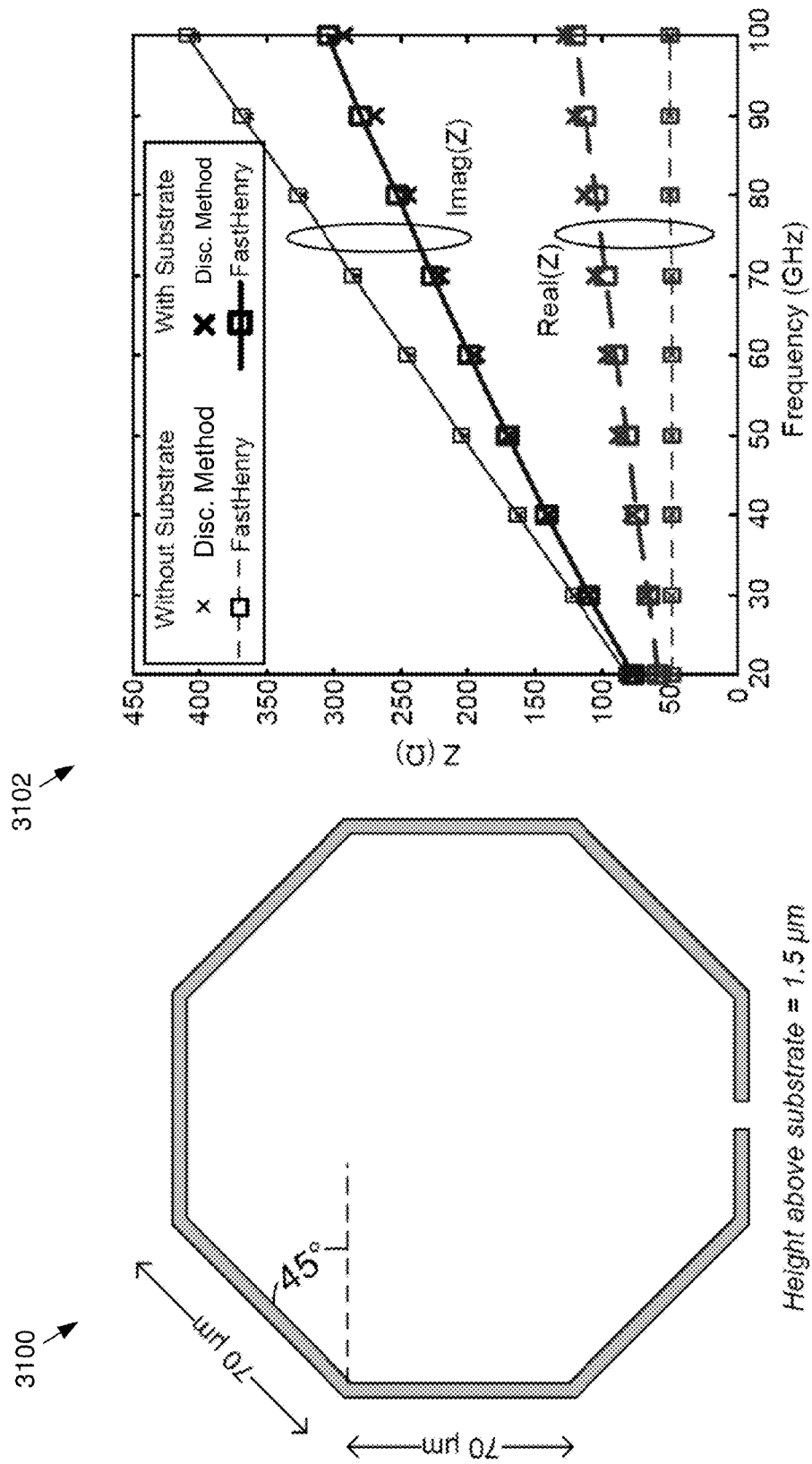
FIG. 31 is a graph of impedance of a regular octagonal interconnect loop as a function of frequency and computed using the exemplary 3D impedance extraction embodiment disclosed herein, with and without the substrate, in comparison with FastHenry. The substrate profile is the same as in FIG. 26.
Figure 32:
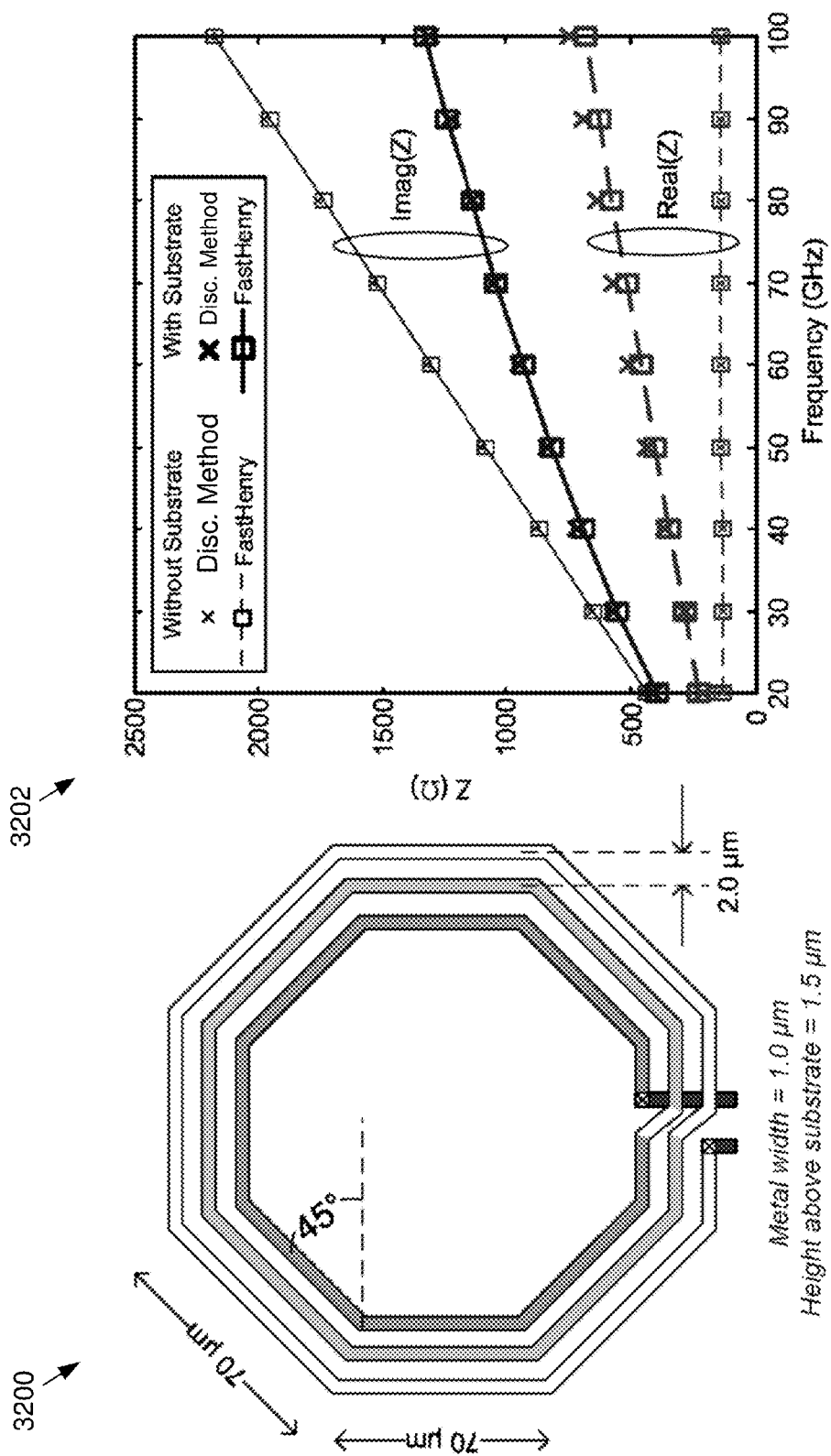
FIG. 32 is a graph of impedance of a three-turn octagonal inductor as a function of frequency and computed using the exemplary 3D impedance extraction embodiment disclosed herein, with and without substrate, in comparison with FastHenry. The substrate profile is the same as in FIG. 26.

Graph 3002 of FIG. 30 shows the impedance computation for a 3-turn spiral inductor (shown in diagram 3000), where each turn is a square. In this case, the self impedance of each turn (square) is computed as explained in the case of FIG. 28. In addition, the mutual impedance between all the turns is also considered. The mutual impedance computation between parallel two-conductor loops has been derived in Section III.B, while the mutual impedance between perpendicular loops is zero as explained before.

IV. Exemplary Methods for Applying the Disclosed Technology

In this section, exemplary methods for applying embodiments of the disclosed technology are disclosed. The disclosed methods are not to be construed as limiting, however, as aspects of the disclosed technology can be applied to an impedance extraction flow in a variety of manners.

Figure 38:
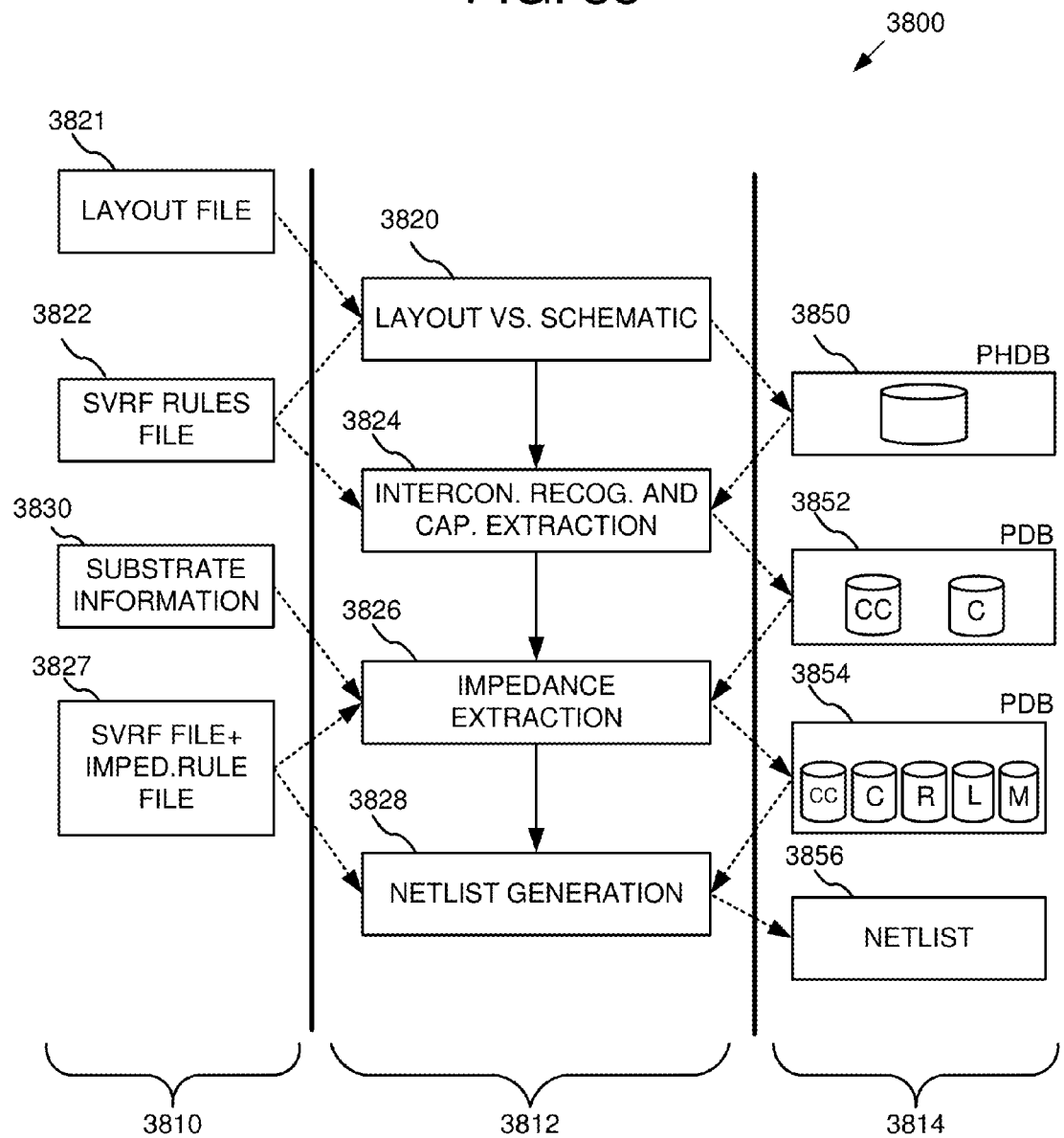
FIG. 38 is a schematic block diagram illustrating an overall impedance extraction method according to an exemplary embodiment of the disclosed technology.

FIG. 38 is a block diagram 3800 showing a high-level block diagram illustrating an exemplary embodiment of an overall extraction flow in which embodiments of the disclosed technology can be used. In particular, the block diagram 3800 illustrates the files used during one exemplary technique in region 3810, the general procedures performed in region 3812 (which may be performed, for example, by separate software components or modules or by the same software component or modules), and the files and data structures generated during the implementation of the exemplary embodiment in region 3814.

At 3820, a layout file 3821 is received and loaded (e.g., a GDSII or an Oasis file) and a layout-versus-schematic procedure performed. The layout-versus-schematic procedure compares the designer's intent netlist with that extracted from the geometrical layout database (e.g., the GDSII or Oasis file) and constructs a connectivity-aware physical representation of the circuit (shown as the persistent hierarchical database ("PHDB") 3850). This file preserves the initial hierarchy of the design. One or more SVRF rules files 3822 can also be used during this procedure.

At 3824, an interconnection recognition and capacitance extraction procedure is performed. For example, the PHDB can be processed in order to extract geometrical information about the conductors (e.g., interconnect wires). According to one exemplary embodiment, shapes in the PHDB belonging to wire paths or nets are broken (or fractured) in such a way as to have straight segments of wire with their entire volume in the same layer and with constant width. In the illustrated embodiment, the database "Parasitic Database" (PDB) 3852 is generated. In the illustrated embodiment, capacitance extraction is also performed, resulting in capacitance values C for the capacitance to ground for each wire segment and values CC for the coupling capacitance among signal-wire segments being stored in the PDB 3852.

At 3826, impedance extraction is performed. Impedance extraction can be performed using any of the exemplary techniques described herein. In the illustrated embodiment, an SVRF and impedance rule file 3827 is used in connection with the impedance extraction. The file 3827 can contain, for example, information about the electrical parameters in the circuit layout. For instance, information about a desired frequency of operation or range of frequencies for the circuit layout, conductivities of the conductors ($\sigma$), electrical permitivities ($\in$), and/or magnetic permeabilities ($\mu$) can be stored and retrieved from the file 3827. Additionally, a substrate information file 3830 comprising data about the substrate over or under which the circuit layout is to be implemented is also used in connection with impedance extraction 3826. The substrate information file 3830 can include information about the resistivity, dielectric constant, and thickness of each layer of the substrate. This information can be part of a separate technology file (as shown) or included with the SVRF and impedance rule file. As illustrated in the PDB 3854 (updated from the PDB 3852), impedance extraction generates resistance R, select inductance L, and mutual inductance M values.

At 3828, a netlist generation procedure is performed to create a representation of the electrical characteristics of the layout using the R, L, M, C, and CC values stored in the PDB 3854. A netlist 3856 representative of the electrical characteristics (e.g., a Spice or Spice-like netlist) is generated and stored. The netlist 3856 can subsequently be used to perform, for example, timing simulation to help verify the physical design of the circuit.

The above-described flow should not be construed as limiting in any, however, as in other exemplary embodiments, any subset of these method acts is performed. In still other embodiments, any one or more of the method acts are performed individually or in various other combinations and subcombinations with one another.

Figure 39:
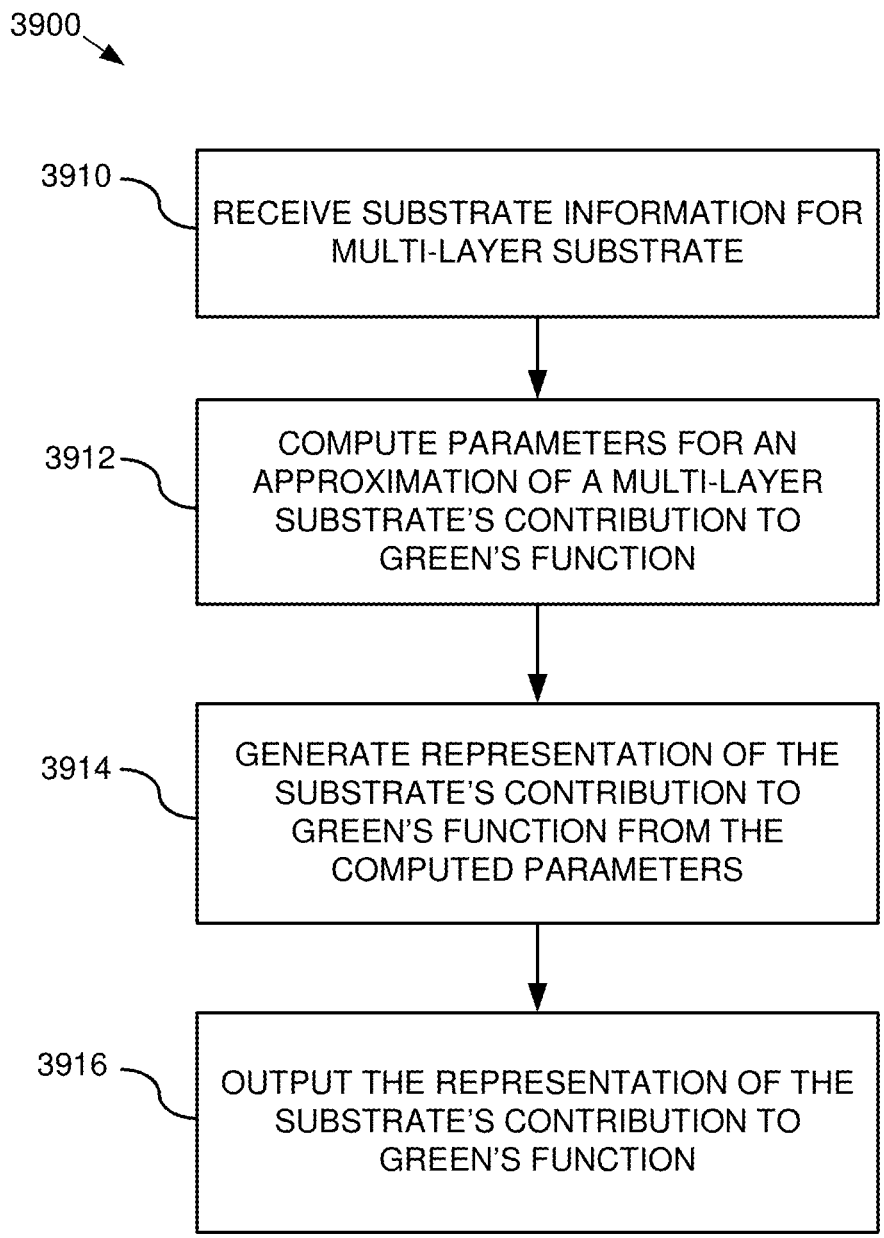
FIG. 39 is a flowchart illustrating an exemplary embodiment of a method for generating a representation of a multi-layer substrate's contribution to a Green's function according to embodiments of the disclosed technology.

FIG. 39 is a flowchart of one exemplary method 3900 for generating a representation of a multi-layer substrate's contribution to a Green's function as can be used to perform impedance extraction according to the exemplary 2D or 3D impedance extraction embodiments described above. The particular method shown in FIG. 39 should not be construed as limiting in any way, as any of the illustrated method acts that are shown in FIG. 39 can be performed alone or in various other combinations and subcombinations.

At 3910, information about a substrate over or under which a circuit layout is to be implemented is received (e.g., buffered or loaded in computer memory). The substrate information can include the resistivity, dielectric constant, and thickness of each layer of the substrate and can be part of a separate technology file.

At 3912, parameters for an approximation of a multi-layer substrate's contribution to a Green's function (e.g., a Green's function due to a magnetic dipole source) are computed (e.g., using a computer processor). In some embodiments, for example, this process can involve fitting parameters for the approximation (e.g., using VARPRO or its equivalent to fit the parameters used for $g_N(\lambda)$ in Expression (22) in the 2D impedance extraction embodiment or for $\chi_N$ in Expression (41) in the 3D impedance extraction embodiment). For instance, in particular implementations, the exemplary 2D impedance extraction embodiment disclosed above can be implemented using the flow 3900, in which case the approximation corresponds to (or is equivalent to) Expression (22) discussed in Section II.C.1. The example 3D impedance extraction embodiment disclosed above can also be implemented using the flow 3900, in which case the approximation corresponds to (or is equivalent to) Expression (41) discussed in Section III.A.2 and III.C.1. Expressions (22) and (41) both approximate the substrate's contribution to the Green's function as a series of images of a dipole current source. More specifically, Expressions (21) and (41) both approximate the substrate's contribution to the Green's function as the combined effect of a series of complex exponentials. In both the exemplary 2D impedance extraction embodiment and the exemplary 3D impedance extraction embodiment, the parameters to be computed at 3912 are K, $\alpha_k$, and $\beta_k$. To compute the parameters $\alpha_k$ and $\beta_k$, a non-linear least squares fitting technique can be used. For example, the Variable Projections method discussed above in Section II.C.2 (for the 2D approach) and in Section III.C.1.a (for the 3D approach) can be used. Furthermore, and as more fully shown below with respect to FIG. 41, the parameter set K, $\alpha_k$, and $\beta_k$ used in the approximation of the substrate's contribution to the Green's function are frequency dependent. Thus, the parameters can be computed for each frequency of interest in a range of frequencies. For instance, in one particular implementation, an initial frequency in the range of frequencies is selected (e.g., the highest frequency, the lowest frequency, a random frequency, or some other predetermined frequency in the range). Then, the value of the exponential K is selected (e.g., the lowest value of K, the highest value of K, a random value of K, or some other predetermined value of K). The values of $\alpha_k$ and $\beta_k$ can then be initially set (e.g., to a random value, 1, 0, or other predetermined value). A random distribution of points in $\lambda$ space is generated and a best fit for $\alpha_k$ and $\beta_k$ is determined (e.g., using VARPRO). This process can be repeated for the other values of K at the same frequency. The frequency can be decremented or incremented by a fixed amount, and the fitting process can be repeated using the best fits from the former frequency as the starting values. This technique can be continued until all desired frequencies in the range are considered.

At 3914, a representation of the multi-layer substrate's contribution to the Green's function is generated from the parameters computed at 3912 (e.g., using a computer processor). For instance, for the exemplary 2D impedance extraction embodiment, the representation $g_N(\lambda)$ shown in Expression (22) can be generated. Expression (22) is discussed in more detail at Section II.C.1 above. For the exemplary 3D impedance extraction embodiment, the representation $\chi_N$ in Expression (41) can be generated. Expression (41) is discussed in more detail in Section III.A.2 above.

At 3916, the representation of the multi-layer substrate's contribution to the Green's function is stored. For example, the representation can be stored in one or more computer-readable storage media (e.g., volatile or nonvolatile memory or storage). As noted, the parameters $\alpha_k$ and $\beta_k$ are not dependent on the circuit layout to be implemented above or beneath the multi-layer substrate. That is, the parameters are dependent only on the electrical characteristics of the substrate. Thus, the representation of the substrate's contribution to the Green's function (e.g., $g_N(\lambda)$ of Expression (22) or $\chi_N$ of Expression (41)) stored at 3916 can be used for different circuit layouts over the same substrate. The Green's function can be computed using the representation and will typically depend on the coordinates of the source and victim wires in the layout.

Figure 40:
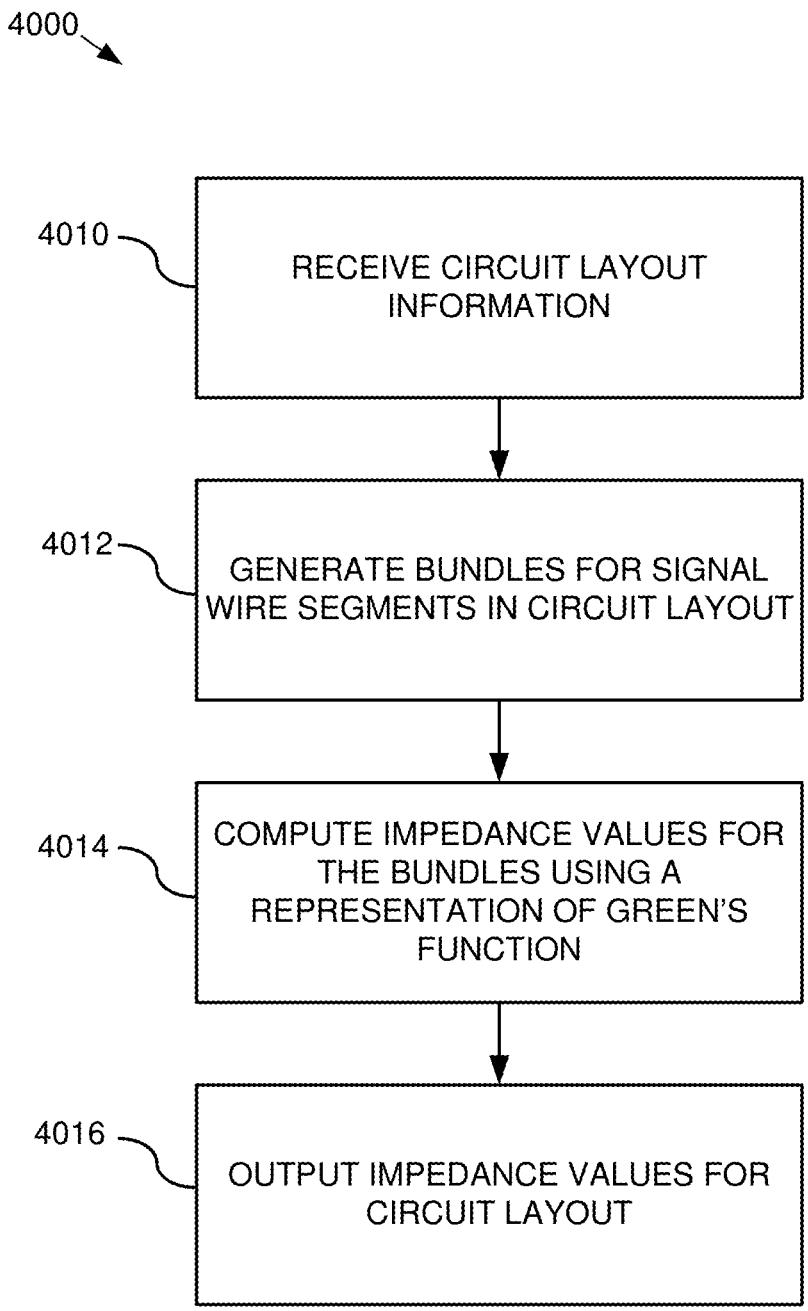
FIG. 40 is a flowchart illustrating an exemplary embodiment of a method for performing impedance extraction using a Green's function. The Green's function can be derived from the representation from FIG. 39.

FIG. 40 is a flowchart of one exemplary method 4000 for using a Green's function representation to perform impedance extraction for a circuit layout. The particular embodiment shown in FIG. 40 should not be construed as limiting in any way, as any of the illustrated method acts that are shown in FIG. 40 can be performed alone or in various other combinations and subcombinations.

At 4010, circuit layout information is received (e.g., buffered or loaded into computer memory). The circuit layout information can comprise, for example, a GDSII or Oasis file. Furthermore, the circuit layout information can be fractured circuit layout information comprising information about straight signal-wire segments in the circuit layout. Such information can be obtained, for example, from the PDB database.

At 4012, bundles are generated from the signal wires and their neighboring power and ground wires in the fragmented circuit layout (e.g., using a computer processor). For instance, in one exemplary embodiment, for one or more of the signal-wire path segments, the closest return paths are identified. Furthermore, in particular embodiments, the closest return paths up to a number n are identified. The number n can be, for example, a predetermined number or a user-defined number. In certain embodiments, 3D scanning is performed to identify the return paths. The 3D scan can be performed in two separate sweeps of the geometry of a wire path: one in the X direction, the other in the Y direction. Bundles can be generated for one or more of the signal-wire segments. Bundle generation can be performed using the n return paths identified. Additional details regarding bundle generation are described in U.S. Patent Application No. 2007/0226659 filed on Feb. 8, 2007 and entitled "Extracting High Frequency Impedance in a Circuit Design Using an Electronic Design Automation Tool," which is hereby incorporated herein by reference. As more fully explained in U.S. Patent Application Publication No. 2007/0226659, bundle generation produces systems of signal-wire segments and return-path segments (from among the neighboring ground-wire segments and power-wire segments) that have the same length as and are parallel to the signal-wire segment. Bundle generation can be repeated as necessary for new signal-wire segments created during the bundling process.

At 4014, impedance values for the bundles can be computed using a representation of Green's function. The impedance values can be computed, for example, according to any one or more of the expressions and techniques described in Section II.D above (for the exemplary 2D impedance extraction embodiment) or Section III.B.3 and III.C.2 (for the exemplary 3D impedance extraction embodiment). In the 2D impedance extraction embodiment, for example, the Green's function representation can be computed according to Expressions (13) and (14), where the substrate's contribution $g_N(\lambda)$ is computed according to Expression (22) and generated using the method shown in the flowchart 3900. In the 3D impedance extraction embodiment, the Green's function representation can be computed according to Expression (40), where the substrate's contribution $\chi_N$ is computed according to Expression (41)) and generated using the method shown in the flowchart 3900.

At 4016, the impedance values computed at 4014 are output. For example, the impedance values can be stored in one or more computer-readable storage media (e.g., volatile or nonvolatile memory or storage). The impedance values can be stored, for example, as part of an impedance matrix. The impedance values can further be included as part of a Spice or Spice-like netlist used to represent the electrical characteristics of the circuit layout at multiple frequencies. The impedance values can also be used to generate a Touchstone file, which also represents the electrical characteristics of the circuit layout for multiple frequency points.

Figure 41:
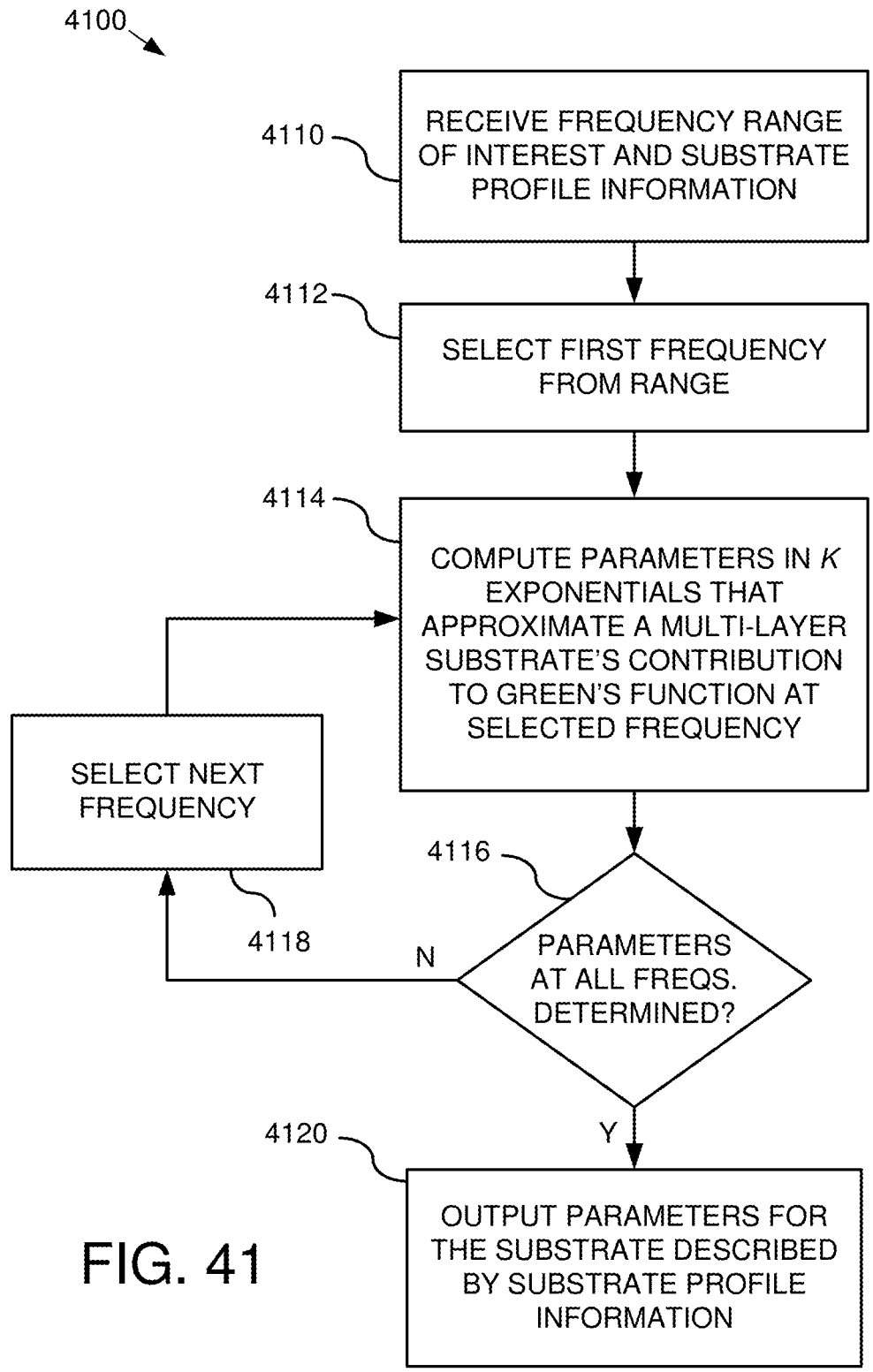
FIG. 41 is a flowchart illustrating an exemplary method for determining parameters used in a representation of a multi-layer substrate's contribution to a Green's function, such as the representation from FIG. 39.

FIG. 41 is a flowchart of an exemplary method 4100 for computing the parameters of an approximation of a substrate's contribution (e.g., a multi-layer substrate's contribution) to the Green's function (e.g., a Green's function due to a magnetic dipole source in the presence of a multi-layer substrate). The approximation of the substrate's contribution to the Green's function can be, for example, $g_N(\lambda)$ of Expression (22) (for the 2D embodiment) or $\chi_N$ of Expression (41) (for the 3D embodiment). The method 4100 can be used at 3912 of method 3900 and can be performed for either of the exemplary 2D or 3D impedance extraction embodiments described above. Furthermore, the method 4100 represents a more general version of the method 2400 shown in FIG. 24. Any of the particular acts shown in method 2400 can be incorporated into the method acts illustrated in FIG. 41. The particular embodiment shown in FIG. 41 should not be construed as limiting in any way, as any of the illustrated method acts that are shown in FIG. 41 can be performed alone or in various other combinations and subcombinations.

At 4110, substrate profile information and an indication of the frequency range of interest are received (e.g., buffered or loaded in computer memory). The substrate profile information can include the resistivity, dielectric constant, and thickness of each layer of the substrate and can be part of a separate technology file. The frequency range of interest can be a predetermined frequency range or input by a user. Furthermore, the number of frequencies in the range to be analyzed, the differences between the frequencies to be analyzed, or the specific identity of the frequencies to be analyzed can also be received at 4110 (e.g., from a user or according to a predetermined setting).

At 4112, a first frequency in the range is selected. In particular embodiments, the frequency selected is the highest frequency in the range.

At 4114, parameters in the approximation of the substrate's contribution to the Green's function are computed (e.g., using a computer processor). For instance, the parameters can be parameters in one or more exponentials (e.g., K exponentials) that are used to represent the substrate's contribution to the Green's function (e.g., parameters $\alpha_k$ and $\beta_k$ of Expression (22), (41), or their equivalent). The exponentials can correspond, for example, to the complex images of a source magnetic dipole, whose linear combination sum approximates $g_N(\lambda)$ of Expression (22) or $\chi_N$ of Expression (41). The computation at 4114 can be performed, for instance, using a non-linear least squares fitting technique (such as the Variable Projections method) for the selected frequency, and can be performed until a desired accuracy is reached.

At 4116, a determination is made as to whether parameters for the approximation of the substrate's contribution to the Green's function at all desired frequencies in the range have been computed (e.g., using a computer processor). If not, then a next frequency in the range is selected at 4118, and the parameters are computed for the next frequency at 4114. If the parameters have been computed for all the desired frequencies, then the parameters are output at 4120 and associated with the substrate described by the substrate information. For example, the parameters can be stored in one or more computer-readable storage media (e.g., volatile or nonvolatile memory or storage). The parameters might be stored, for instance, as a substrate-specific file that can be used and reused for a variety of different circuit layouts to be implemented over or under a substrate having the same substrate profile.

Figure 42:
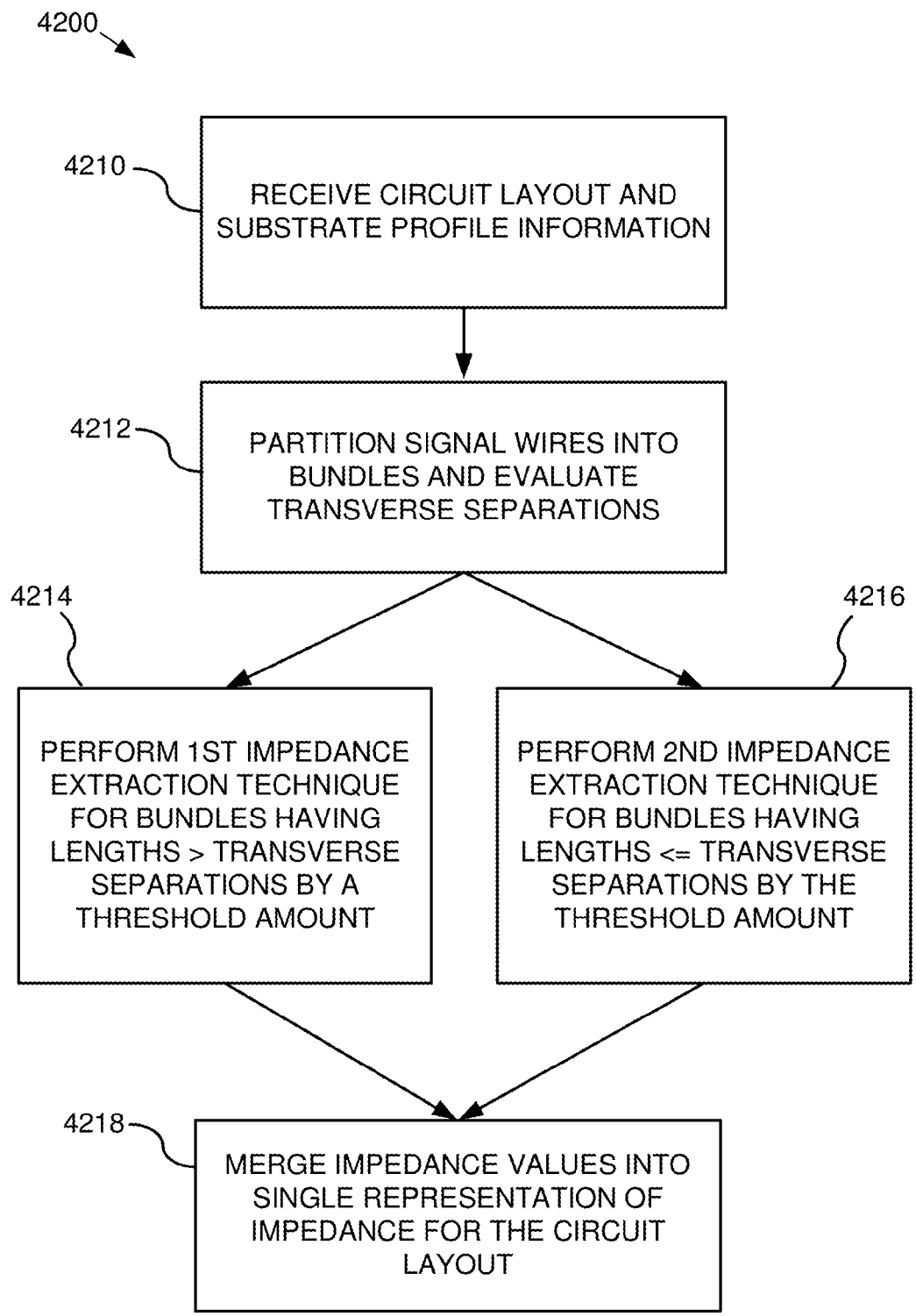
FIG. 42 is a flowchart illustrating an exemplary method for performing impedance extraction using two impedance extraction techniques according to the disclosed technology.

FIG. 42 is a flowchart of an exemplary method 4200 for performing either or both of a first or second impedance extraction technique for circuit layouts in the presence of a multi-layer substrate depending on geometrical properties of the layout under consideration. The first impedance extraction technique can be an impedance technique that is computationally efficient but less accurate for certain geometries, whereas the second impedance extraction technique can be less computationally efficient but more accurate for certain geometries. For example, in one particular implementation, the first impedance extraction technique can be the exemplary 2D impedance extraction embodiment disclosed herein, whereas the second impedance extraction impedance extraction technique can be the exemplary 3D impedance extraction technique disclosed herein.

At 4210, circuit layout and substrate profile information is received (e.g., buffered or loaded into computer memory). The circuit layout information can comprise, for example, a layout file (e.g., a GDSII or Oasis file). Furthermore, the circuit layout information can be fractured circuit layout information comprising information about straight signal-wire segments in the circuit layout. Such information can be obtained, for example, from the PDB database. The substrate profile information can include the resistivity, dielectric constant, and thickness of each layer of the substrate and can be part of a separate technology file.

At 4212, signal-wire segments in the circuit layout are partitioned into bundles (e.g., using the process described above for process block 4012) and the transverse separations between the signal-wire segments of the bundles and the neighboring return paths are determined. Based on this evaluation, signal wires are identified that have a length that is some predetermined threshold greater than (or other equivalent operation) the transverse distance to the nearest return path (which can be, for example, another conductor such as a ground wire or other signal-wire segment). The signal-wire segments of such bundles can said to be "long" in comparison to the transverse distance separating them from their nearest return paths. For example, in certain implementations, the predetermined threshold is 20, such that bundles with signal wires having a length that is greater than 20 times the transverse distance to their nearest return path are identified. Likewise, bundles with signal wires that have a length that is some predetermined threshold less than or equal to (or other equivalent operation) the transverse distance to their nearest return path are identified. The signal-wire segments of such bundles can be said to be "short" in comparison to the distance separating the segments from their nearest return paths.

At 4214, a first impedance extraction technique is performed (e.g., using a computer processor) to compute impedance values for the bundles with signal-wire segments having lengths that are greater than the predetermined threshold (e.g., greater than 20 times the transverse distance to the nearest neighboring return path). The first impedance extraction technique can favor computational efficiency over accuracy (such as the exemplary 2D impedance extraction technique described herein).

At 4216, a second impedance extraction technique is performed (e.g., using a computer processor) to compute impedance values for the bundles with signal-wire segments having lengths that are less than or equal to the predetermined threshold (e.g., 20 times or less than the transverse distance to the nearest neighboring return path). The second impedance extraction technique can favor accuracy over computational efficiency (such as the exemplary 3D impedance extraction technique described herein). In the case of interconnects, one can restrict the use of the second impedance extraction technique to improve on the accuracy of the most important self impedance terms of short wires. For these wires, one can add the forward mutual impedance computations involving the same wire to correct for 3D effects on short wires.

At 4218, the impedance values computed by the first and second impedance extraction techniques for the respective bundles can be merged or otherwise integrated into a single representation of impedance values. For instance, in one embodiment, the 2D scheme can be used for wire segments for which significant reactance can be expected, with the self inductance terms in the resulting matrix being improved with the addition of forward inductance computations for the same net. The impedance values can be represented by impedance matrices, whose real part contains the dynamic resistance values (which take into account skin, proximity, and substrate effects) and whose imaginary part contains the self and mutual inductances for the frequency ($\omega$). The matrix representation of impedance values can be stored in one or more computer-readable storage media (e.g., volatile or nonvolatile memory). The impedance values can also be included, for example, as part of a Spice or Spice-like netlist used to represent the electrical characteristics of the circuit layout. The impedance values can further be used to generate a Touchstone file, which also represents the electrical characteristics of the circuit layout for multiple frequency points.

Figure 43:
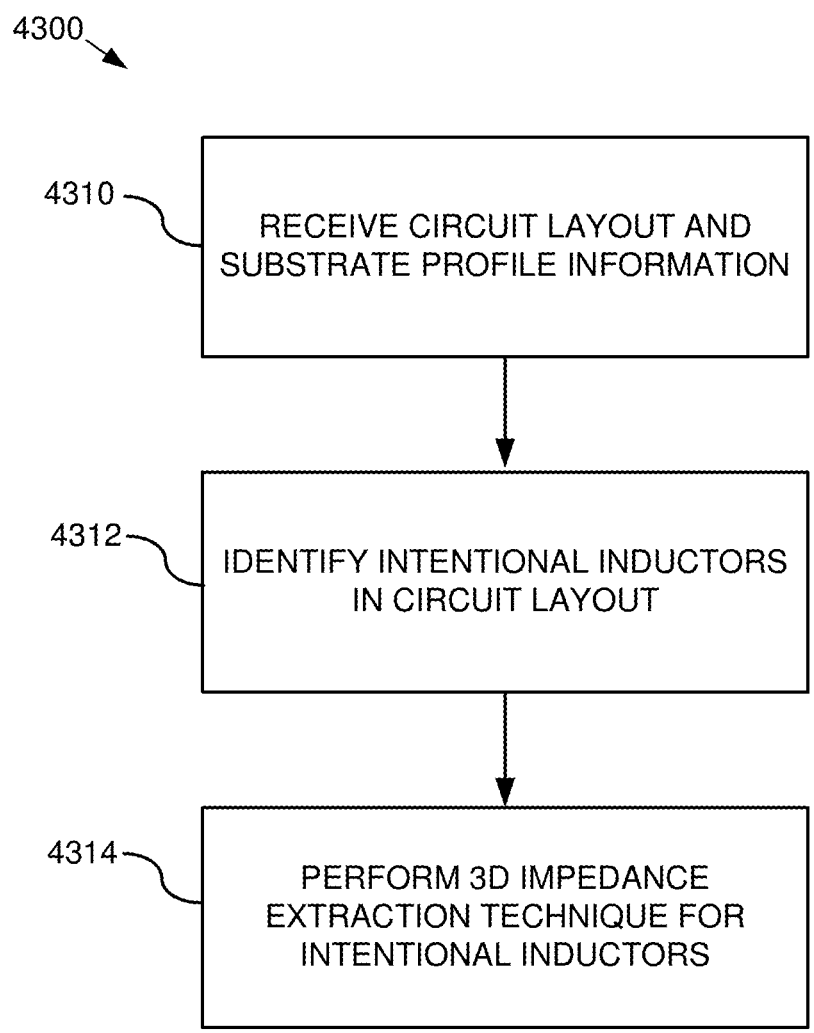
FIG. 43 is a flowchart illustrating an exemplary method for performing impedance extraction for intentional inductors according to the disclosed technology.

FIG. 43 is a flowchart of an exemplary method 4300 for performing the 3D impedance extraction technique disclosed herein for circuit layouts having intentional inductors in the presence of a multi-layer substrate. The particular embodiment shown in FIG. 43 should not be construed as limiting in any way, as any of the illustrated method acts that are shown in FIG. 43 can be performed alone or in various other combinations and subcombinations.

At 4310, circuit layout and substrate profile information is received (e.g., buffered or loaded into computer memory). The circuit layout information can comprise, for example, a layout file (e.g., a GDSII or Oasis file). Furthermore, the circuit layout information can include information about the location and geometry of one or more intentional inductors located in the circuit layout. Such information can be obtained, for example, from the PDB database. The substrate profile information can include the resistivity, dielectric constant, and thickness of each layer of the substrate and can be part of a separate technology file.

At 4312, the one or more intentional inductors are identified in the circuit layout. For example, in certain embodiments, the intentional inductors can be identified by the geometry of the inductor (e.g., a coiling conductor) or by some other indication in the circuit layout information (e.g., a name, identification number, flag, field, or the like).

At 4314, impedance extraction technique is performed for the one or more intentional inductors (e.g., using a computer processor). For example, in one particular embodiment, the 3D impedance extraction technique disclosed herein is performed for each of the intentional inductors identified. The impedance values for any one or more of the inductors can be represented by an impedance matrix. This representation of impedance values can be stored in one or more computer-readable storage media (e.g., volatile or nonvolatile memory). The impedance values can be included, for example, as part of a Spice or Spice-like netlist used to represent the electrical characteristics of the circuit layout. The impedance values can also be used to generate a Touchstone file, which also represents the electrical characteristics of the circuit layout.

V. Exemplary Network Environments for Applying the Disclosed Techniques

Figure 34:
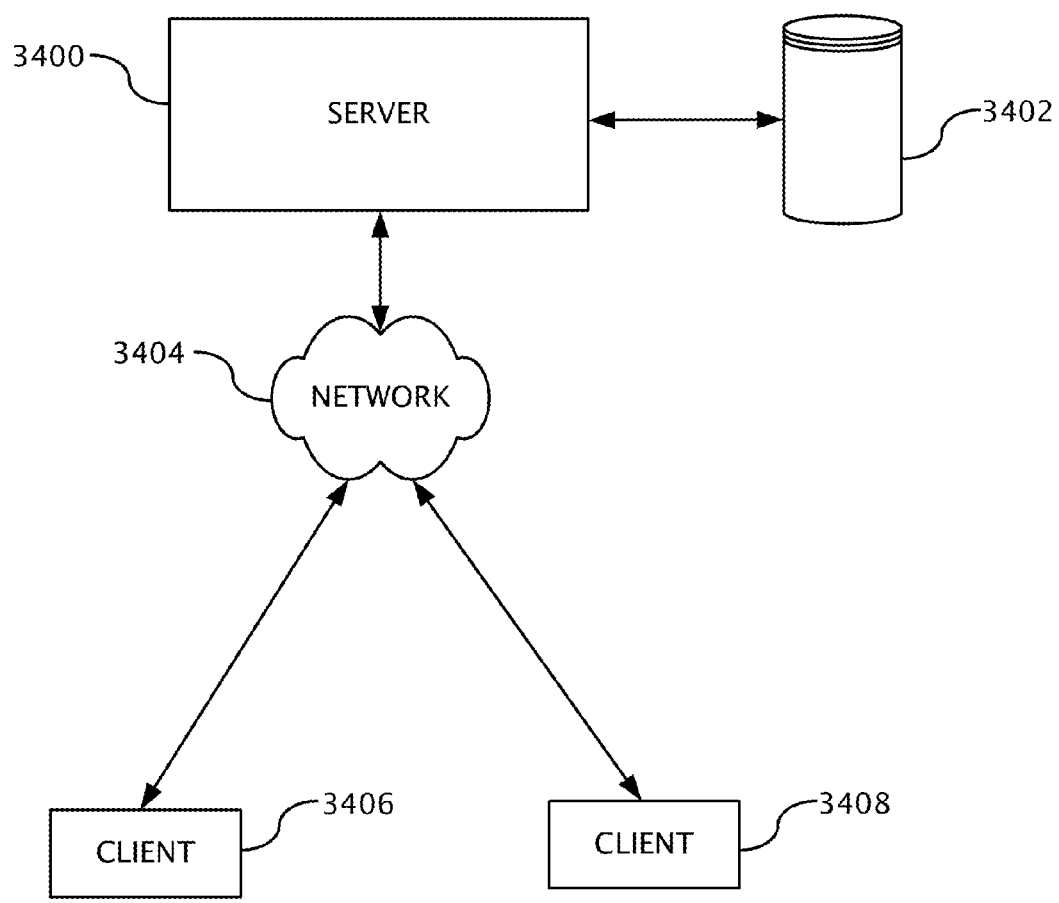
FIG. 34 is a block diagram illustrating a computer network that can be used to perform any of the embodiments of the disclosed technology.

Any of the aspects of the technology described above may be performed using a distributed computer network. FIG. 34 shows a simplified embodiment of one such exemplary network. A server computer 3400 can have an associated storage device 3402 (internal or external to the server computer). For example, the server computer 3400 can be configured to perform impedance extraction according to any of the disclosed embodiments (e.g., as part of an EDA software tool). The server computer 3400 can be coupled to a network, shown generally at 3404, which can comprise, for example, a wide-area network, a local-area network, a client-server network, the Internet, or other such network. One or more client computers, such as those shown at 3406, 3408, may be coupled to the network 3404 using a network protocol. The work may also be performed on a single, dedicated workstation, which has its own memory and one or more CPUs.

Figure 35:
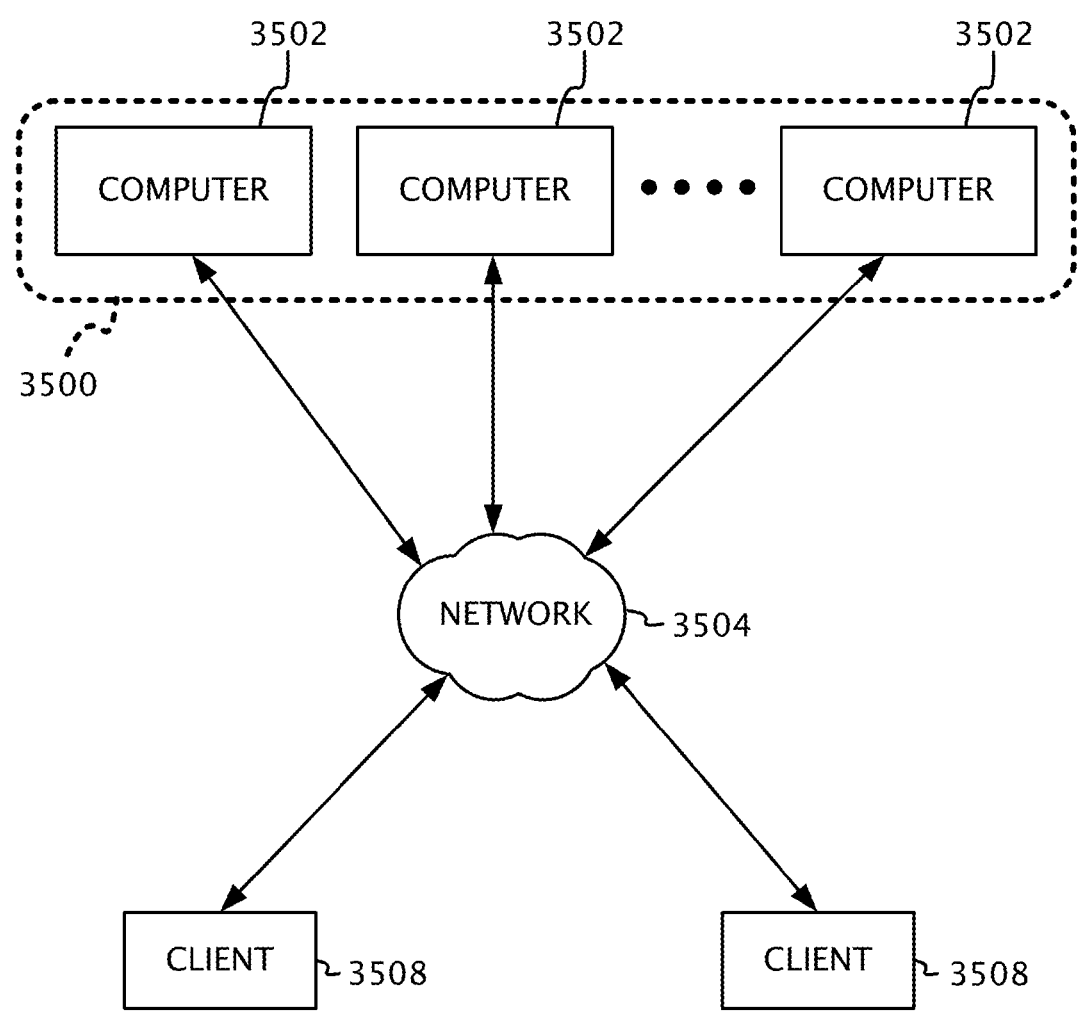
FIG. 35 is a block diagram illustrating another computer network that can be used to perform any of the embodiments of the disclosed technology.

FIG. 35 shows another exemplary network. One or more computers 3502 communicate via a network 1304 and form a computing environment 3500 (e.g., a distributed computing environment). Each of the computers 3502 in the computing environment 3500 can be used to perform at least a portion of the impedance extraction techniques according to any of the disclosed embodiments (e.g., as part of an EDA software tool). The network 3504 in the illustrated embodiment is also coupled to one or more client computers 3508.

Figure 36:
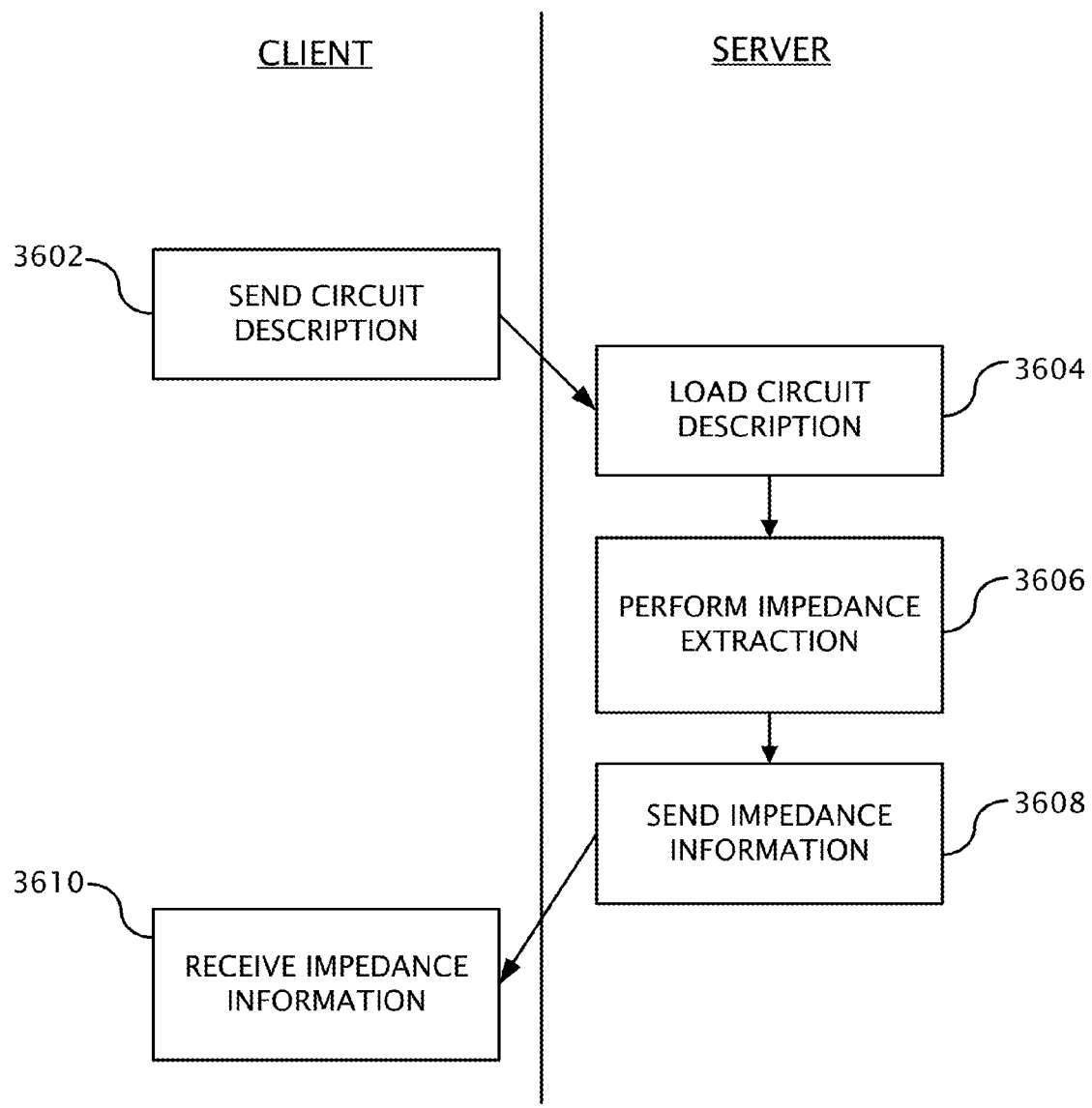
FIG. 36 is a block diagram illustrating how the computer networks of FIG. 34 or 35 can be used to perform aspects of the disclosed technology.

FIG. 36 shows one exemplary manner in which impedance extraction can be performed using a remote server computer (such as the server computer 3400 shown in FIG. 34) or a remote computing environment (such as the computing environment 3500 shown in FIG. 35) using any of the embodiments disclosed herein. At process block 3602, for example, the client computer sends or transmits the circuit layout information along with the multi-layer substrate information to the remote server or computing environment. In process block 3604, the layout and substrate information is received and loaded by the remote server or by respective components of the remote computing environment. In process block 3606, impedance extraction is performed using any of the disclosed embodiments. At process block 3608, the remote server or computing environment sends the resulting impedance information (e.g., the resulting impedance matrix or Spice (or Spice-like) netlist) to the client computer, which receives the data at process block 3610. It should be apparent to those skilled in the art that the example shown in FIG. 36 is not the only way to perform impedance extraction using multiple computers. For instance, the circuit layout and substrate information may be stored on a computer-readable medium that is not on a network and that is sent separately to the server or computing environment (e.g., a CD-ROM, DVD, or portable hard drive). Or, the server computer or remote computing environment may perform only a portion of the impedance extraction procedures.

Figure 37:
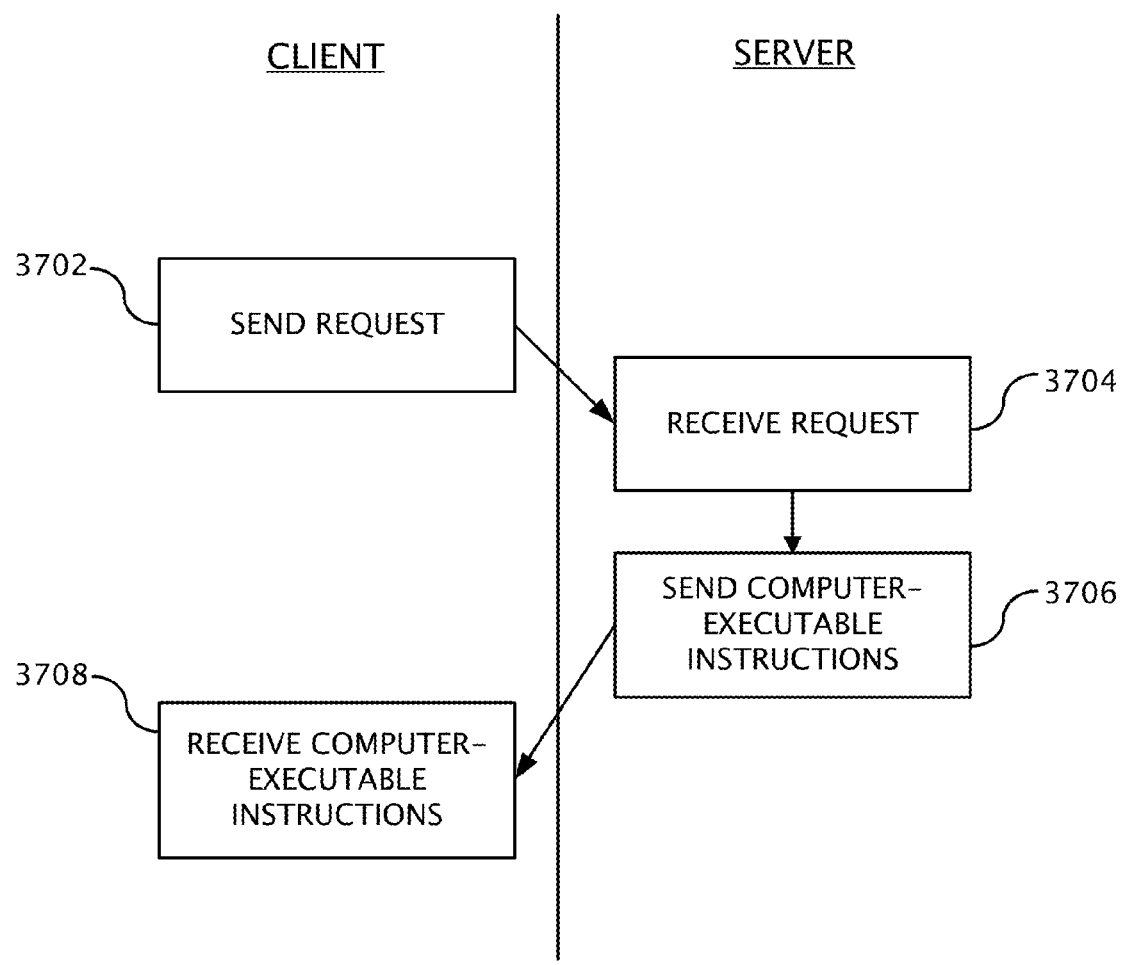
FIG. 37 is a block diagram illustrating how the computer networks of FIG. 34 or 35 can be used to transmit computer-executable instructions for causing a computer to perform any of the disclosed method.

FIG. 37 shows one exemplary manner in which computer-executable instructions for performing any of the disclosed embodiments can be transmitted, accessed, or received using a remote server computer (such as the server computer 3400 shown in FIG. 34) or a remote computing environment (such as the computing environment 3500 shown in FIG. 35). At process block 3702, for example, the client computer sends a request to download computer-executable instructions for performing any of the disclosed methods or techniques (e.g., after purchasing a license to a physical verification or impedance extraction tool). In process block 3704, the request is received by the remote server or by respective components of the remote computing environment. In process block 3706, the remote server or computing environment transmits computer-executable instructions for performing any of the disclosed methods or techniques (e.g., computer-executable instructions for implementing any of the impedance extraction embodiments on a computer). At 3708, the computer-executable instructions are received (e.g., stored, buffered, and/or executed) by the client computer.

Having illustrated and described the principles of the illustrated embodiments, it will be apparent to those skilled in the art that the embodiments can be modified in arrangement and detail without departing from such principles. For example, any of the disclosed techniques can be used in conjunction with or in addition to the methods described in U.S. Patent Application Publication No. 2007/0226659 filed on Feb. 8, 2007 and entitled "Extracting High Frequency Impedance in a Circuit Design Using an Electronic Design Automation Tool," which is hereby incorporated herein by reference. In view of the many possible embodiments, it will be recognized that the illustrated embodiments are only examples and should not be taken as a limitation on the scope of the disclosed technology.

What is claimed is:

1. One or more computer-readable memory or storage devices storing computer-executable instructions which when executed by a computer cause the computer to perform a method, the method comprising:
   receiving layout information indicative of at least signal-wire segments in a circuit design and substrate profile information indicative of electrical characteristics of a substrate over which the circuit design is to be implemented;
   performing impedance extraction using the layout information and the substrate profile information, wherein the impedance extraction generates a plurality of impedance values for the signal-wire segments and wherein the substrate is not represented by a plurality of filaments during the impedance extraction; and
   generating a representation of electrical characteristics of the circuit design, the representation comprising the impedance values.

2. The one or more computer-readable memory or storage devices of claim 1, wherein the impedance extraction is performed using an approximation of a Green's function in the presence of the substrate.

3. The one or more computer-readable memory or storage devices of claim 2, wherein the Green's function is due to a magnetic dipole.

4. The one or more computer-readable memory or storage devices of claim 1, wherein the impedance extraction is performed using a representation of the substrate comprising a superposition of complex exponentials.

5. The one or more computer-readable memory or storage devices of claim 1, wherein the substrate is a multi-layer substrate.

6. The one or more computer-readable memory or storage devices of claim 1, wherein the representation of the electrical characteristics of the circuit design is a netlist that includes the impedance values.

7. A computer-implemented method, comprising:
   by computing hardware, receiving layout information indicative of at least signal-wire segments in a circuit design and substrate profile information indicative of electrical characteristics of a substrate over which the circuit design is to be implemented;
   by the computing hardware, performing impedance extraction using the layout information and the substrate profile information, wherein the impedance extraction generates a plurality of impedance values for the signal-wire segments and wherein the substrate is not represented by a plurality of filaments during the impedance extraction; and
   by the computing hardware, generating a representation of electrical characteristics of the circuit design, the representation comprising the impedance values.

8. The method of claim 7, wherein the impedance extraction is performed using an approximation of a Green's function in the presence of the substrate.

9. The method of claim 8, wherein the Green's function is due to a magnetic dipole.

10. The method of claim 7, wherein the impedance extraction is performed using a representation of the substrate comprising a superposition of complex exponentials.

11. The method of claim 7, wherein the substrate is a multi-layer substrate.

12. The method of claim 7, wherein the representation of the electrical characteristics of the circuit design is a netlist that includes the impedance values.

* * * * *